United States Patent [19]
Hattori

[11] Patent Number: 5,185,711
[45] Date of Patent: Feb. 9, 1993

[54] APPARATUS FOR DIVIDING ELEMENTS OF A FINITE GALOIS FIELD AND DECODING ERROR CORRECTION CODES

[75] Inventor: Masayuki Hattori, Tokyo, Japan

[73] Assignee: Sony Corporation, Tokyo, Japan

[21] Appl. No.: 623,235

[22] Filed: Dec. 6, 1990

[30] Foreign Application Priority Data

Dec. 8, 1989 [JP] Japan .................................. 1-319404
Dec. 11, 1989 [JP] Japan .................................. 1-321118
Dec. 25, 1989 [JP] Japan .................................. 1-335883
Dec. 25, 1989 [JP] Japan .................................. 1-335884

[51] Int. Cl.$^5$ ............................................... G06F 7/52
[52] U.S. Cl. .................................................. 364/746.1
[58] Field of Search ............................ 364/746.1, 761

[56] References Cited

U.S. PATENT DOCUMENTS

| | | | |
|---|---|---|---|
| 4,037,093 | 7/1977 | Gregg et al. ................. | 364/746.1 |
| 4,567,568 | 1/1986 | Inagawa et al. .............. | 364/746.1 X |
| 4,574,361 | 3/1986 | Inagawa et al. .............. | 364/746.1 |
| 4,975,867 | 12/1990 | Weng ........................... | 364/746.1 |
| 4,989,171 | 1/1991 | Hollmann ..................... | 364/746.1 |
| 4,994,995 | 2/1991 | Anderson et al. ............. | 364/746.1 |

Primary Examiner—Tan V. Mai
Attorney, Agent, or Firm—Lewis H. Eslinger; Jay H. Maioli

[57] ABSTRACT

A mutual division circuit includes a single mutual division unit or a plurality of cascaded mutual division units for dividing a polynomial including a first input polynomial $R_{i-1}(X)$ as a factor by a second input polynomial $Q_{i-1}(X)$, thereby to determine a quotient and a remainder $R_i(X)$, determining an overall quotient $\lambda_i(X)$ from the quotient and a third input polynomial $\lambda_{i-1}(X)$, and producing the remainder $R_i(X)$, the first input polynomial $R_{i-1}(X)$ or the second input polynomial $Q_{i-1}(X)$, and the overall quotient $\lambda_i(X)$ as a first output polynomial $R_i(X)$, a second output polynomial $Q_i(X)$, and a third output polynomial $\lambda_i(X)$, respectively. The mutual division circuit also has a data selector (42) for receiving, at an input port thereof, respective initial polynomials of the first, second, and third input polynomials, and supplying output data to the single mutual division unit or a first one of the cascaded mutual division units, and a feedback or data bus (45) for supplying output data from the single mutual division unit or a last one of the cascaded mutual division units to another input port of the data selector (42). The single mutual division unit or the cascaded mutual division units are used a plurality of times for carrying out arithmetic operations therein.

10 Claims, 34 Drawing Sheets

FIG. 24B

APPARATUS FOR DIVIDING ELEMENTS OF A FINITE GALOIS FIELD AND DECODING ERROR CORRECTION CODES

BACKGROUND OF THE INVENTION

1. Field of the Invention

The present invention relates to a mutual division circuit, and more particularly to a mutual division circuit suitable for use in a decoder for decoding error-correcting codes.

2. Description of the Prior Art

Digital signal processing technology for recording and reproducing digital audio and video signals is now in wide use. Encoding and decoding error-correcting codes play an important role in the digital signal processing technology. Error-correcting codes include wide-sense Bose-Chaudhuri-Hocquenghem (BCH) codes, Goppa codes, etc. The principles of the present invention are applicable to these error-correcting codes. However, only the Reed-Solomon code, which is a special form of BCH code, will be referred to in the description which follows.

According to the Reed-Solomon code, the elements of a finite field $GF(2^m)$ (where m is an integer of 1 or more) correspond respectively to symbols. If an irreducible generator polynomial of the finite field, $GF(2^m)$ is represented by $G(X)$ and a root of $G(X)=0$ by $\alpha$, then each element or symbol of the finite field $GF(2^m)$ can be expressed by a power of $\alpha$. A power $\alpha^i$ (i is an integer) of $\alpha$ can be represented by a vector in the form of an m-bit binary notation. Vector representations are convenient in digital signal processing.

To encode a Reed-Solomon code, the following parity check matrix H is first defined using the above irreducible generator polynomial $\alpha$:

$$H = \begin{bmatrix} 1 & \alpha & \alpha^2 & \ldots & \alpha^{n-1} \\ 1 & \alpha^{2\cdot 1} & \alpha^{2\cdot 2} & \ldots & \alpha^{2(n-1)} \\ & & \vdots & & \\ 1 & \alpha^{2t\cdot 1} & \alpha^{2t\cdot 2} & \ldots & \alpha^{2t(n-1)} \end{bmatrix} \quad (1)$$

where n indicates the code length and t the number of symbols that can be corrected. If original information is represented by (n−2t) symbols $u_0 \sim u_{n-2t-1}$ and parity information by 2t symbols $p_0 \sim p_{2t-1}$, then a transmitted code word can be represented by a vector whose elements are n symbols, as follows:

$$f = [p_0 p_1 \ldots p_{2t-1} u_0 u_1 \ldots u_{n-2t-1}]^T \quad (2A)$$

where $[\ldots]^t$ indicates a transposed matrix.

The encoder determines the symbols $p_0 \sim p_{2t-1}$ of the parity information such that $$HF = 0 \quad (3)$$

is satisfied. The transmitted code word f is expressed by a polynomial $f(X)$:

$$f(X) = p_0 + p_1 X + \ldots + p_{2t-1} X^{2t-1} + u_0 X^{2t} + \ldots + u_{n-2t-1} X^{n-1} \quad (2B)$$

When $\alpha, \alpha^2, \ldots, \alpha^{2t}$ are substituted successively for the variables X of the equation (2B), the equation (3) can be expressed as follows:

$$f(\alpha) = 0, f(\alpha^2) = 0, \ldots, f(\alpha^{2t}) = 0 \quad (4)$$

If it is assumed that a transmission error e occurs with respect to the transmitted code word f, a received code word r is represented by a vector:

$$r = f + e \quad (5A)$$

The equation (5A) can be expressed by a polynomial:

$$\begin{aligned} r(X) &= f(X) + e(X) \\ &= r_0 + r_1 X + \ldots + r_{n-1} X^{n-1} \end{aligned} \quad (5B)$$

When the Reed-Solomon code is used, if the code length represented by n and the number of symbols in the parity information is 2t, then the error can provided the number of error symbols except 0 in the transmission error e is t.

FIG. 1 of the accompanying drawings shows an overall arrangement of a decoder for decoding an error-correcting code. The decoder includes a syndrome generator 1 for generating a syndrome S by multiplying the parity check matrix H represented by the equation (1) by the received code word r. The syndrome S can be expressed by a vector:

$$S = [S_1 S_2 \ldots S_{2t}]^t \quad (6A)$$

and by a polynomial:

$$S(X) = S_1 + S_2 X + S_3 X^2 + \ldots + S_{2t} X^{2t-1} \quad (6B)$$

Using the respective elements, the syndrome $S = Hr$ is expressed as follows:

$$\begin{bmatrix} S_1 \\ S_2 \\ \vdots \\ S_{2t} \end{bmatrix} = \begin{bmatrix} 1 & \alpha & \ldots & \alpha^{n-1} \\ 1 & \alpha^{2\cdot 1} & \ldots & \alpha^{2(n-1)} \\ & \vdots & & \\ 1 & \alpha^{2t\cdot 1} & \ldots & \alpha^{2t(n-1)} \end{bmatrix} \begin{bmatrix} r_0 \\ r_1 \\ \vdots \\ r_{n-1} \end{bmatrix} \quad (7A)$$

The equation (7A) can be expressed by:

$$S_j = \sum_{k=0}^{n-1} r_k \alpha^{jk} = r(\alpha^j) \quad (j = 1, 2, \ldots, 2t). \quad (7B)$$

If the transmission error e is expressed by a polynomial: $e(X) = e_0 X + e_1 X^2 + \ldots + e_{n-1} X^{n-1}$ and the condition in the encoder according to the equation (4) is used, then the equation (7B) can be expressed as follows:

$$S_j = e(\alpha^j) \quad (j = 1, 2, \ldots, 2t) \quad (7c)$$

As shown in FIG. 1, the decoder includes an error locator polynomial deriving circuit 2. The error locator polynomial deriving circuit 2 calculates the coefficients of an error locator polynomial $\sigma(X)$ and the coefficients of an error evaluator polynomial $\omega(X)$ from the syndrome polynomial $S(X)$ (actually from the coefficients of the syndrome polynomial $S(X)$), and supplies the calculated coefficients to an error location detecting circuit 3 and an error pattern calculating circuit 4.

When an error occurs in the jth position as counted from the leading end of the received code word r (i.e., when $e_j \neq 0$), $\alpha^j$ will be referred to as an error location. If it is assumed that the number of nonzero elements of the transmission error e is $\nu$ ($\nu \leq t$), the error locations of the $\nu$ nonzero elements (error symbols) are Xi, and error patterns are $Y_i$ (i=1, 2, ..., $\nu$) then $\nu$ error symbols can be expressed respectively by ($X_i$, $Y_i$), and the equation (7C) can be given as follows:

$$S_j = e(\alpha^j) = \sum_{i=1}^{\nu} X_i Y_i^j \quad (j = 1, 2, \ldots, 2t). \quad (7D)$$

The equation (7D) represents 2t equations with the number of unknowns being $2\nu$ ($X_i$, $Y_i$) ($2\nu \leq 2t$). Therefore, these unknowns ($X_i$, $Y_i$) can uniquely be determined. In order to easily determine the unknowns ($X_i$, $Y_i$) (i=1, 2, ..., $\nu$) which satisfy the equation (7D), the following error locator polynomial $\sigma(X)$ and error evaluator polynomial $\omega(X)$ are introduced:

$$\sigma(X) = \prod_{k=1}^{\nu}(1 - \sigma_k T_k) \quad (8)$$
$$= 1 + \sigma_1 X + \sigma_2 X^2 + \ldots + \sigma_\nu X^\nu$$
$$\omega(X) = S(X) \cdot \sigma(X) \pmod{X^{2t}}. \quad (9)$$

Since the equation $\sigma(X_i^{-1})=0$ (i=1, 2, ..., $\sigma$) is satisfied from the equation (8) above, if the coefficients $\sigma_i$ of the error locator polynomial $\sigma(X)$ can be found, then the error locations $X_i$ (i=1, 2, ..., $\sigma$) can be detected by successively substituting $\alpha^{-j}$ (j=0, 1, ..., n−1) in $\sigma(X)$ and searching for the total number of $\alpha^{-j}$ when $\sigma(\alpha^{-j})=0$.

It is known that if an error pattern with respect to an error location $X_i$ is represented by $Y_i$, then the error pattern $Y_i$ can be calculated, using the error evaluator polynomial $\omega(X)$, as follows:

$$Y_i = X_i^{-1} \cdot \omega(X_i^{-1}) / \prod_{j=1 (j \neq i)}^{\nu}(1 - X_j X_i^{-1}). \quad (10)$$

As described later on, the error locator polynomial $\sigma(X)$ and the error evaluator polynomial $\omega(X)$ can be derived from the syndrome polynomial S(X) according to the Euclidean division algorithm. The error location detecting circuit 3 shown in FIG. 1 detects an error location $X_i$ from the error locator polynomial $\sigma(X)$, and generates a digital signal of a high level "1" at the error location and supplies the digital signal to one input terminal of each AND gate of an AND gate group 5. When the error pattern calculating circuit 4 supplies an m-bit binary notation, which is a vector expression of the error pattern $Y_i$ calculated thereby using the equation (10), to the other input terminal of each AND gate of the AND gate group 5 at each error location, the AND gate group 5 generates, in a time-series manner, vector representations of the respective coefficients of the transmission error polynomial e(X) The coefficients of the polynomial r(X) of the received code word are delayed a given period of time by a delay circuit 7. The vector representations of these delayed coefficients and the vector representations of the respective coefficients of the transmission error polynomial e(X) are added to each other by an adder group 6 of mod 2. The adder group 6 now produces the vector representations of the respective coefficients of the polynomial f(X) of the transmitted code word, whose errors have been corrected, based on the fact that addition and subtraction are the same arithmetic operation with mod 2.

One conventional error locator polynomial deriving circuit based on the Euclidean division algorithm will now be described below with reference to FIGS. 2 and 3.

If two polynomials $r_{-1}(X)$, $r_0(X)$ are given and deg (degree) $r_0 \leq$ deg $r_{-1}$, then the following divisions are repeatedly effected according to the Euclidean division algorithm:

$$r_{-1}(X) = q_1(X) \cdot r_0(X) + r_1(X), \text{ deg } r_1 < \text{ deg } r_0 \quad (11A)$$
$$r_0(X) = q_2(X) \cdot r_1(X) + r_2(X), \text{ deg } r_3 < \text{ deg } r_1 \quad (11B)$$

$$r_{j-2}(X) = q_j(X) \cdot r_{j-1}(X) + r_j(X), \text{ deg } r_j < \text{ deg } r_{j-1} \quad (11Y)$$
$$r_{j-1}(X) = q_{j+1}(X) \cdot r_j(X). \quad (11Z)$$

The nonzero $r_j(X)$, by which the polynomials are exactly divided finally, is the greatest common divisor (GCD) of the polynomials $r_{-1}(X)$, $r_0(X)$.

Based on the Euclidean division algorithm, the following theorem is derived: If two polynomials $r_{-1}(X)$, $r_0(X)$ are given, deg $r_0 \leq$ deg $r_{-1}$, and the GCD is h(X), then there exist U(X), V(X) which satisfy:

$$U(X) \cdot r_{-1}(X) + V(X) \cdot r_0(X) = h(X) \quad (12),$$

and both deg U and deg V are smaller than deg $r_{-1}$. In order to determine U(X), V(X), defining $$U_{-1}(X)=0, U_0(X)=1 \quad (13A)$$

$$V_{-1}(X)=1, V_0(X)=0 \quad (13B)$$

and using the quotient qi (i=1, 2, ..., j+1) which are calculated according to the following equations:

$$U_i(X) = q_i(X) \cdot U_{i-1}(X) + U_{i-2}(X) \quad (14A)$$

$$V_i(X) = q_i(X) \cdot V_{i-1}(X) + V_{i-2}(X) \quad (14B).$$

In this case, $(-1)^{j+1} V_j(X)$ becomes U(X) and $(-1)^j U_j(X)$ becomes V(X).

It is known that using the equations (11A) through (11Z) and the Euclidean division algorithm according to the equations (14A), (14B), the error locator polynomial $\sigma(X)$ and the error evaluator polynomial $\omega(X)$ are determined according to an algorithm indicated by steps 100 through 105 shown in FIG. 2, based on the syndrome polynomial S(X) (see the equation (6B))

STEP 100

If the upper limit for the number of symbols whose errors can be corrected is t, then $r_{-1}(X)$ and $r_0(X)$ are initialized into $X^{2t}$ and S(X), respectively, and $U_{-1}(X)$ and $U_0(X)$ are initialized into 0 and 1, respectively.

STEP 101

The number i of steps is set to 1.

STEP 102

With the quotient produced when $r_{i-2}(X)$ is divided by $r_{i-1}(X)$ being represented by $q_i(X)$, $r_i(X)$ and $U_i(X)$ are calculated according to the equation (11Y) with j replaced with i and the equation (14A), as follows:

$$r_i(X) = r_{i-2}(x) - q_i(X) r_{i-1}(X) \quad (15A)$$

$$U_i(X) = U_{i-2}(X) + q_i(X)U_{i-1}(X) \quad (15B).$$

STEP 103

It is determined whether or not the degree of $r_i(X)$ is equal to or less than $(t-1)$. If deg $r_i(X) \leq t-1$, then control goes to a step 104.

STEP 104

The number i of steps is incremented by 1, and control returns to the step 102.

STEP 105

A multiple of $U_i(X)$ by $\sigma$ becomes the error locator polynomial $\sigma(X)$, and a multiple of $r_i(X)$ by $(-1)^i \sigma$ becomes the error evaluator polynomial $\omega(X)$.

$\sigma$ is a constant for equalizing $\sigma_0$ (the 0th coefficient of the equation (8)) to 1. In actual calculations, $\sigma$ can be $\sigma = 1$ since only $X_i$ which results in $\sigma(X_i) = 0$ is significant. Furthermore, since addition and subtraction are the same over the finite field $GF(2^m)$, $(-1)^i$ can also be 1.

FIG. 3 shows a hypothetical circuit (which is a specific circuit arrangement for the conventional error locator polynomial deriving circuit 2 shown in FIG. 1) for executing the algorithm shown in FIG. 2. The circuit shown in FIG. 3 comprises mutual division units 8A through 8Z which are identical in construction to each other, the mutual division units 8A through 8Z including respective main calculating units 9A through 9Z for calculating $q_i(X)$ and $r_i(X)$ in the step 102 shown in FIG. 2, and respective auxiliary calculating circuits 10A through 10Z for calculating $U_i(X)$. When the first mutual division unit 8A is supplied with an initial value $r_{-1}(X) = X^{2t}$, $r_0(X) = S(X)$, $U_{-1}(X)$, $U_0(X)$ of the functions $r_i(X)$, $U_i(X)$, these functions change successively into $(r_0(X), r_1(X), U_0(X), U_1(X))$, $(r_1(X), r_2(X), U_1(X), U_2(X))$, ..., each time they pass through one division circuit. The last mutual division unit 8Z produces $\omega(X)$ and $\sigma(X)$.

Use of the Euclidean division algorithm, as described above, is advantageous in that there can be employed a systolic-array architecture comprising cascaded mutual division units 8A through 8Z of identical construction. What remains to be achieved is how to carry out divisions between the polynomials $r_{i-2}(X)$, $r_{i-1}(X)$ in the main calculating units 9A through 9Z.

Now, a conventional improved error locator polynomial deriving circuit will be described below with reference to FIGS. 4 and 5.

According to a conventional improved Euclidean division algorithm, the divisions between the polynomials are broken up and settled as divisions between the coefficients of the polynomials. This improved algorithm has been proposed in IEEE Trans. on Computers, Vol. C-34, No. 5, May 1985, pp. 393-403. Basically, the improved algorithm is directed to a development of the theorem according to the equation (12) above, which successively calculates polynomials $R_i(X)$, $\gamma_i(X)$, $\lambda_i(X)$ that satisfy $$\gamma_i(X) \cdot X^{2t} + \lambda_i(X) \cdot S(X) = R_i(X) \quad (16)$$

in the ith repeated procedure of the equation (12). The algorithm is brought to an end when the degree of the remainder $R_i(X)$ is less than t. This algorithm is shown by the steps 106 through 114 in FIG. 4.

STEP 106

If the upper limit for the number of symbols whose errors can be corrected is t, then $R_0(X)$, $Q_0(X)$, $\lambda_0(X)$, $\mu_0(X)$, $\lambda_0(X)$, and $\eta_0(X)$ are initialized into $X^{2t}$, $S(X)$, 0, 1, 1, and 0, respectively.

STEP 107

The number i of steps is set to 1.

STEP 108

The difference $l_{i-1}$ between the degree of $R_{i-1}(X)$ and the degree of $Q_{i-1}(X)$ is determined, and the coefficients of the greatest-power terms of $R_{i-1}(X)$ and $Q_{i-1}(X)$ are set to $a_{i-1}$ and $b_{i-1}$, respectively.

STEP 109

The sign of the difference $l_{i-1}$ is checked. If $l_{i-1} \geq 0$, then control goes through the step 110 to the step 112. If $l_{i-1} \leq 0$, then control goes through the step 111 to the step 112.

STEP 110 (Normal mode)

This step is executed if $l_{i-1} \geq 0$, i.e., the degree of $R_{i-1}(X)$ is greater than the degree of $Q_{i-1}(X)$ $R_i(X)$, $\lambda_i(X)$, $\gamma_i(X)$ are calculated according to the following equations:

$$R_i(X) = R_{i-1}(X) + (a_{i-1}/b_{i-1})Q_{i-1}(X) \cdot X^{l_i-1} \quad (17A)$$

$$\lambda_i(X) = \lambda_{i-1}(X) + (a_{i-1}/b_{i-1})\mu_{i-1}(X) \cdot X^{l_i-1} \quad (17B)$$

$$\gamma_i(X) = \gamma_{i-1}(X) + (a_{i-1}/b_{i-1})\eta_{i-1}(X) \cdot X^{l_i-1} \quad (17C)$$

In addition, $Q_i(X)$, $\mu_i(X)$, $\eta_i(X)$ are set respectively to $Q_i(X) = Q_{i-1}(X)$, $\mu_i = \mu_{i-1}(X)$, $\eta_i(X) = \eta_{i-1}(X)$. In the above equations, the division $R_{i-1}(X)/Q_{i-1}(X)$ is replaced with the division $a_{i-1}/b_{i-1}$ between the coefficients of the greatest-power terms.

STEP 111 (Cross mode)

This step is executed if $l_{i-1} < 0$, i.e., the degree of $R_{i-1}(X)$ is less than the degree of $Q_{i-1}(X)$ $R_i(X)$, $\lambda_i(X)$ are calculated according to the following equations:

$$R_i(X) = Q_{i-1}(X) + (b_{i-1}/a_{i-1})R_{i-1})X) \cdot X^{-l_i-1} \quad (18A)$$

$$\lambda_i(X) = \mu_{i-1}(X) + (b_{i-1}/a_{i-1})\lambda_{i-1}(X) \cdot X^{-l_i-1} \quad (18B)$$

$$\gamma_i(X) = \eta_{i-1}(X) + (b_{i-1}/a_{i-1})\gamma_{i-1}(X) \cdot X^{-l_i-1} \quad (18C)$$

In addition, $Q_i(X)$, $\mu_i(X)$, $\eta_i(X)$ are set respectively to $Q_i(X) = R_{i-1}(X)$, $\mu_i(X) = \lambda_{i-1}(X)$, $\eta_i(X) = \gamma_{i-1}(X)$. In the above equations, $R_{i-1}(X)$ and $Q_{i-1}(X)$ are exchanged.

STEP 112

It is determined whether or not the degree of the remainder $R_i(X)$ in the equation (16) is less than t. If the degree of $R_i(X)$ is less than t, then control goes to the step 114, and if the degree of $R_i(X)$ is higher than t, then control goes to the step 113.

STEP 113

The number i of steps is incremented by 1, and control returns to the step 108.

STEP 114

Finally, $\lambda_i(X)$ and $R_i(X)$ are regarded respectively as the error locator polynomial $\sigma(X)$ and the error evaluator polynomial $\omega(X)$. In this case, i is 2t.

FIG. 5 shows a specific circuit arrangement for the conventional improved error locator polynomial deriving circuit 2 for executing the algorithm shown in FIG. 4. The circuit shown in FIG. 5 comprises mutual division units 11A through 11Z which are identical in construction to each other. The first mutual division unit 11A, for example, has a pair of switch circuits 12A, 13A and another pair of switch circuits 14A, 15A. Input ports of these switch circuits 12A through 15A are supplied with the coefficients of $R_0(X)$, $Q_0(X)$, $\lambda_0(X)$, and $\mu_0(X)$ If the difference deg $R_0(X)$ −deg $Q_0(X) = l_0$ is 0 or positive, then the switch circuits 12A through 15A deliver the supplied coefficients directly to their output ports as they are. If $l_0$ is negative, the switch circuits 12A, 13A operate so as to be connected in crossed relation to each other, and the switch circuits 14A, 15A operate so as to be connected in crossed relation to each other.

The coefficients appearing at the output port of the switch circuit 12A are supplied to a dividend input port of a divider 19A and one input port of an adder 20A, and the coefficients appearing at the output port of the switch circuit 13A are supplied to a divisor input port of the divider 19A and one input port of a multiplier 23A. The quotient produced at first by the divider 19A is supplied through a data holding register 22A to another input port of the multiplier 23A, whose output is supplied to another input port of the adder 20A. The coefficients appearing at the output ports of the switch circuits 14A, 15A are supplied respectively to one input port of an adder 21A and one input port of a multiplier 24A. The coefficients held by the register 22A are supplied to another input port of the multiplier 24A, whose output is supplied to another input port of the adder 21A.

The adders, multipliers, and dividers shown in FIG. 5 effect arithmetic operations between the elements of the finite field GF($2^m$).

The mutual division unit 11A also includes delay registers 16A, 17A, 18A each comprising a D-type flip-flop. A start flag signal SF for synchronism with the coefficient of the greatest-power term, among the supplied coefficients, is supplied through the register 16A to the next division unit 11B. The coefficients appearing at the output ports of the switch circuits 13A, 15A are supplied as the coefficients of the polynomials $Q_1(X)$ and $\mu_1(X)$ through the respective registers 17A, 18A to the next mutual division unit 11B. The coefficients appearing at the output ports of the adders 20A, 21A are supplied as the coefficients of the polynomials $R_1(X)$ and $\lambda_1(X)$ to the next mutual division unit 11B. The other mutual division units 11B, 11C, 11D also generate the coefficients of the polynomials $R_i(x)$, $Q_i(X)$, $\lambda_i(X)$, $\mu_i(X)$ from the coefficients of the supplied polynomials $R_{i-1}(X)$, $Q_{i-1}(X)$, $\mu_{i-1}(X)$, $\mu_{i-1}(X)$ in synchronism with the start flag signal SF.

A specific application of the circuit arrangement shown in FIG. 5 will be described below. Respective symbols are expressed by the respective elements of a finite field GF($2^4$) whose irreducible generator polynomial G(X) is $X^4 + X + 1$. Specifically, if a root of $X^4 + X + 1$ is $\alpha$, then each of the symbols can be expressed by a power of $\alpha$. If the code length n is 11 and the number t of correctable symbols is 2, then the number of symbols of original information is 7 and the number of symbols of parity information is 2t (=4). Assuming that the original information is represented by a vector m:

$$m = [\alpha^{11} \alpha^{10} \alpha^9 \alpha^8 \alpha^7 \alpha^6 \alpha^5]^t \quad (19),$$

the symbols $p_0$ through $p_3$ of the parity information are given as 0, $\alpha^{12}$, $\alpha^6$, $\alpha^{11}$, respectively, according to the equation (3) above, and a transmitted code word f is expressed as follows:

$$f = [0 \alpha^{12} \alpha^6 \alpha^{11} \alpha^{11} \alpha^{10} \alpha^9 \alpha^8 \alpha^7 \alpha^6 \alpha^5]^t \quad (20).$$

If the vector e of a transmission error is expressed by:

$$e = [\alpha^3 \alpha^9 000000000]^t \quad (21),$$

then two error symbols exist in a received code word r (=f +e). By multiplying the parity check matrix H by the received code word r according to the equation (7A), the syndrome polynomial S(X) is given as follows:

$$\begin{aligned} S(X) &= S_1 + S_2 X + S_3 X^2 + S_4 X^3 \\ &= \alpha^{12} + \alpha^5 X + \alpha^{10} X^2 + \alpha^8 X^3. \end{aligned} \quad (22)$$

Initial values of the respective polynomials in the step 106 shown in FIG. 4 are as follows:

$$R_0(X) = X^4, \ Q_0(X) = S(X)$$

$$\lambda_0(X) = 0, \ \mu_0(X) = 1, \ \sigma_0(X) = 1, \ \eta_0(X) = 0.$$

As shown in FIG. 5, the coefficients of $R_0(X)$ and $\lambda_0(X)$ are supplied to the mutual division unit 11A successively from those of the greatest-power terms ($X^4$), the coefficients of $Q_0(X)$ and $\mu_0(X)$ are supplied to the division unit 11A successively from those of the greatest-power terms ($X^3$), and the start flag signal SF is set to a high-level "1" in synchronism with the coefficients of the greatest-power terms.

Operation of the mutual division unit 11A

Since $l_o =$ deg $R_0(X) -$ deg $Q_0(X) = 4 - 3 = 1 \geq 0$, the switch circuits 12A through 15A pass the supplied coefficients as they are. Also since the coefficients $a_0$ and $b_0$ of the greatest-power terms of $R_0(X)$ and $Q_0(X)$ are 1 and $\neq 8$, respectively, the register 22A stores $a_0/b_0 = 1/\alpha^8 = \alpha^7$, and $R_1(X)$ and $\lambda_1(X)$ are expressed as follows:

$$\begin{aligned} R_1(X) &= X^4 + \alpha^7(\alpha^8 X^3 + \alpha^{10} X^2 + \alpha^5 X + \alpha^{12}) \cdot X \\ &= \alpha^2 X^3 + \alpha^{12} X^2 + \alpha^4 X \\ \lambda_1(X) &= 0 + \alpha^7 X = \alpha^7 X. \end{aligned}$$

Furthermore, $Q_1(X) = Q_0(X)$, $\mu_1(X) = 1$, $\gamma_1(X) = 1$, $\eta_1(X) = 0$. The multiplication of $X^{l_0}$, i.e., X, in the equations (17A) and (17B) is carried out with the coefficients of $Q_0(X)$ and $\mu_0(X)$ being shifted one position to the greater-power terms in advance, and the coefficients of $Q_0(X)$ and $\mu_0(X)$ are shifted one position to the smaller-power terms through the registers 17A, 18A.

Operation of the mutual division unit 11B

Since $l_1 =$ deg $R_1(X) -$ deg $Q_1(X) = 3 - 3 = 0$, the switch circuits 12B through 15B pass the supplied coefficients as they are. Also since the coefficients $a_1$ and $b_1$ of the greatest-power terms of $R_1(X)$ and $Q_1(X)$ are $\alpha^1$ and $\alpha^8$, respectively, the register 22B stores $a_1/b_1 = \alpha^{2-}$ $/\alpha^8 = \alpha^9$, and $R_2(X)$ and $\lambda_2(X)$ are expressed as follows:

$$R_2(X) = R_1(X) + (a_1/b_1) Q_1(X)$$
$$= \alpha^6 X^2 + \alpha^9 X + \alpha^6$$
$$\lambda_2(X) = \lambda_1(X) + (a_1/b_1)\mu_1(X)$$
$$= \alpha^2 X + \alpha^9.$$

Furthermore, $Q_2(X) = Q_1(X)$, $\mu_2(X) = 1$, $\gamma_2(X) = 1$, $\eta_2(X) = 0$.

Operation of the mutual division unit 11C

Since $l_2 = \deg R_2(X) - \deg Q_2(X) = 2 - 3 = -1 < 0$, the switch circuits 12C, 13C and the switch circuits 14C, 15C send the supplied coefficients of the polynomials in crossed relation to each other, and transmit them to their output ports. The operation then goes to the step 111 shown in FIG. 4. Since the coefficients $a_2$ and $b_2$ of the greatest-power terms of $R_2(X)$ and $Q_2(X)$ are $\alpha^6$ and $\alpha^8$, respectively, the register 22C stores $b_2/a_2 = \alpha^8/\alpha^6 = \alpha^2$, and $R_3(X)$ and $\lambda_3(X)$ are expressed as follows:

$$R_3(X) = Q_2(X) + (b_2/a_2) R_2(X) \cdot (X)$$
$$= \alpha^{14} X^2 + \alpha^4 X + \alpha^{12}$$
$$\lambda_3(X) = \mu_2(X) + (b_2/a_2)\lambda_2(X) \cdot (X)$$
$$= \alpha^9 X^2 + \alpha^{11} X + \alpha^1.$$

Furthermore, $Q_3(X) = R_2(X) = \alpha^6 X^2 + \alpha^9 X + \alpha^6$, $\mu_3(X) = \lambda_2(X) = \alpha^7 X + \alpha^9$, $\gamma_3(X) = \eta_2(X) + \alpha^2 X = \alpha^2 X$, $\eta_3(X) = 1$.

Operation of the mutual division unit 11D

Since $l_3 = \deg R_3(X) - \deg Q_3(X) = 2 - 2 = 0$, the switch circuits 12D through 15D pass the supplied coefficients as they are. Also since the coefficients $a_3$ and $b_3$ of the greatest-power terms of $R_3(X)$ and $Q_3(X)$ are $\alpha^{14}$ and $\alpha^6$, respectively, the register 22C stores $a_3/b_3 = \alpha^{14}/\alpha^6 = \alpha^8$, and $R_4(X)$ and $\lambda_4(X)$ are expressed as follows:

$$R_4(X) = R_3(X) + (a_3/b_3) Q_3(X)$$
$$= \alpha^{10} X + \alpha^5$$
$$\lambda_4(X) = \lambda_3(X) + (a_3/b_3)\mu_3(X)$$
$$= \alpha^9 X^2 + \alpha^{12} X + \alpha^8.$$

Furthermore, $Q_4(X) = Q_3(X)$, $\mu_4(X) = \mu_3(X)$. Since $\deg R_4(X) = 1 < 2$, the algorithm is stopped by the step 112 shown in FIG. 4, and the error locator polynomial $\sigma(X)$ and the error evaluator polynomial $\omega(X)$ are given respectively by:

$$\sigma(X) = \lambda_4(X) = \alpha^9 X^2 + \alpha^{12} X + \alpha^8$$
$$= \alpha^8(\alpha X^2 + \alpha^4 X + 1)$$
$$\omega(X) = \alpha^{10} + \alpha^5.$$

Inasmuch as $G(\alpha) = \alpha^4\alpha + 1$ in this example, the equations $\sigma(\alpha^0) = \alpha^8(\alpha + \alpha^4 + 1) = 0$ and $\sigma(\alpha^{-1}) = \alpha^7(\alpha + \alpha^4 + 1) = 0$ are satisfied, and two error locations represented by $X_1 = \alpha^0$, $X_2 = \alpha^1$ can accurately be detected (see the equation (21)).

According to the algorithm shown in FIG. 4, as described above, an error locator polynomial can accurately be derived, in principle. However, if the degree of $R_i(X)$ is reduced by two or more, rather than one at a time, in the meantime, control proceeds to the normal mode in the step 110 even when $l_{i-1} < 0$. Because the degree of $R_i(X)$ can be reduced only one at a time in principle according to the Euclidean division algorithm, the number of division units 11A, 11B, ... shown in FIG. 5 is required to be 2t for those codes whose t error symbols can be corrected.

If the Reed-Solomon code is employed, the correction of 3 symbols has already been achieved at present for those applications, such as digital VTRs, in which real-time processing is required (with the clock frequency being about 15 MHz), and the correction of 8 symbols has already been achieved at present for those applications, such as optical disc players, in which real-time processing is not required. Moreover, there has been a recent demand for a decoder for decoding multiple error-correcting codes where the number t of symbols whose errors can be corrected is about 16 with respect to the code length n of about 160.

With the conventional error locator polynomial deriving circuit shown in FIG. 5, however, if the number t of symbols whose errors can be corrected is 16, 2t or 32 mutual division units 11A, 11B, ... will have to be connected in cascade. Therefore, the overall circuit arrangement will be large in size in proportion to the number t of symbols that can be corrected.

OBJECTS AND SUMMARY OF THE INVENTION

It is a primary object of the present invention to provide a mutual division circuit which can increase the number t of symbols whose errors can be corrected, and which is reduced in size.

Another object of the present invention is to provide a finite field multiplication circuit of small size for multiplying the same number over a finite field $GF(2^m)$ by respective different numbers over the finite field $GF(2^m)$ simultaneously and in parallel relationship.

Still another object of the present invention is to provide a finite field division circuit of small size for effecting divisions over a finite field $GF(2^m)$.

According to the present invention, there is provided a mutual division circuit comprising a single mutual division unit or a plurality of cascaded mutual division units for dividing a polynomial including a first input polynomial $R_{i-1}(X)$ as a factor by a second input polynomial $Q_{i-1}(X)$, thereby to determine a quotient and a remainder $R_i(X)$, determining an overall quotient $\lambda_i(X)$ from the quotient and a third input polynomial $\lambda_{i-1}(X)$, and producing the remainder $R_i(X)$, the first input polynomial $R_{i-1}(X)$ or the second input polynomial $Q_{i-1}(X)$, and the overall quotient $\lambda_i(X)$ as a first output polynomial $R_i(X)$, a second output polynomial $Q_i(X)$, and a third output polynomial $\lambda_i(X)$, respectively, data selecting means (42) for receiving, at an input port thereof, respective initial polynomials of the first, second, and third input polynomials, and supplying output data to the single mutual division unit or a first one of the cascaded mutual division units, and feedback means (45) for supplying output data from the single mutual division unit or a last one of the the cascaded mutual division units to another input port of the data selecting means (42), the arrangement being such that the single mutual division unit or the cascaded mutual division units are used a plurality of times for carrying out arithmetic operations therein.

According to the present invention, there is also provided a multiplication circuit for a finite field, comprising conversion means (101) for converting a number in an m-bit vector representation over a finite field $GF(2^m)$ into elements of a matrix representation, and multiplication means (102, 103, 104) for multiplying the elements of the matrix representation from the conversion means (101) by a plurality of numbers in respective m-bit vector representations over the field GF($2^m$) in parallel relationship, to produce a plurality of products in respective vector representations over the finite field GF($2^m$).

According to the present invention, there is further provided a division circuit for a finite field, comprising an inverse element generating circuit (203) for generating a vector representation of the inverse element of a first element in an m-bit vector representation over a finite field GF($2^m$), and a multiplication circuit (202) for multiplying the inverse element by a second element in an mbit vector representation over the finite field GF($2^m$), with one of the elements being converted into a matrix representation, and dividing the second element by the first element, thereby to produce a quotient in an m-bit vector representation over the finite field GF($2^m$).

The above and other objects, features, and advantages of the present invention will become apparent from the following detailed description of illustrative embodiments thereof to be read in conjunction with the accompanying drawings, in which like reference numerals represent the same or similar objects.

BRIEF DESCRIPTION OF THE DRAWINGS

Figure 24B:
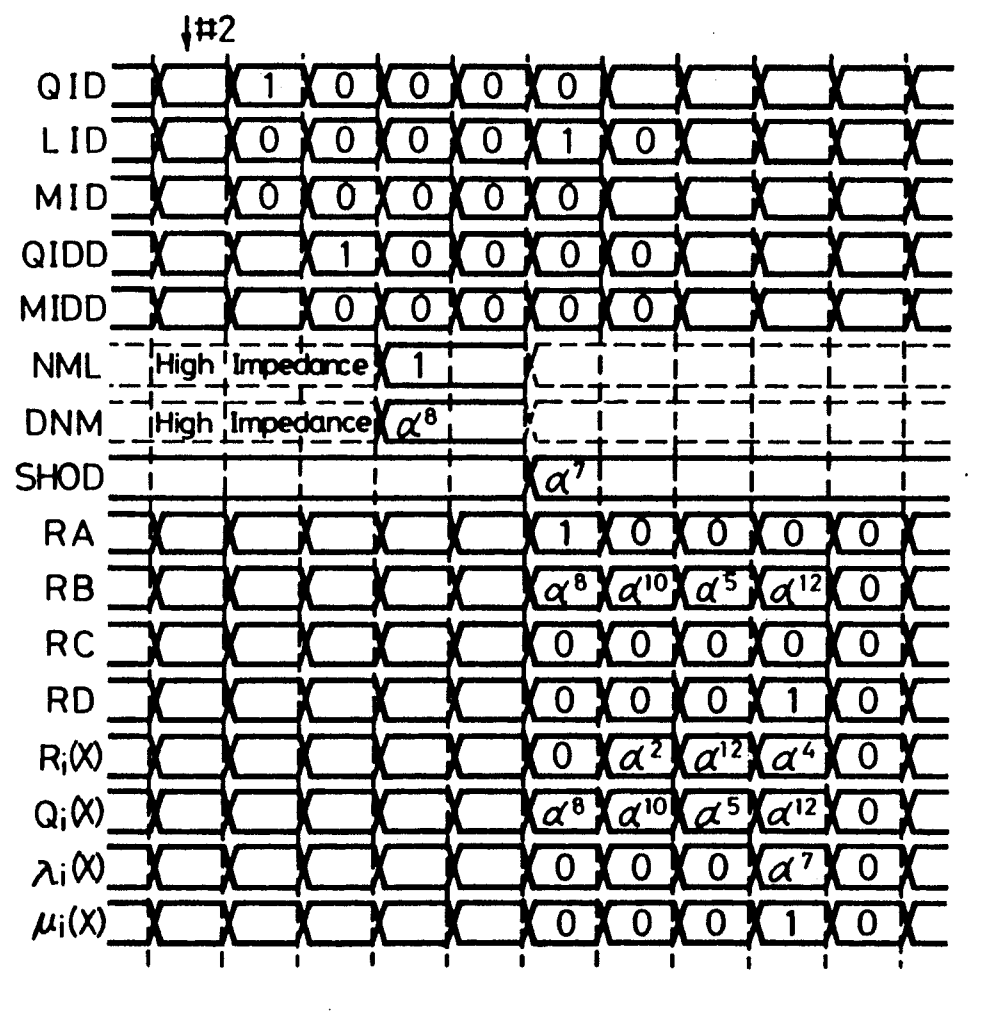

FIG. 24A and 24B are timing chart illustrative of an operation sequence of the mutual division unit shown in FIG. 23;

DETAILED DESCRIPTION OF THE PREFERRED EMBODIMENTS

Prior to describing a mutual division circuit according to the present invention, disadvantages of the mutual division units 11A through 11D in the conventional error locator polynomial deriving circuit shown in FIG. 5 will first be described below.

(1) If the coefficient of the greatest-power term of $R_{i-1}(X)$ becomes 0 when the condition deg $R_{i-1}(X) <$ deg $Q_{i-1}(X)$ is satisfied and the applied coefficients are supplied in crossed relation, then a calculation error occurs since no division can be achieved in the dividers 19A through 19D. This is because the mutual division units 11A through 11D shown in FIG. 5 can reduce the degree always only one at a time.

(2) Also when the coefficient of the greatest-power term of the syndrome polynomial S(X), which is an initial value $Q_0(X)$ of $Q_{i-1}(X)$, is 0, no division can be achieved in the divider 19A, resulting in a calculation error.

Figure 5:
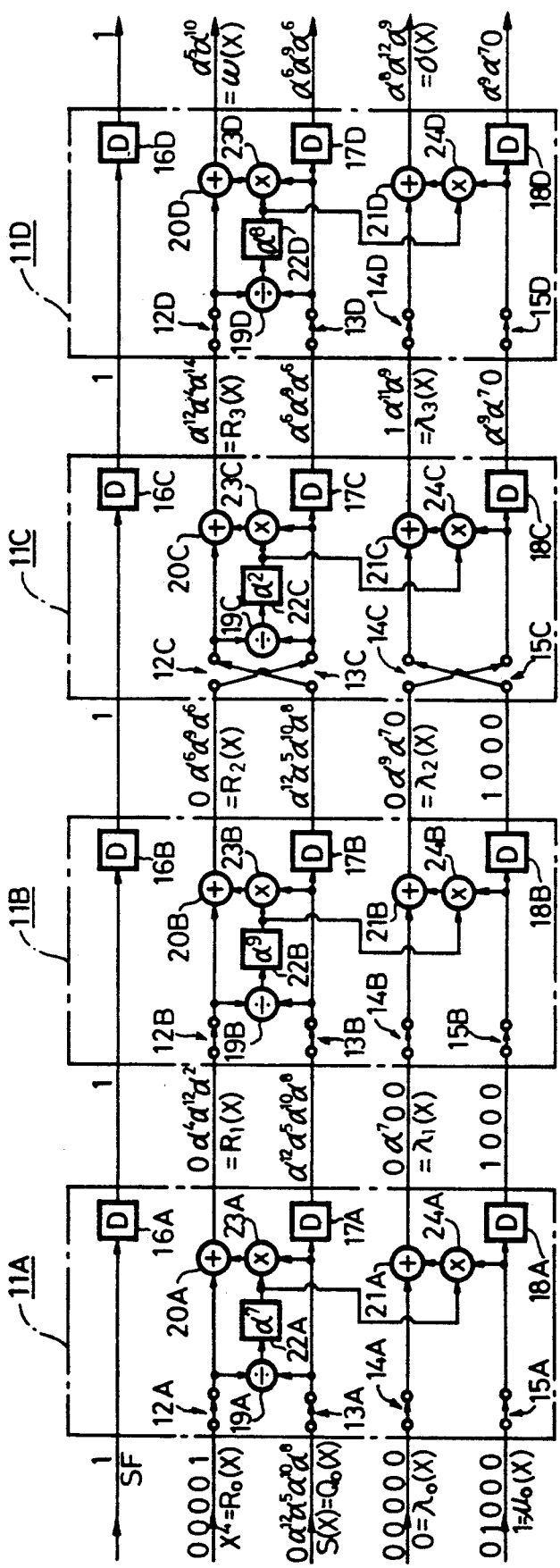
FIG. 5 is a block diagram of a conventional improved error locator polynomial deriving circuit.

According to a first embodiment of the present invention, there is employed a mutual division unit which is free of the drawbacks of the mutual division units 11A through 11D shown in FIG. 5. The mutual division unit according to the first embodiment of the present invention will now be described below.

Figure 6:
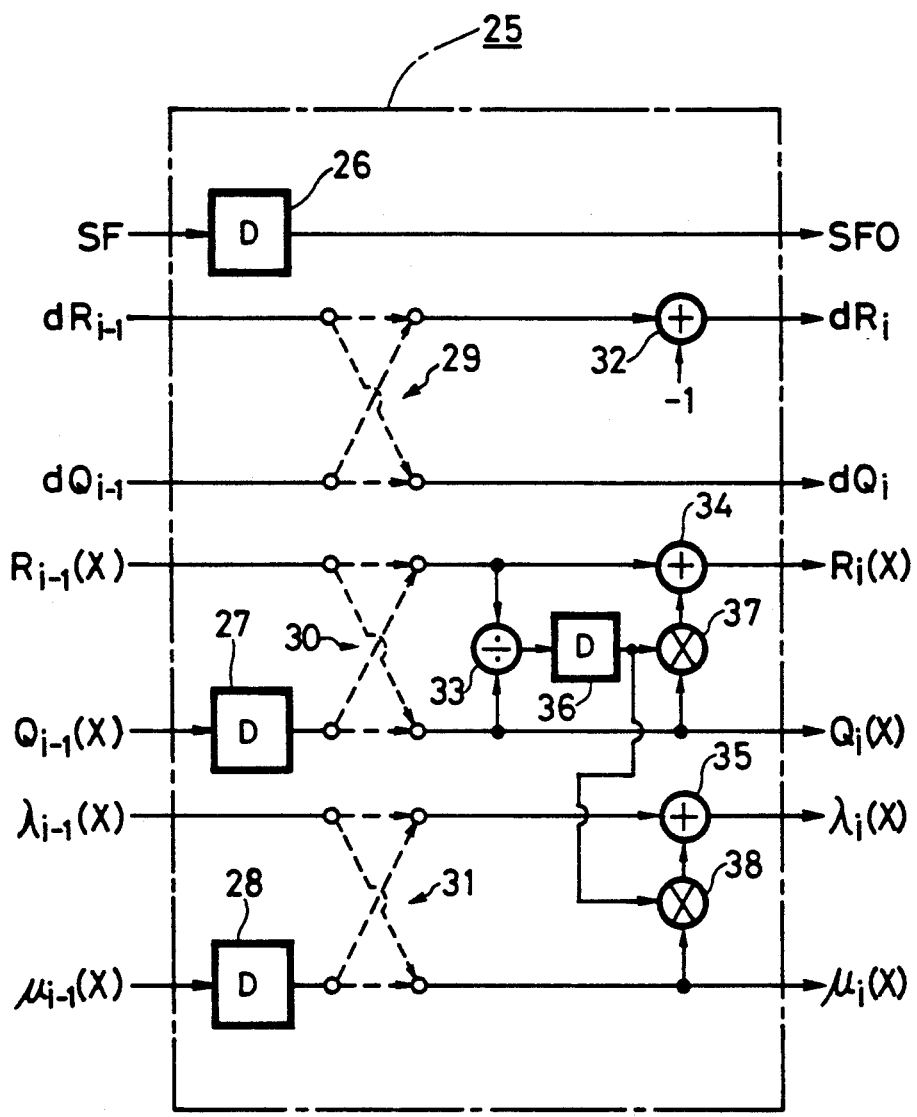
FIG. 6 is a diagram showing a mutual division unit for used in a mutual division circuit according to an embodiment of the present invention.

FIG. 6 shows a mutual division unit 25 which includes delay registers 26, 27, 28. The delay registers 26, 27, 28 are supplied with a start flag signal SF, the coefficients of a polynomial $Q_{i-1}(X)$, and the coefficients of a polynomial $\mu_{i-1}(X)$, respectively. The register 26 produces an output signal which is supplied as a start flag signal SFO to a next mutual division unit. The mutual division unit 25 also includes switch circuits 29, 30, 31 for transmitting supplied coefficients parallel or in crossed relation to each other. The switch circuit 29 has two input ports supplied with variables $dR_{i-1}$, $dQ_{i-1}$ which indicate the degrees of respective polynomials. To the variable which appears at one output terminal of the switch circuit 29, there is added $-1$ by an adder 32, thus producing a variable $dR_i$. This variable $dR_i$ and a variable $dQ_i$ appearing at the other output port of the switch circuit 29 are supplied to the next mutual division unit.

The switch circuit 30 has two input ports supplied with the coefficients of the polynomial $R_{i-1}(X)$ and the coefficients produced by the register 27. The coefficients which appear at one output port of the switch circuit 30 are supplied to a dividend input port of a divider 33 and one input port of an adder 34. The coefficients which appear at the other output port of the switch circuit 30 are supplied to a divisor input port of the divider 33 and one input port of a multiplier 37. The input ports of the switch circuit 31 are supplied with the coefficients of a polynomial $\lambda_{i-1}(X)$ and the coefficients produced by the register 28, respectively. The coefficients appearing at the output ports of the switch circuit 31 are supplied to one input port of an adder 35 and one input port of a multiplier 38, respectively. The quotient produced by the divider 33 is held by a register 36, and then supplied to other input terminals of the multipliers 37, 38, respectively. The output data from the multipliers 37, 38 are supplied respectively to other input ports of the adders 34, 35. The coefficients of polynomials $R_i(X)$, $Q_i(X)$, $\lambda_i(X)$, and $\mu_i(X)$ are supplied from the output port of the adder 34, the other output port of the switch circuit 30, the output port of the adder 35, and the other output port of the switch circuit 31, respectively, to the next mutual division unit.

Figure 7:
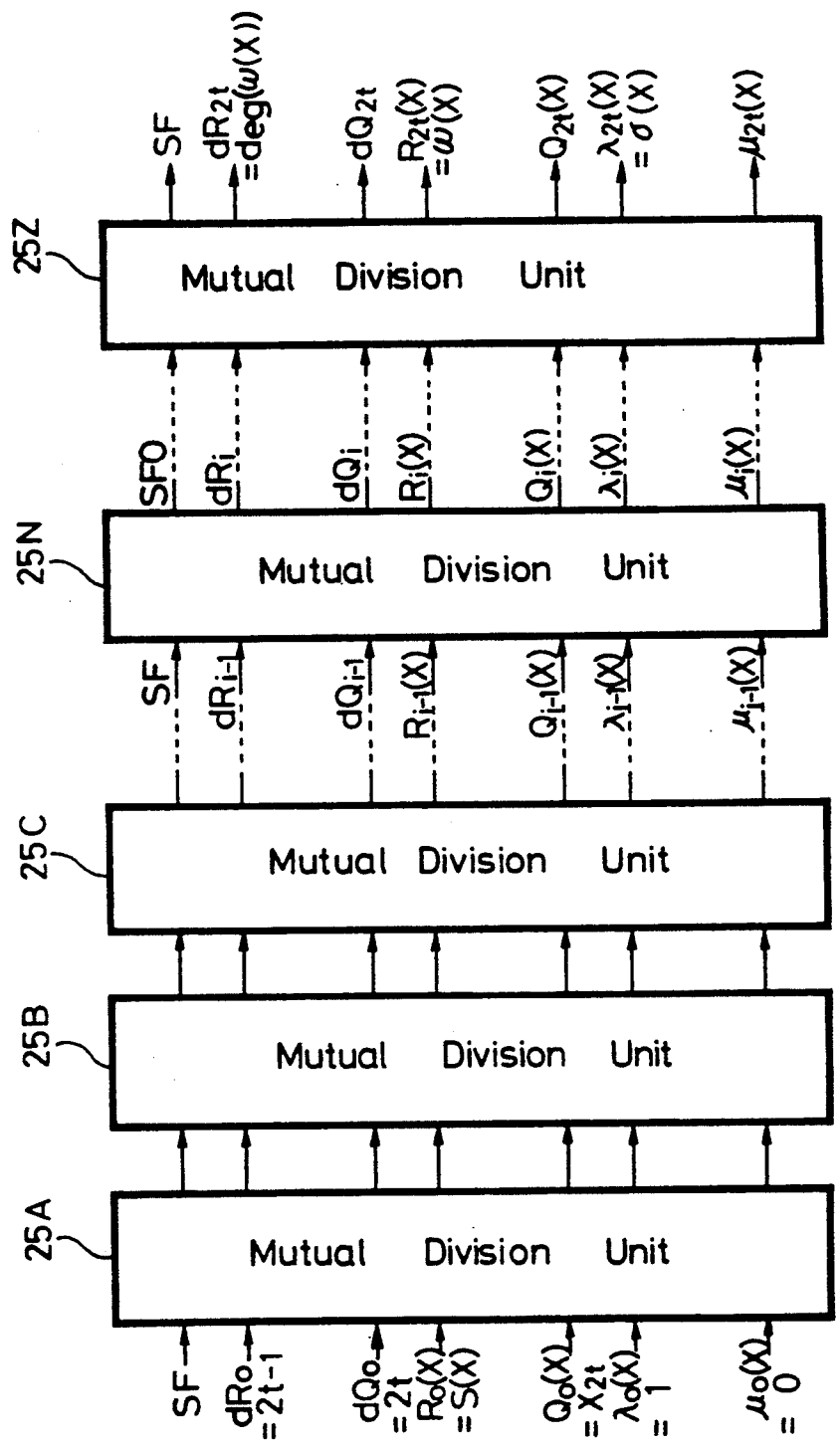
FIG. 7 is a block diagram showing a conventional arrangement in which mutual division units shown in FIG. 6 are connected.

A circuit arrangement in which 2t mutual division units 25A through 25Z, each identical in construction to the mutual division unit 25 shown in in FIG. 6, are connected in cascade is illustrated in FIG. 7. In FIG. 7, the first mutual division unit 25A is supplied with variables and initial values (including a syndrome polynomial S(X), $X^{2t}$, etc) of polynomials, and the final mutual division unit 25Z produces an error locator polynomial $\sigma(X)$ ($=\lambda_{2t}(X)$) and an error evaluator polynomial $\omega(X)$ ($=R_{2t}(X)$).

An improved Euclidean division algorithm, which is applied to the mutual division unit shown in FIG. 6, will be described with reference to steps 115 through 125 shown in FIG. 8. It is assumed that the upper limit for the number of symbols whose errors can be corrected is t. This algorithm is basically arranged to successively calculate polynomials $R_i(X)$, $\gamma_i(X)$, $\lambda_i(X)$ which satisfy the equation (16) in the ith repeated procedure. The processing with respect to the polynomial $\gamma_i(X)$ will be omitted from illustration.

STEP 115

Figure 4:
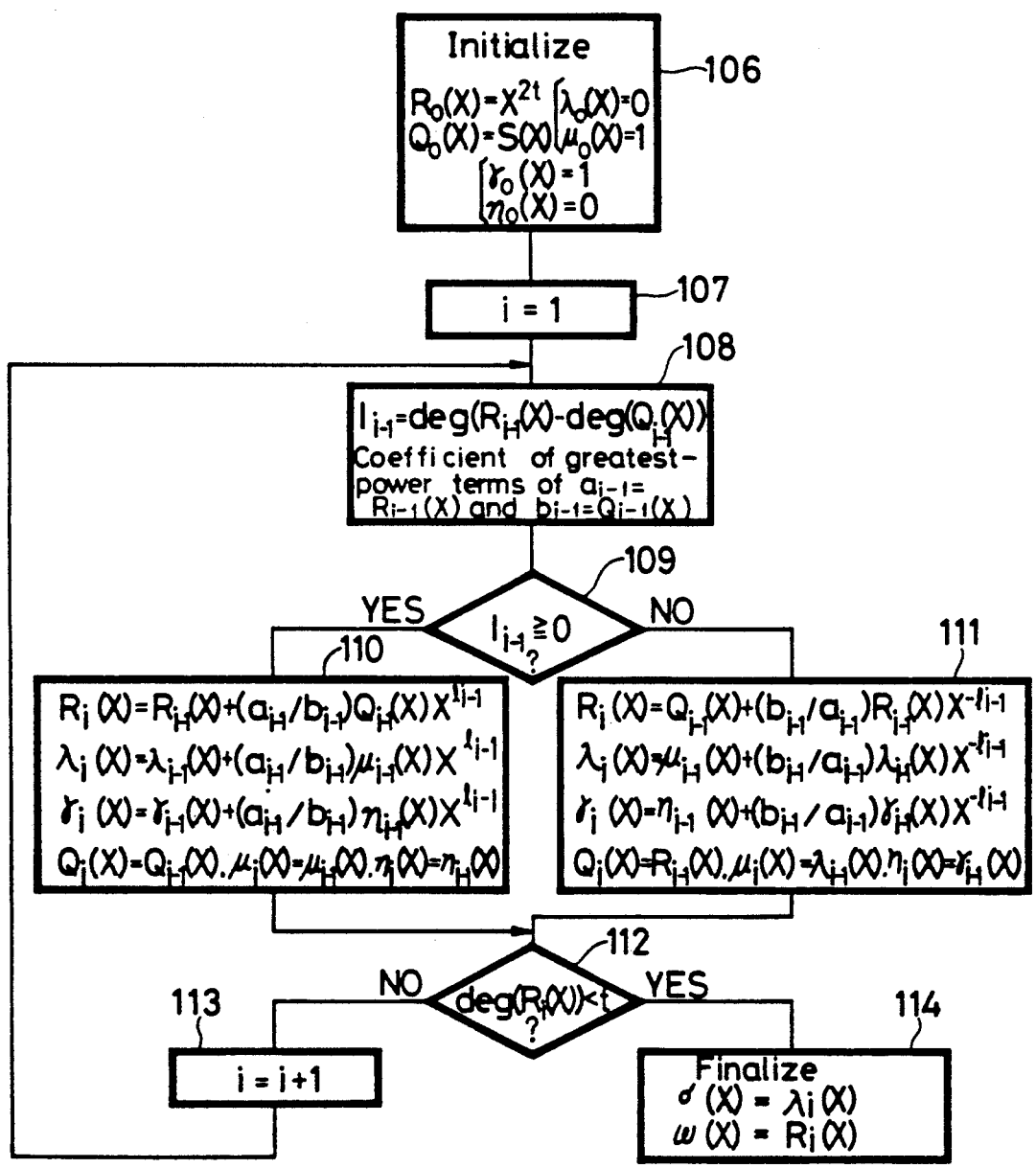
FIG. 4 is a flowchart of a conventional improved division algorithm.

$R_0(X)$, $Q_0(X)$, $\lambda_0(X)$, $\mu_0(X)$, $dR_0$, and $dQ_0$ are initialized into a syndrome polynomial S(X), $X^{2t}$, 1, 0, $2t-1$, and $2t$, respectively. The step 115 differs from the step 06 of the algorithm shown in FIG. 4 partly in that the initial values for $R_0(X)$ and $Q_0(X)$ are exchanged with each other and the initial values for $\lambda_0(X)$ and $\mu_0(X)$ are exchanged with each other. With such initial values, since the coefficient of the greatest-power term of $X^{2t}$, which is the initial value $Q_0(X)$ for $Q_i(X)$, is 1, thus avoiding a division with the divisor being 0, the disadvantage (2) of the conventional mutual division units 11A through 11D is eliminated.

STEP 116

The number i of steps is set to 1.

STEP 117

The difference $l_{i-1}$ between $dR_{i-1}$ and $dQ_{i-1}$ is determined, and the coefficient of the $dR_{i-1}$th term of $R_{i-1}(X)$ and the coefficient of the $dQ_{i-1}$th term of $Q_{i-1}(X)$ are set to $a_{i-1}$ and $b_{i-1}$, respectively. Since the coefficient of the greatest-power term of the syndrome polynomial S(X) which is RO(X) can be 0 in this case, the coefficient $a_{i-1}$ may be 0.

STEP 118

The sign of the difference $l_{i-1}$ is checked. If $l_{i-1} \geq 0$, then control goes through the step 119 to the step 123. If $l_{i-1} < 0$, then control goes to the step 120.

STEP 119 (Normal mode)

This step is executed if $l_{i-1} \geq 0$, i.e., $dR_{i-1}(X)$ is greater than $dQ_{i-1}(X)$. $R_i(X)$, $\lambda_i(X)$ are calculated according to the following equations:

$$R_i(X) = R_{i-1}(X) + (a_{i-1}/b_{i-1}) \cdot X \cdot Q_{i-1}(X) \tag{23A}$$

$$\lambda_i(X) = \lambda_{i-1}(X) + (a_{i-1}/b_{i-1}) \cdot X \cdot \mu_{i-1}(X) \tag{23B}$$

In addition, $Q_i(X)$, $\mu_i(X)$, $dR_i$, $dQ_i$ are set respectively to $Q_i(X) = Q_{i-1}(X)$, $\mu_i(X) = \mu_{i-1}(X)$, $dR_i = dR_{i-1} - 1$, $dQ_i = dQ_{i-1}$. In the above equations, the division $R_{i-1}(X)/Q_{i-1}(X)$ is replaced with the division $a_{i-1}/b_{i-1}$ between the hypothetical coefficients of the greatest-power terms. In the equations (23A), (23B), $(a_{i-1}/b_{i-1})$ is multiplied by X because $l_{i-1} = dR_{i-1} - dQ_{i-1}$ is controlled so as to be normally $\pm 1$.

STEP 120

If $a_{i-1}$, which is the coefficient of the $dR_{i-1}$th term of $R_{i-1}(X)$, is 0, then control goes through the step 121 to the step 123. If $a_{i-1}$ is not 0, then control goes through the step 122 to the step 123.

STEP 122 (Cross mode)

This step is executed if the degree of $Q_{i-1}(X)$ is greater than the degree of $R_{i-1}(X)$, and the coefficient $a_{i-1}$ is not 0. $R_{i-1}(X)$ and $Q_{i-1}(X)$ in the Normal mode are exchanged, and $R_i(X)$ and $\lambda_i(X)$ are calculated according to the following equations:

$$R_i(X) = Q_{i-1}(X) + (b_{i-1}/a_{i-1}) \cdot X \cdot R_{i-1}(X) \quad (24A)$$

$$\lambda_i(X) = \mu_{i-1}(X) + (b_{i-1}/a_{i-1}) \cdot X \cdot \lambda_{i-1}(X) \quad (24B)$$

In addition, $Q_i(X)$, $\mu_i(X)$, $dR_i$, $DQ_i$ are set respectively to $Q_i(X) = R_{i-1}(X)$, $\mu_i(X) = \lambda_{i-1}(X)$, $dR_i = dQ_{i-1} - 1$, $dQ_i = dR_{i-1}$. Then, control goes to the step 123.

STEP 121 (Shift mode)

This step is executed if the coefficient $a_{i-1}$ of the $dR_{i-1}$th term (greatest-power term) of $R_i(X)$ is 0 and the actual degree of $R_{i-1}(X)$ is less than $(dR_{i-1}-1)$. In this case, $R_{i-1}(X)$ is multiplied by X to shift $R_{i-1}(X)$ to a higher degree, so that divisions by $R_{i-1}(X)$ are made possible. Therefore, the following equations are satisfied:

$$R_i(X) = X \cdot R_{i-1}(X) \quad (25A)$$

$$\lambda_i(X) = X \cdot \lambda_{i-1}(X) \quad (25B)$$

In addition, $Q_i(X)$, $\mu_i(X)$, $dR_i$, $dQ_i$ are set respectively to $Q_i(X) = Q_{i-1}(X)$, $\mu_i(X) = \mu_{i-1}(X)$, $dR_i = dR_{i-1} - 1$, $dQ_i = dQ_{i-1}$. Then, control goes to the step 123. Since $dR_i$ is decremented by 1, $dR_i$ is in agreement with deg $(R_i(X))$ when the coefficient of the greatest-power term ($dR_i$th term) of $R_i(X)$ becomes a number other than 0. At this time, the cross mode is first carried out in the step 122. With this processing, the drawback (1) of the mutual division units 11A through 11D shown in FIG. 5 is obviated.

This step determines whether the number i of steps has reached 2T not, then control goes to the step 124. If the number i of steps has reached 2t, then control goes to the final step 125.

Therefore, even if the number of error symbols is $\nu$ ($\nu < t$), the operation sequence of the steps 117 through 123 is always repeated 2t times in the overall error locator polynomial deriving circuit. However, each mutual division unit executes the steps 117 through 123 only once. In the solution which is obtained after the operation sequence of the steps 117 through 123 is repeated 2t times, $dR_{2t}$ represents a number produced by subtracting 1 from the degree $\nu$ of the error locator polynomial $\sigma(X)$. Inasmuch as the polynomial $R_{2t}(X)$ is shifted $(t-1-\nu)$ to a higher degree by the shift mode of the step 121, both $\lambda_{2t}(X)$ and $R_{2t}(X)$ need to be shifted to a lower degree using a shift polynomial $P(X)$, described later, in order to obtain $\sigma(X)$ and $\omega(X)$.

STEP 124

The number i of steps is incremented by 1, and control returns to the step 117.

STEP 125

In this final step, the number $\nu$ of error symbols and the shift polynomial $P(X)$ are calculated according to the following equations:

$$\nu = dR_{2t} + 1$$

$$P(X) = X^{t-\nu}.$$

Thereafter, using the shift polynomial $P(X)$, the error locator polynomial $\sigma(X)$ and the error evaluator polynomial $\omega(X)$ are calculated according to the following equations:

$$\sigma(X) = \lambda_{2t}(X)/P(X) \quad (26)$$

$$\omega(X) = R_{2t}(X)/P(X) \quad (27)$$

Figure 9:
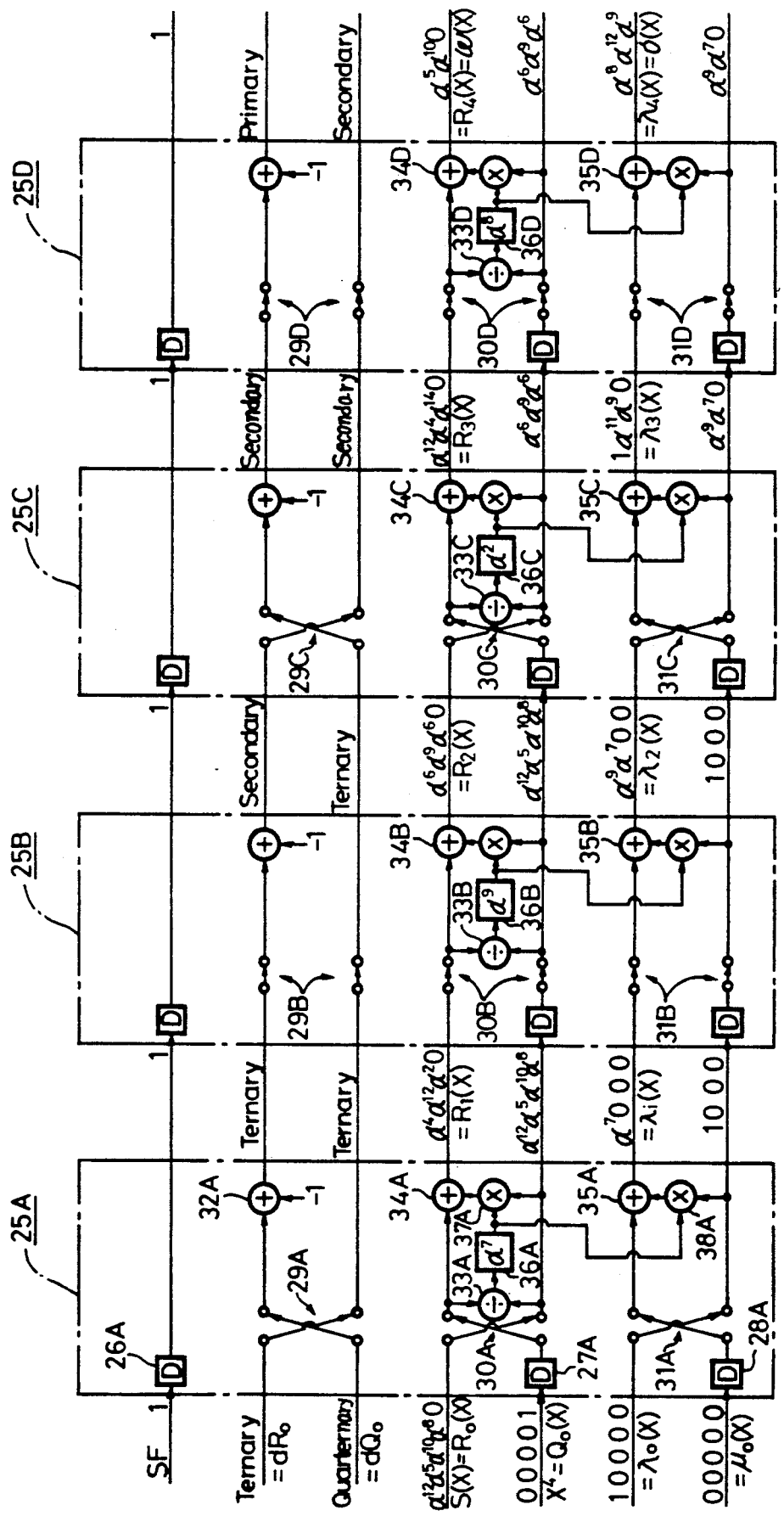
FIG. 9 is a diagram of an error locator polynomial deriving circuit in which mutual division units shown in FIG. 6 are a connected in a conventional manner.

A specific application which employs the mutual division unit 25 shown in FIG. 6 will be described below. FIG. 9 illustrates an error locator polynomial deriving circuit comprises four cascaded mutual division units 25A through 25D each identical in construction to the mutual division unit 25 shown in FIG. 6. Respective symbols are expressed by the respective elements of a finite field $GF(2^4)$. The code length n is 11 and the number t of correctable symbols is 2. A transmitted code word f and a transmission error vector e are expressed by the equations (20) and (21), respectively.

Figure 8:
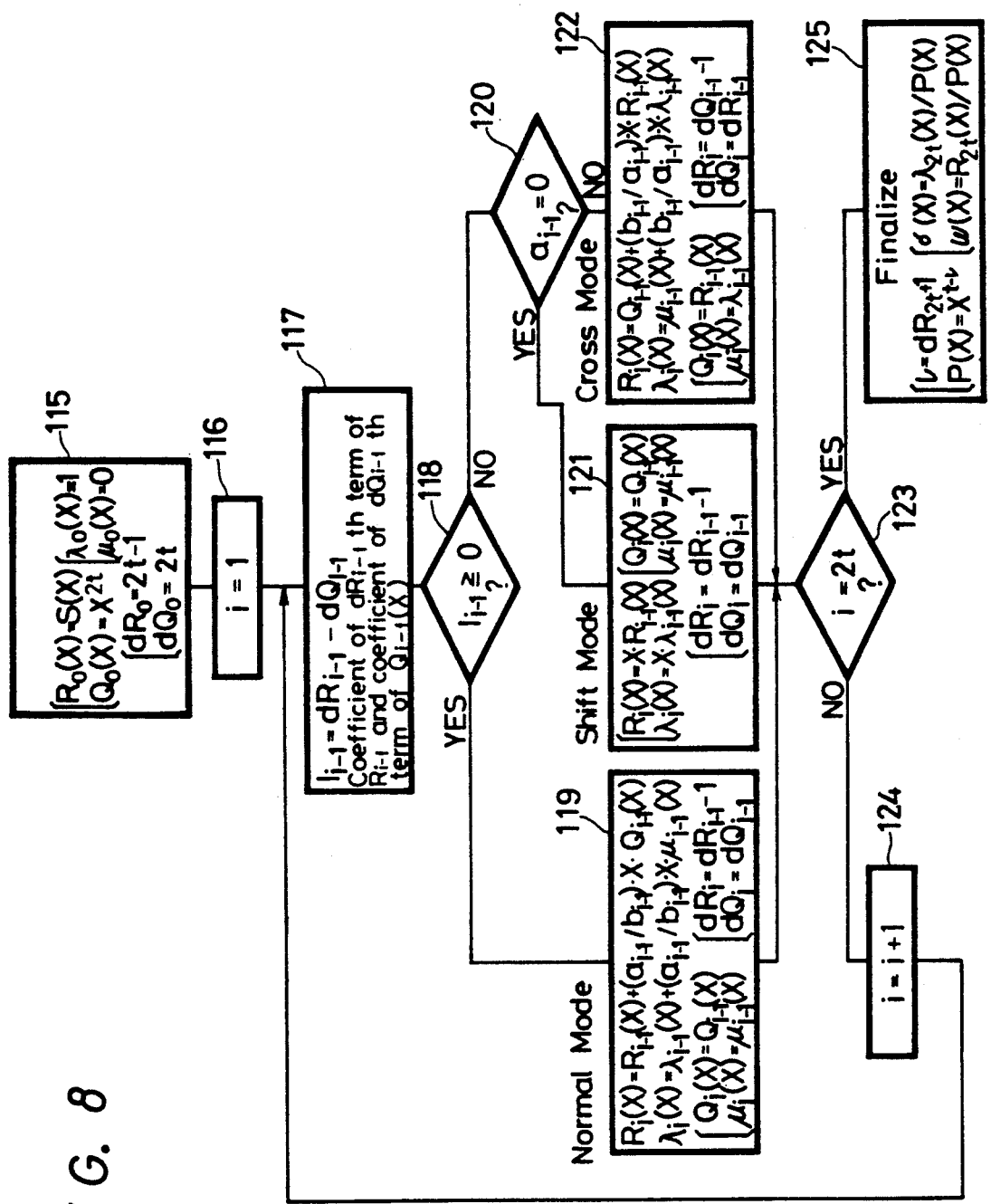
FIG. 8 is a flowchart of an improved division algorithm for use in the mutual division circuit according to the embodiment of the present invention.

The syndrome polynomial $S(X)$ is expressed by the equation (22), and the variables and the initial values of the polynomials in the step 115 shown in FIG. 8 are as follows:

$$R_0(X) = S(X), \quad Q_0(X) = X^4$$

$$\lambda_0(X) = 1, \quad \mu_0(X) = 0, \quad dR_0 = 3, \quad dQ_0 = 4.$$

As shown in FIG. 9, the coefficients of $R_0(X) \sim \mu_0(X)$ are supplied to the mutual division unit 25A successively from those of the greatest-power terms, the values of $dR_0$ and $dQ_0$ are supplied to the mutual division unit 25A, and the start flag signal SF is set to a high-level "1" in synchronism with the coefficients of the greatest-power terms.

In the mutual division unit 25A, the degree difference $l_0 = dR_0 - dQ_0 = 3 - 4 = -1 < 0$ and $a_o = a^8$, $b_o = 1$. Thus, the operation thereof goes to the step 122 (Cross mode) shown in FIG. 8, in which the switch circuits 29A through 31A transmit the supplied variables and coefficients in crossed relation. The register 36A holds $b_0/a_0 = 1/\ ^8 =\ ^7$. $R_1(X)$ and $\lambda_1(X)$ are expressed as follows:

$$R_1(X) = X^4 + \alpha^7 \cdot X \cdot (\alpha^8 X^3 + \alpha^{10} X^2 + \alpha^5 X + \alpha^{12})$$
$$= \alpha^2 X^3 + \alpha^{12} X^2 + \alpha^4 X$$
$$\lambda_1(X) = 0 + \alpha^7 \cdot X = \alpha^7 X.$$

Furthermore, $Q_1(X) = R_0(X) = S(X)$, $\mu_1(X) = \lambda_0(X) = 1$. These results are the same as those produced by the mutual division unit 11A shown in FIG. 5, except that the degree is shifted.

Likewise, the results produced by the mutual division units 25B through 25D shown in FIG. 9 are the same as those produced by the mutual division units 11B through 11D shown in FIG. 5. Therefore, the circuit arrangement shown in FIG. 9 finally produces an accurate error locator polynomial $\sigma(X)$ ($=\lambda_4(X)$) and an accurate error evaluator polynomial $\omega(X)$ ($=R_4(X)$) Because the number t of error-correctable symbols and the number $\nu$ of actual error symbols are both 2 in the arrangement of FIG. 9, the shift polynomial $P(X)$ in the step 125 shown in FIG. 8 is 1.

Figure 10:
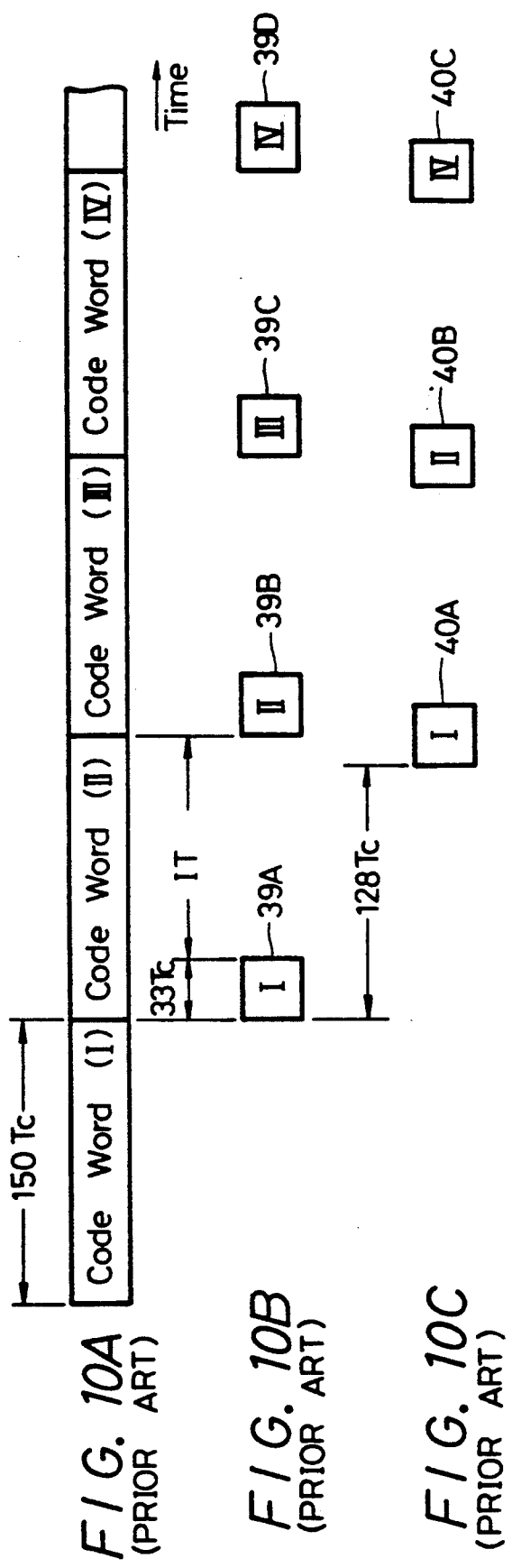
FIGS. 10A, 10B, and 10C are timing charts illustrative of an operation sequence of the conventional error locator polynomial deriving circuit.

Now, it is assumed that the code length n is 150 and the number t of error-correctable symbols is 16. In this case, the operation sequence of the steps 117 through 123 shown in FIG. 8 is required to be repeated 32 (2t) times. If the mutual division units are simply connected in cascade as is conventional, then 32 mutual division units 25 shown in FIG. 6 are necessary. If the transmitted code word is transmitted one symbol at a time in synchronism with clock pulses CK, and if one period of the clock pulses CT is 1Tc, then 150 received code words I, II, III, ... are transmitted in a period 150Tc, as shown in FIG. 10 at A. With t=16, the maximum degree of the syndrome polynomial S(X) is 31 (=2t−1), and the number off coefficients of the polynomial $X^{2t}$ is 33 (=2t+1). Accordingly, if the 32 mutual division units 25 shown in FIG. 6 are simply cascaded as is conventional, the first mutual division unit of the cascaded mutual division units is supplied with 33 coefficient pairs of the syndrome polynomial S(X) and the polynomial $X^{2t}$ in respective periods 39A, 39B, 39C, ... of 33Tc after the respective code words I, II, III, ... are received.

Assuming that one mutual division unit requires a time period corresponding to 4 clock pulses (4Tc) to process one coefficient pair of S(X) and $X^{2t}$, since one pair of coefficients needs to pass each of the 32 mutual division units, the coefficients of the error locator polynomial σ(X) corresponding to the received code words I, II, III, ... are successively produced by the final mutual division unit in respective periods 40A, 40B, 40C, ..., 128Tc after the code words I, II, III, ... are received. As no input is applied to the first mutual division unit in a period IT which is left by subtracting the period 33Tc from the period 150Tc, the period IT may be regarded as an idle time. If the number t of error-correctable symbols and the code length N satisfy the relationship N>>2t in general, the simple cascaded connection of the mutual division units results in an increased circuit arrangement size and an extended idle time 1T.

A mutual division circuit according to an embodiment of the present invention will now be described with reference to FIGS. 11 and 12.

Figure 1:
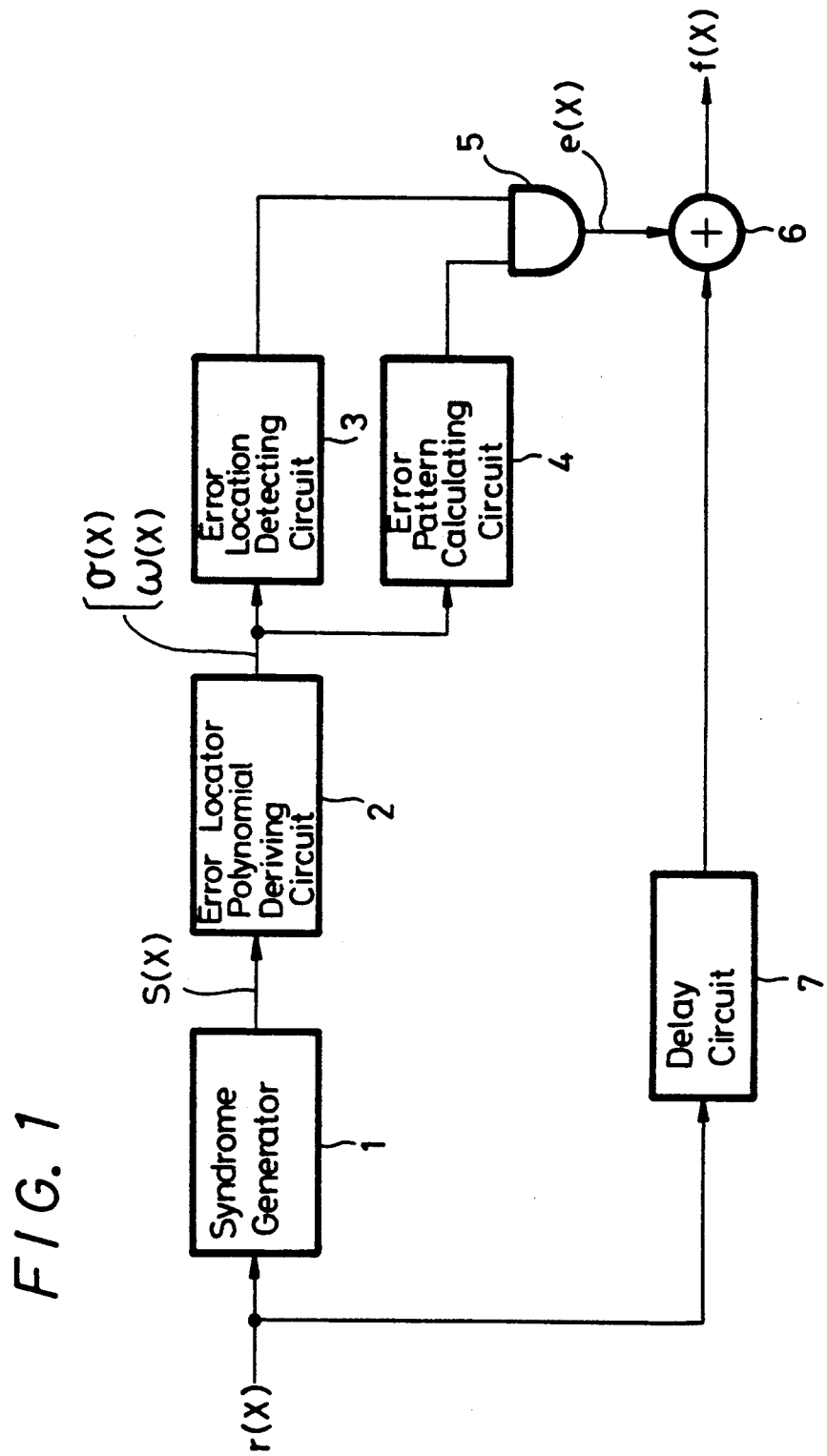
FIG. 1 is a block diagram of an overall arrangement of a decoder for decoding an error-correcting code.
Figure 2:
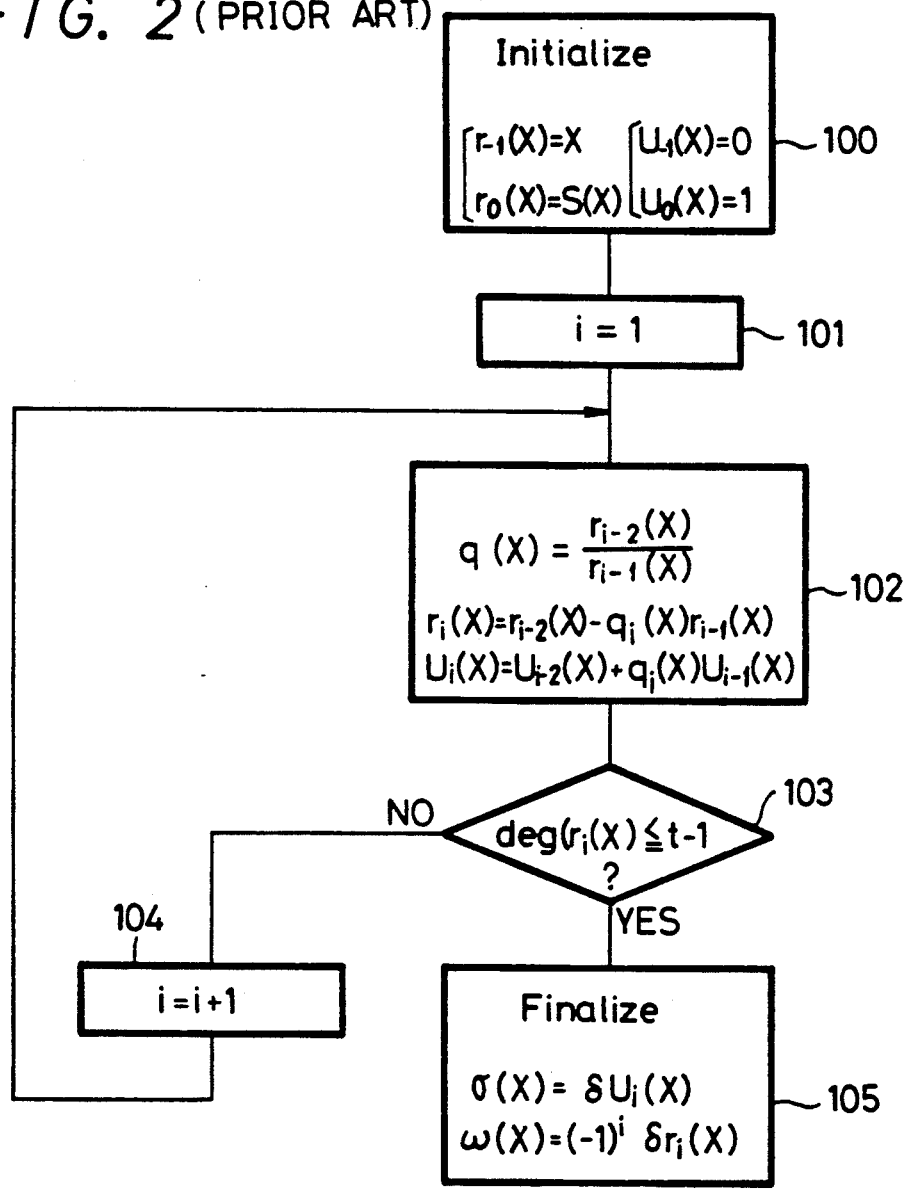
FIG. 2 is a flowchart of a conventional division algorithm.
Figure 3:
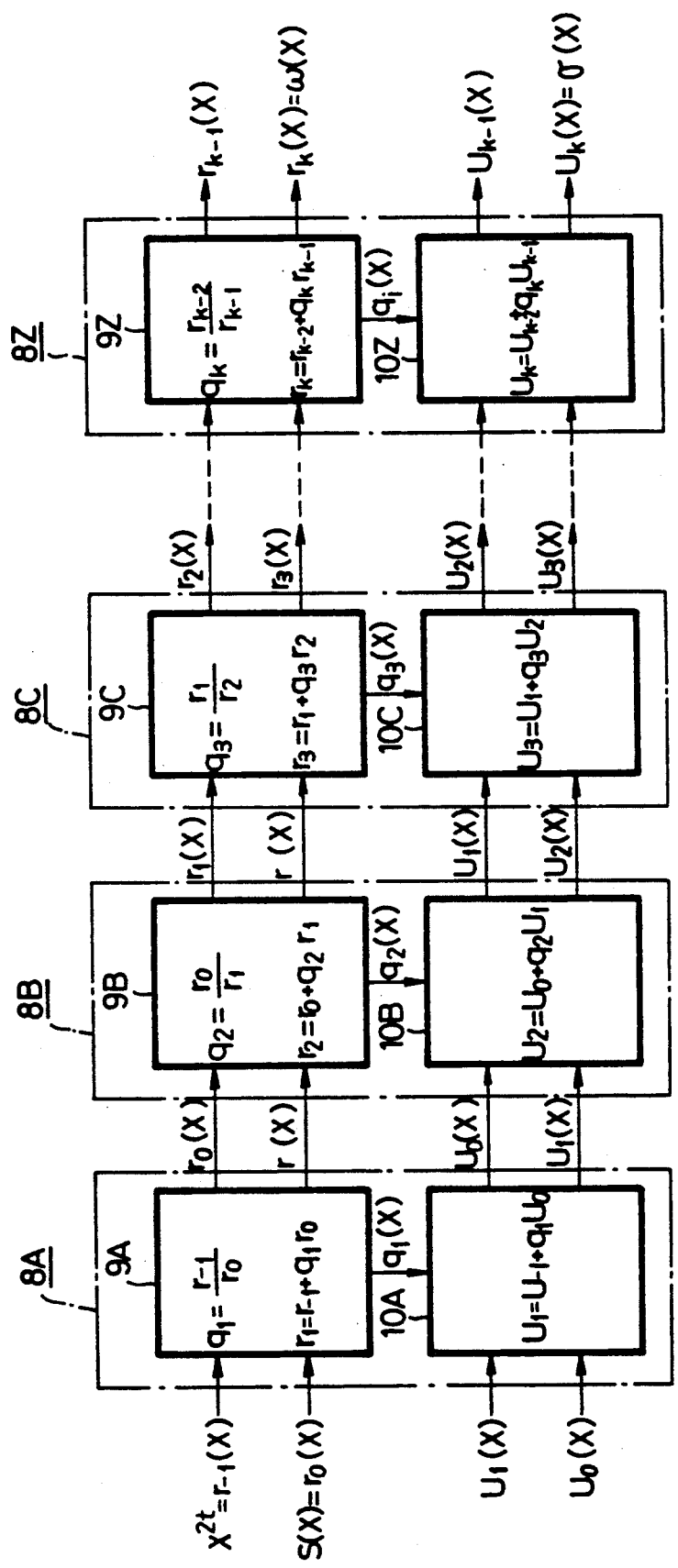
FIG. 3 is a block diagram of a conventional error locator polynomial deriving circuit.

According to this embodiment, the principles of the invention are applied to an error locator polynomial deriving circuit (corresponding to the circuit 2 in FIG. 1) in a decoder for decoding the Reed-Solomon code, with the code length n being 150 and the number t of error-correctable symbols being 16. The error locator polynomial deriving circuit shown in FIG. 11 comprises eight mutual division units each of the construction shown in FIG. 6, each mutual division unit having a data delay time corresponding to 4 clock pulses (4Tc). The algorithm used in each of the mutual division units shown in FIG. 11 is the same as the improved Euclidean division algorithm shown in FIG. 8.

Figure 11:
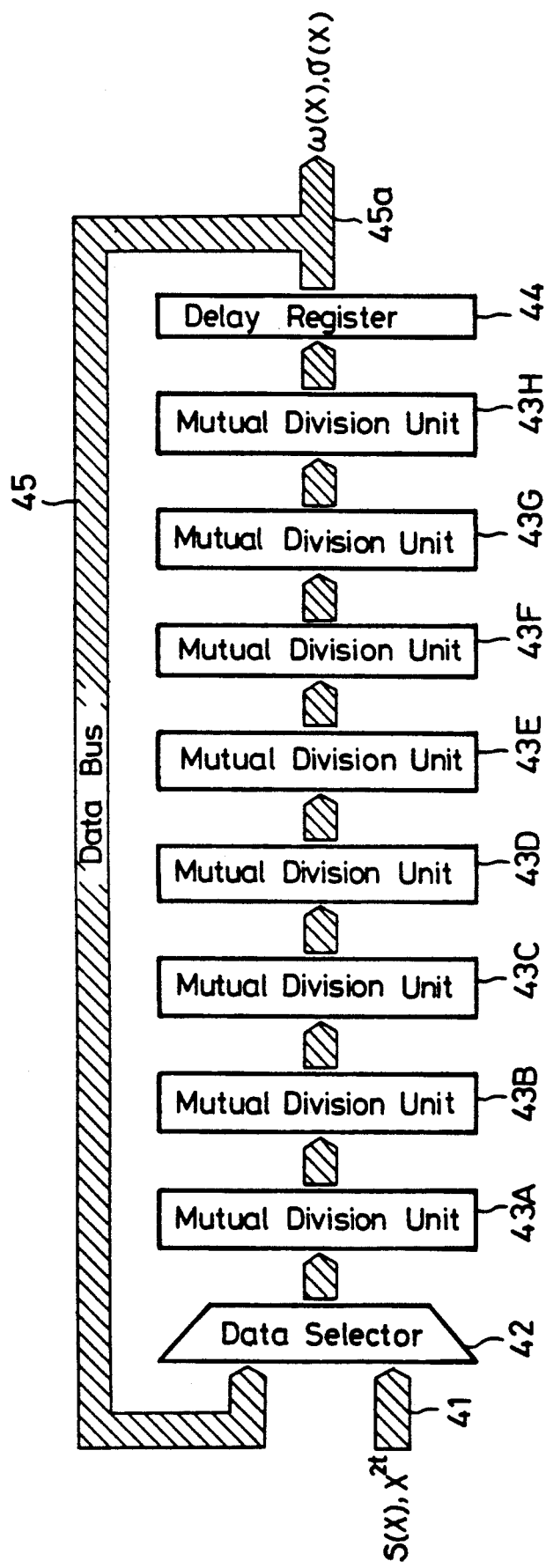
FIG. 11 is a block diagram of a mutual division circuit according to an embodiment of the present invention.

The error locator polynomial deriving circuit shown in FIG. 11 includes a data bus 41, a data selector 42, eight mutual division units 43A through 43H, a delay register 44, and a data bus 45. The coefficients of the syndrome polynomial S(X) and the polynomial $X^{2t}$ are supplied through the data bus 41 to one input port of the data selector 42. Each of the mutual division units 43A through 43H is structurally identical to the mutual division unit shown in FIG. 6, as described above. The delay register 44 delays data by a delay time corresponding to one clock pulse (1Tc). The mutual division units 43A through 43H are connected in cascade between the output port of the data selector 42 and the input port of the delay register 44. The data bus 45 connects the output port of the delay register 44 to the other input port of the data selector 42. The data bus 45 has a branch output bus 45a for delivering the coefficients of an error locator polynomial σ(X) and an error evaluator polynomial ω(X), which are finally produced, to a subsequent circuit (not shown).

Operation of the mutual division circuit shown in FIG. 11 will be described below with reference to FIG. 12. In the mutual division circuit shown in FIG. 11, 150 received code words I, II, III, ... whose code length n is 150 are transmitted each in a period 150Tc, as shown in FIG. 12 at A. Since the number t of error-correctable symbols is 16, the degree of the syndrome polynomial S(X) is 31 (=2t−1), and 33 (=2t+1) sets of coefficients of the syndrome polynomial S(X) and the polynomial $X^{2t}$ are supplied as initial values. The polynomials $\lambda_0(X)$, $\mu_0(X)$ and the variables $dR_0$, $dQ_0$ in the step 115 shown in FIG. 8 are also supplied together with the 33 sets of coefficients. Consequently, the period of 33Tc is required until all the coefficients of S(X), $X^{2t}$, as initial values, and the variables are supplied. In this embodiment, the respective delay times in the mutual division units 43A through 43H are 4Tc, and the delay time in the delay register 44 is 1Tc. Therefore, the total delay time from the mutual division unit 43A to the delay register 44 is 33 (=4×8+1) Tc, and is equalized to the time which is required until all the coefficients and variables are supplied.

Figures 12A, 12B, 12C, 12D, 12E, 12F:
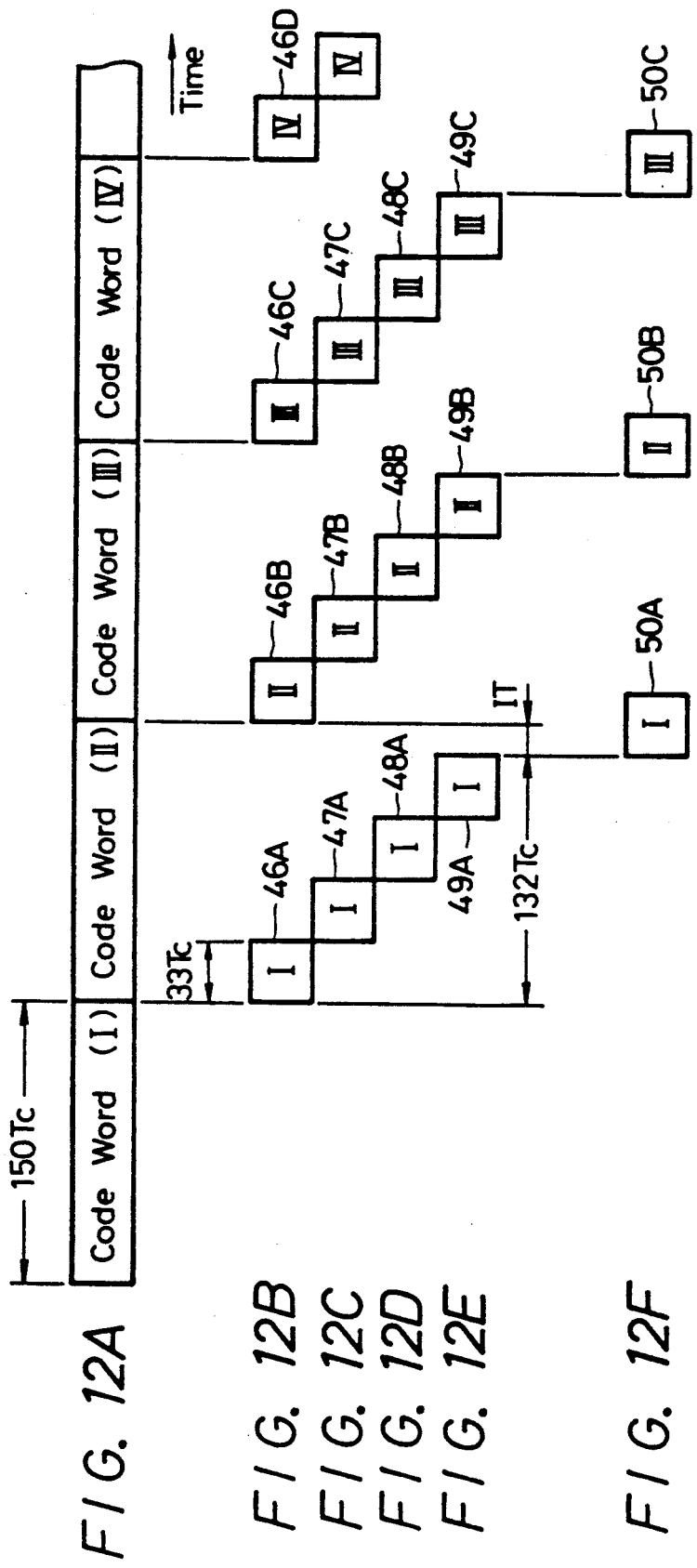
FIGS. 12A, 12B, 12C, 12D, and 12F timing charts illustrative of an operation sequence of the mutual division circuit shown in FIG. 11.

As shown in FIG. 12 at B, in periods 46A, 46B, 46C, ... each of 33Tc after the respective code words I, II, III, ... are received, the 33 sets of initial data which are composed of the coefficients of S(X), $X^{2t}$ are supplied to the first mutual division unit 43A by the data selector 42. From the mutual division unit 43A, there are stored intermediate processed data of the 33 sets of data into the delay register 44.

Then, the data selector 42 is switched over to supply the data from the delay register 44 to the first mutual division unit 43A. Then, as shown in FIG. 12 at C, D, and E, in each of periods 47A, 48A, and 49A each of 33Tc following the period 46A, the 33 sets of intermediate processed data held between the mutual division unit 43A and the delay register 44 are processed while being shifted once through a loop which comprises the mutual division units 43A through 43H, the delay register 44, the data bus 45, and the data selector 42. Thereafter, as shown in FIG. 12 at F, in a 50A of 33Tc following the period 49A, the coefficients of an error locator polynomial σ(X) and an error evaluator polynomial ω(X) are delivered from the output port of the delay register 44 through the branch bus 45A of the data bus 45. Similarly, the intermediate processed data circulate through the loop in each of periods 46B, 46C, ....

With the embodiment shown in FIGS. 11 and 12, the initial 33 sets of data supplied through the data bus 41 circulate four times through the loop. Since the loop includes the eight mutual division units 43A through 43H, the initial 33 sets of data are passed through a total of 32 mutual division units, so that the coefficients of the error locator polynomial can be determined with accuracy. Although the 32 mutual division units were required in the conventional circuit, the mutual division circuit according to this embodiment only requires eight mutual division units 43A through 43H, the number of which is a quarter of the number of the mutual division units in the conventional circuit. The mutual division circuit according to this embodiment may therefore be much smaller in size.

Furthermore, as shown in FIG. 12, the coefficients of the error locator polynomial σ(X) are produced with the delay time of 132 (=33×4) Tc after the code words I, II, III, ... are received. This delay time is substantially equal to the delay time 128Tc of the conventional arrangement shown in FIG. 10. Thus, the delay time of the mutual division circuit according to this embodiment remains almost unchanged even with the size of the circuit being reduced to ¼ of that of the conventional circuit. As shown in FIG. 12, the idle time IT in this embodiment is a time which is left by subtracting 132Tc from 150Tc, and is much shorter than the idle time shown in FIG. 10.

Generalization of the mutual division circuit shown in FIG. 11, and hence the number of mutual division units required when the code length is n and the number of error-correctable symbols is t will be considered below. Since are (2t+1) sets of coefficients of the syndrome polynomial S(X) and the polynomial $X^{2t}$, the maximum number $R_M$ by which a series of mutual division units can repeatedly be used is given by:

$$R_M = int(n/(2t+1)) \quad (28)$$

except when parallel processing is carried out, where int(A) represents an integer not exceeding A. If a series of mutual division units are repeatedly used R times, the number G of those mutual division units is given by:

$$G = int((2t-1)/R) + 1 \quad (29)$$

The upper limit $T_U$ of the time $T_{CK}$ of a clock pulse unit required to process data once in the series of mutual division units (upon one circulation therethrough) is given by:

$$T_U = int((n-1)/R) + 1 \quad (30)$$

As initial coefficients must be supplied in (2t+1) sets, the lower limit $T_D$ for the time $T_{CK}$ is given by:

$$T_D = 2t + 1 \quad (31)$$

Therefore, from the equation (29), if the number R of times by which the mutual division units are repeatedly used is increased, the number G of mutual division units connected in series may be reduced to 1 at minimum. A delay register should be employed in this case in order to keep the delay time $T_{CK}$ in the range of $T_D \leq T_{CD} \leq T_U$.

If n=150 and t=16 as with the embodiment shown in FIG. 11, then R=int(150/33)=4, G=int(31/4)+1=8, $T_U$=int(149/4)+1=38, $T_D$=33. Therefore, the above conditions are satisfied.

The error location polynomial and the error evaluation polynomial may finally be extracted from the mutual division circuit at a junction between adjacent mutual division units (e.g., between the mutual division units 43E, 43F in FIG. 11).

A more specific arrangement of each of the mutual division units in the mutual division circuit shown in FIG. 11 will be described below with reference to FIGS. 13 and 14.

Figure 13:
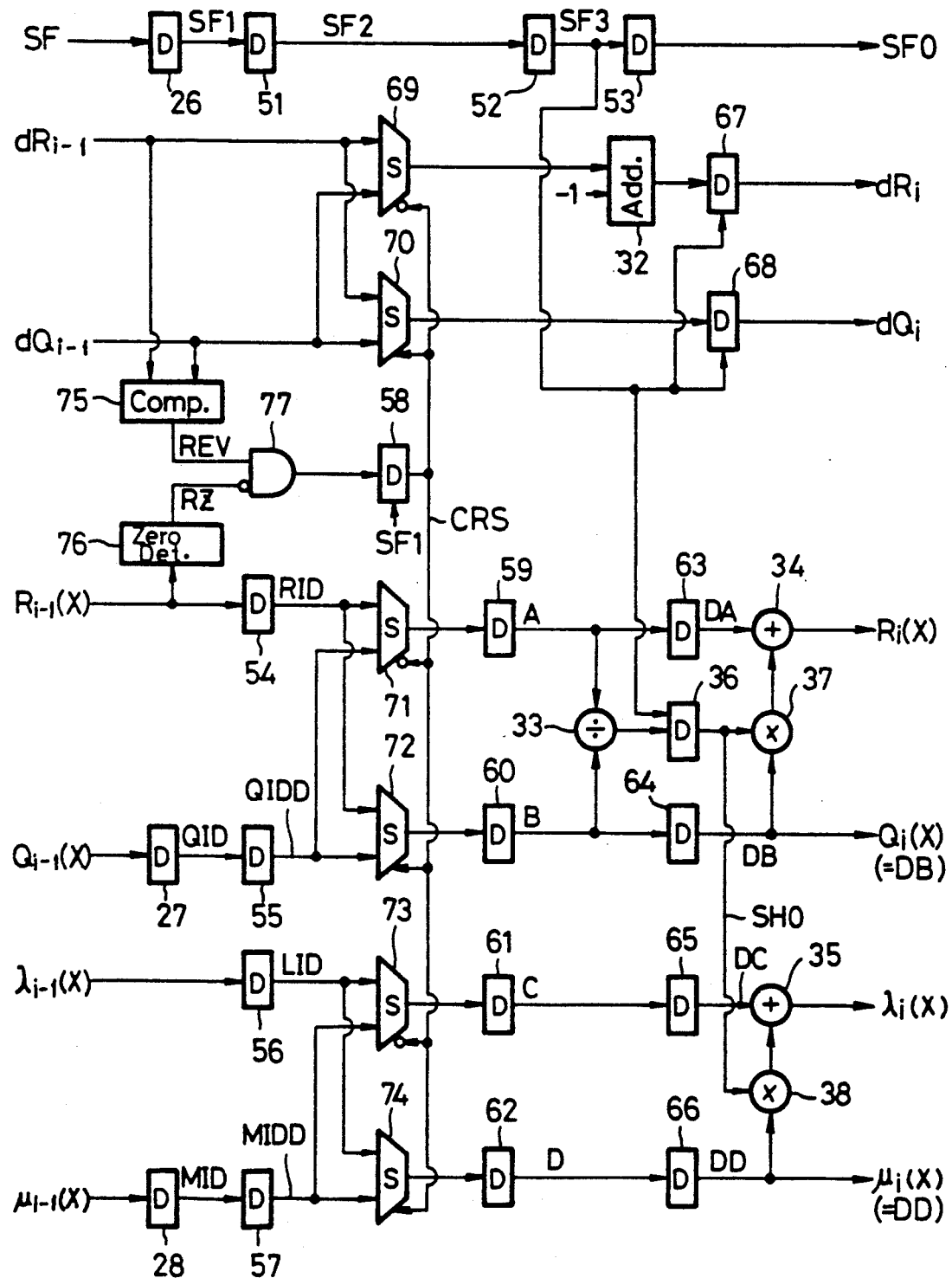
FIG. 13 is a block diagram of a mutual division unit according to an embodiment for use in the mutual division circuit shown in FIG. 11.

In FIG. 11, each of the mutual division units 43A through 43H has a data delay time corresponding to 4 clock pulses (4Tc), FIG. 13 shows a specific synchronous arrangement of the mutual division unit whose data delay time is 4Tc. Those parts and signals in FIG. 13 which correspond to those shown in FIG. 6 are denoted by identical reference characters, and will not be described in detail.

As shown in FIG. 13, the mutual division unit includes delay registers 51 through 68 comprising D-type flip-flops, respectively, and data selectors 69 through 74 each having two input ports. The paired data selectors 69, 70, the paired data selectors 71, 72, and the paired data selectors 73, 74 correspond respectively to the switch circuits 29, 30, 31 shown in FIG. 6. The mutual division unit also includes a comparator 75 which produces a comparison signal REV that is of a low level "0" when $dR_i - dQ_i \geq 0$ and of a high level "1" when $dR_i = dQ_i < 0$. The comparison signal REV from the comparator 75 is supplied to one input terminal of an AND gate 77. A zero detector 76 produces a zero-detected signal RZ which is of high level "1" only when the coefficients of the polynomial $R_{i-1}(X)$ are 0. The zerodetected signal RZ is supplied to the other negative-logic input terminal of the AND gate 77. An output signal from the AND gate 77 is held by the register 58, whose output signal CRS is used to control switching of the data selectors 69 through 74.

The register 54 is connected to one input terminal of the data selector 71, whose output terminal is connected to the registers 59, 63. Likewise, the registers 55, 56, 57 are connected respectively to input terminals of the data selectors 72, 73, 74, whose output terminals are connected to the registers 60, 64, the registers 61, 65, and the registers 62, 66, respectively. A start flag signal SF is converted into flag signals SF1, SF2, SF3, SF0 respectively by the registers 26, 51, 52, 53. The flag signal SF1 serves to control the register 58, and the flag signal SF3 serves to control the registers 36, 67, 68. The other registers are controlled by clock pulses CK. Signals generated in the mutual division unit are denoted by reference characters in FIG. 13. If it is assumed that the variables $dR_0$, $dQ_0$ and the polynomials $R_0(X) - \mu_0(X)$ supplied to the mutual division unit 25A shown in FIG. 9 are used as the variables $dR_{i-1}$, $dQ_{i-1}$ the polynomials $R_{i-1}(X) - \mu_{i-1}(X)$ (i.e., $Q_{i-1}(X) = Q_0(X) = X^4$), the signals in FIG. 13 vary as shown in FIG. 14 in synchronism with the clock pulses, whose frequency is about 20 MHz.

Figure 14A:
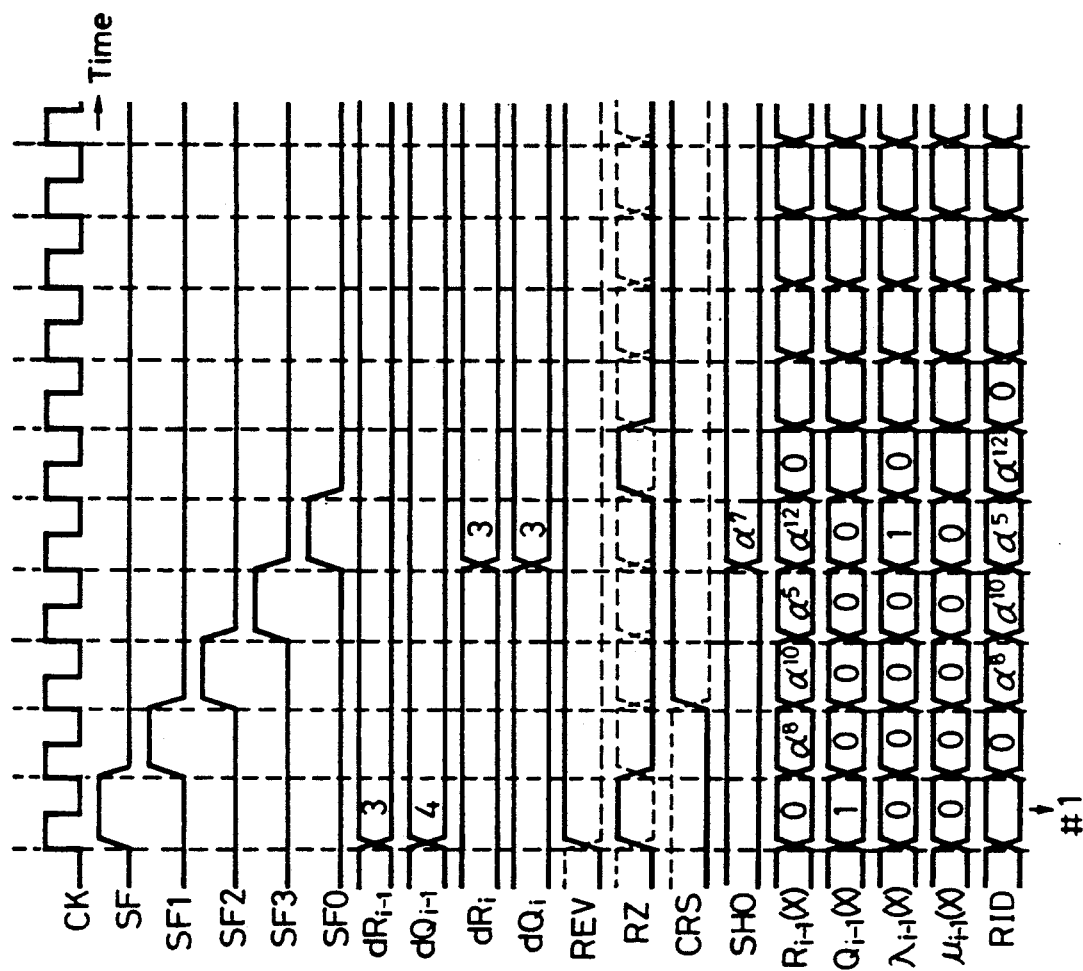
FIGS. 14A and 14B are timing charts illustrative of an operation sequence of the mutual division unit shown in FIG. 13.
Figure 14B:
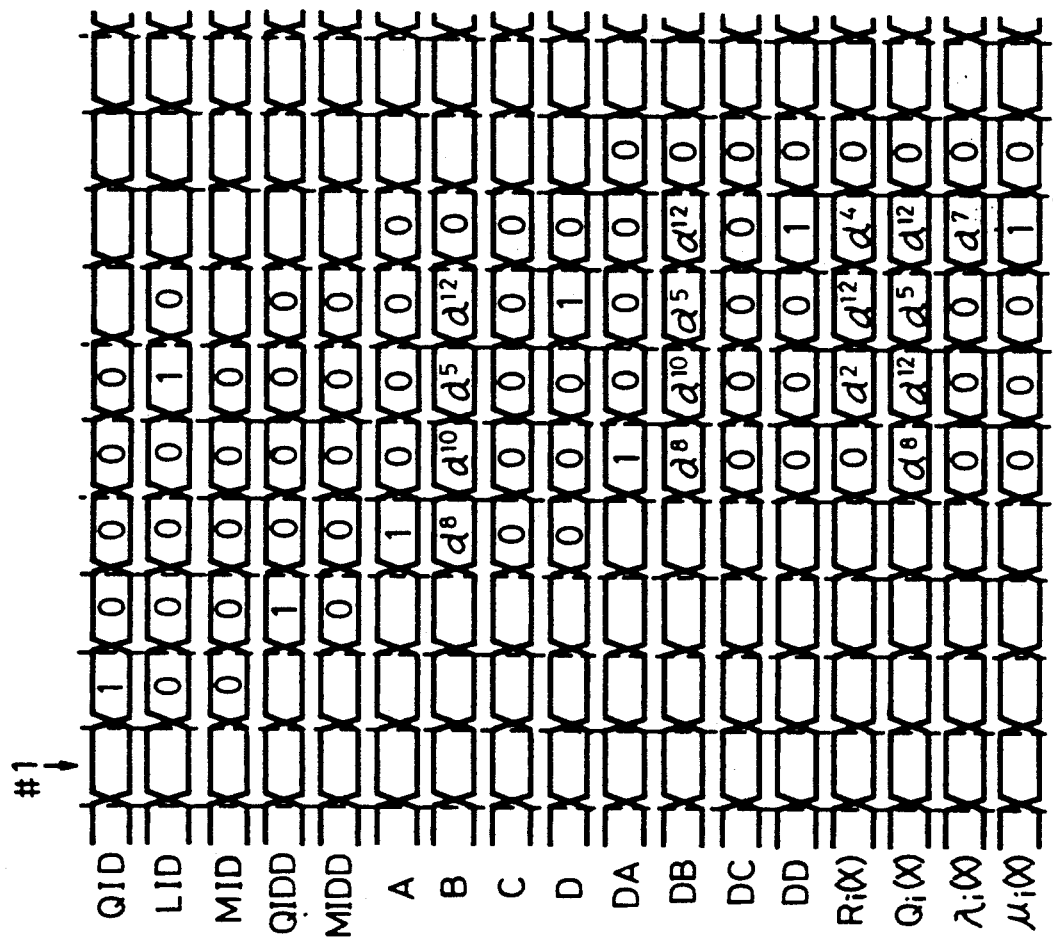

In FIG. 14, the coefficients of the polynomials $R_i(X) - \mu_i(X)$ are generated 4Tc after the coefficients of the polynomials $R_{i-1}(X) - \mu_{i-1}(X)$ Therefore, the delay time of the mutual division unit shown in FIG. 13 is 4Tc. The timing chart shown in FIG. 14 is based on the assumption that the division between the elements of a finite field by the divider 33 is finished within 1Tc, and the multiplication and addition between the elements of a finite field by the multiplier 37 and the adder 34 is finished within 1Tc.

A mutual division unit according to another embodiment of the present invention will be described with reference to FIGS. 15 through 18.

Figure 15:
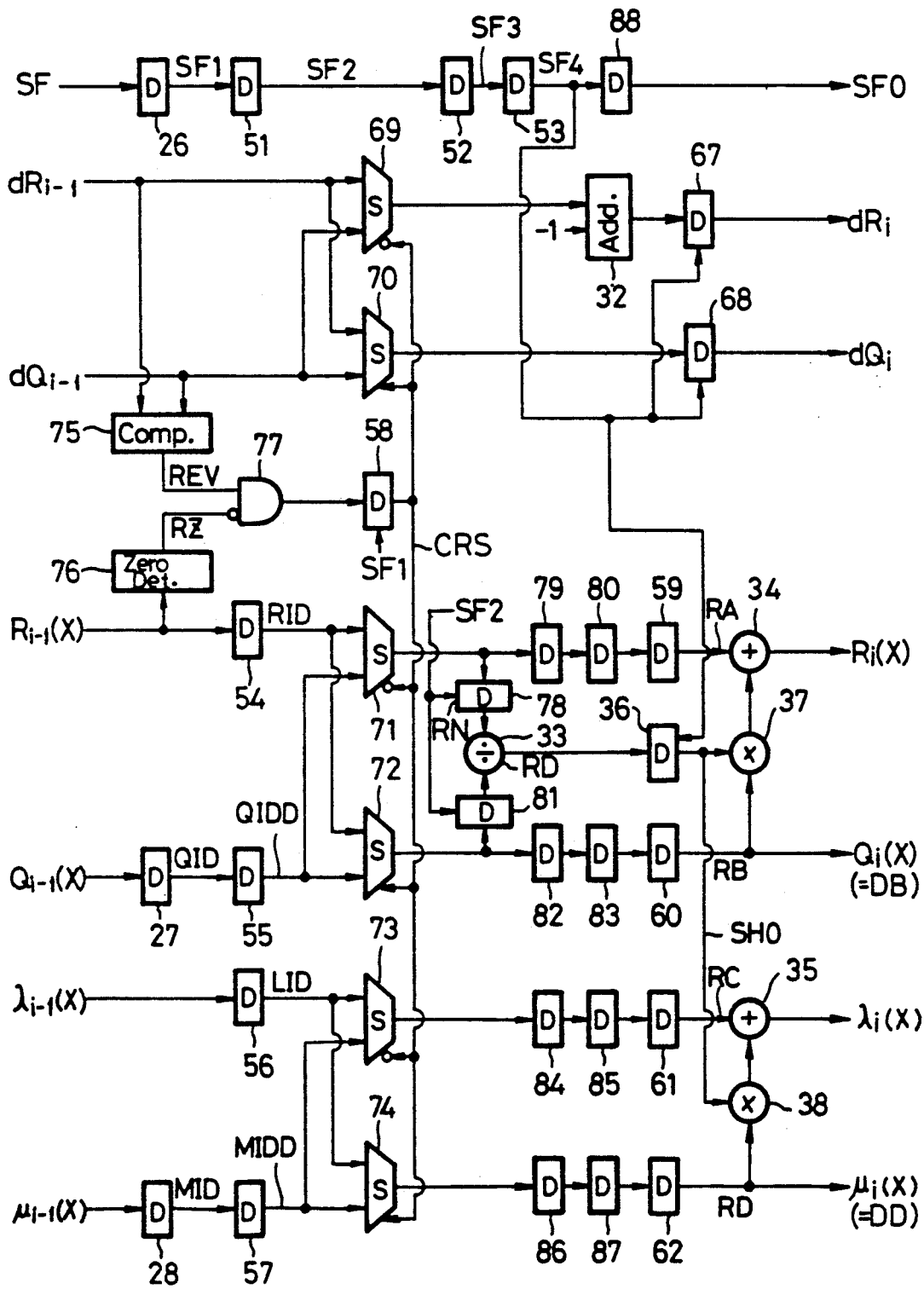
FIG. 15 is a block diagram of a mutual division unit according to another embodiment for use in the mutual division circuit shown in FIG. 11.

The mutual division unit shown in FIG. 15 is arranged to consume 2Tc in completing divisions between the elements of a finite field. Those parts and signals shown in FIG. 15 which correspond to those shown in FIG. 13 are denoted by identical reference characters, and will not be described in detail.

As shown in FIG. 15, a delay register 88 is connected to the output port of the register 53. The registers 36, 67, 68 are controlled by a flag signal SF4 produced from the register 53.

Figure 16A:
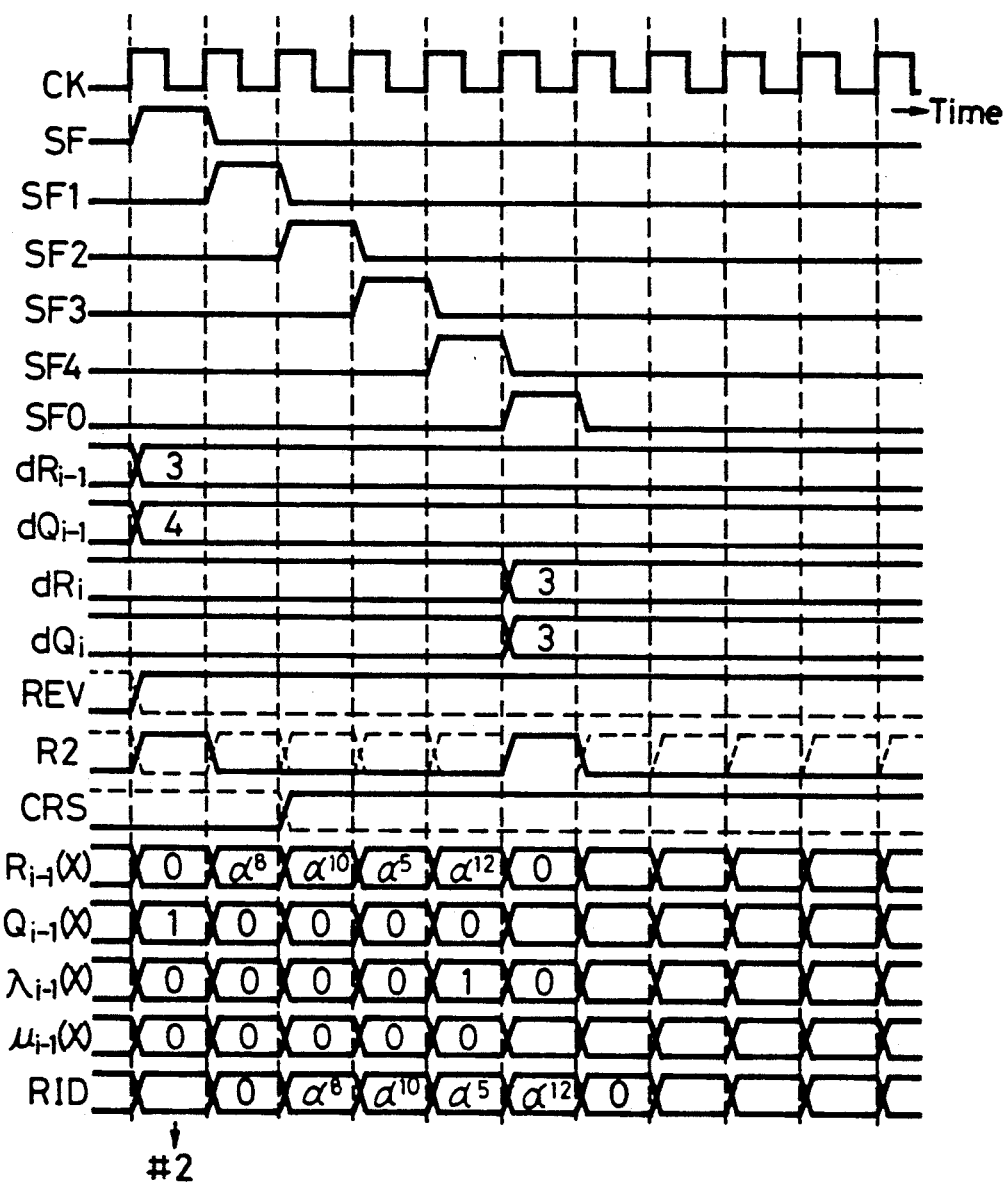
FIGS. 16A and 16B are timing charts illustrative of an operation sequence of the mutual division unit shown in FIG. 15.
Figure 16B:
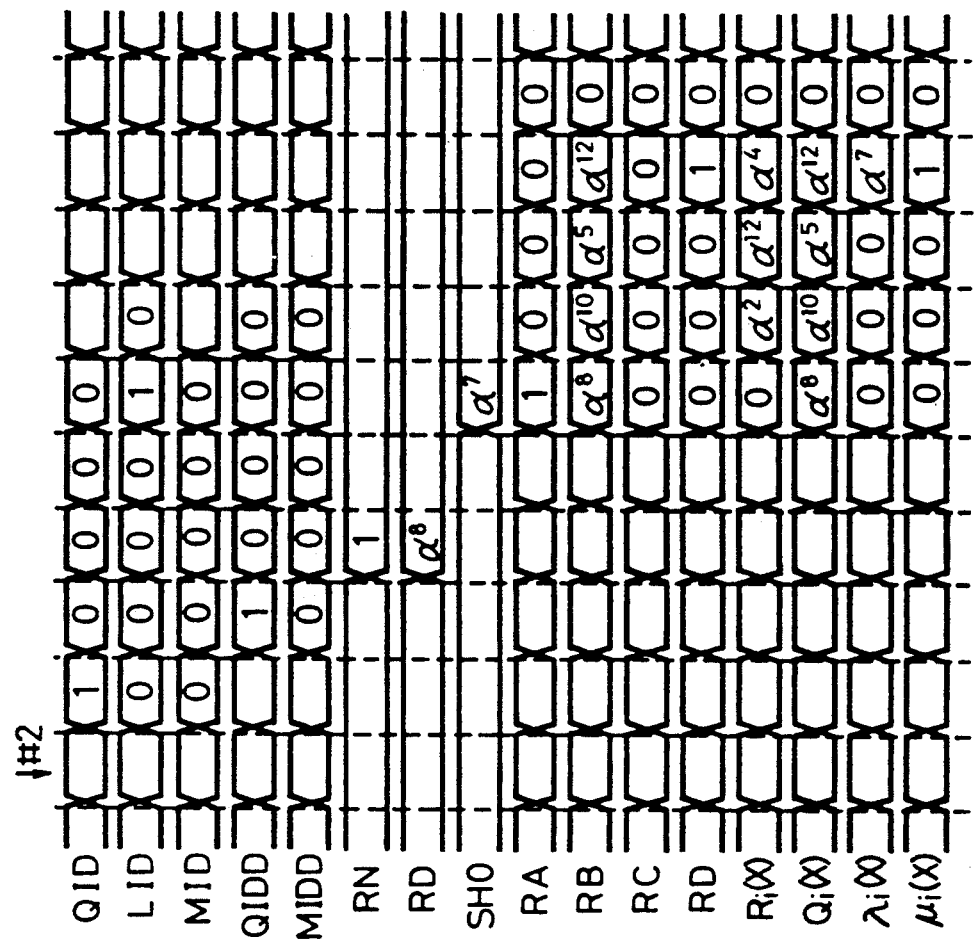

The output port of the data selector 71 is connected through a register 78 to the divider 33, and also connected through registers 79, 80, 59 to the adder 34. The output port of the data selector 72 is connected through a register 81 to the divider 33, and also connected through registers 82, 83, 60 to the multiplier 37. The registers 78, 81 are controlled by the flag signal SF2. Similarly, registers 84, 85, 61 are connected between the data selector 73 and the adder 35, and registers 86, 87, 62 are connected between the data selector 74 and the multiplier 38. FIG. 16 is a timing chart of an operation sequence of the mutual division unit shown in FIG. 15 under the same conditions as those of the mutual division unit shown in FIG. 13. According to the operation sequence shown in FIG. 16, the divisions require an additional 1Tc, and thus the overall delay time is 5Tc.

Figure 17:
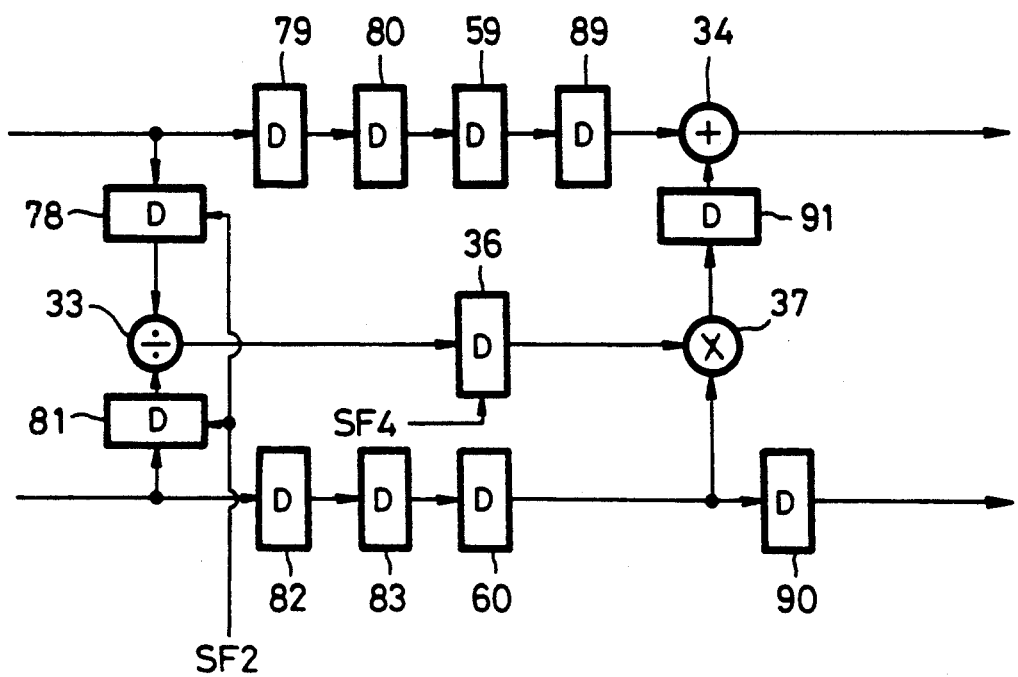
FIG. 17 is a block diagram of a portion of a modification of the mutual division unit shown in FIG. 15.

FIG. 17 shows a portion of a modification of the mutual division unit shown in FIG. 15. As shown in FIG. 17, pipeline registers 89, 90, 91 are connected between the register 59 and the adder 34, between the register 60 and the output port of the mutual division unit, and between the multiplier 37 and the adder 34, respectively. According to the modified mutual division unit shown in FIG. 17, after a quotient is determined in the register 36, a multiplication and an addition are reliably carried out in respective single clock cycles.

Figure 18:
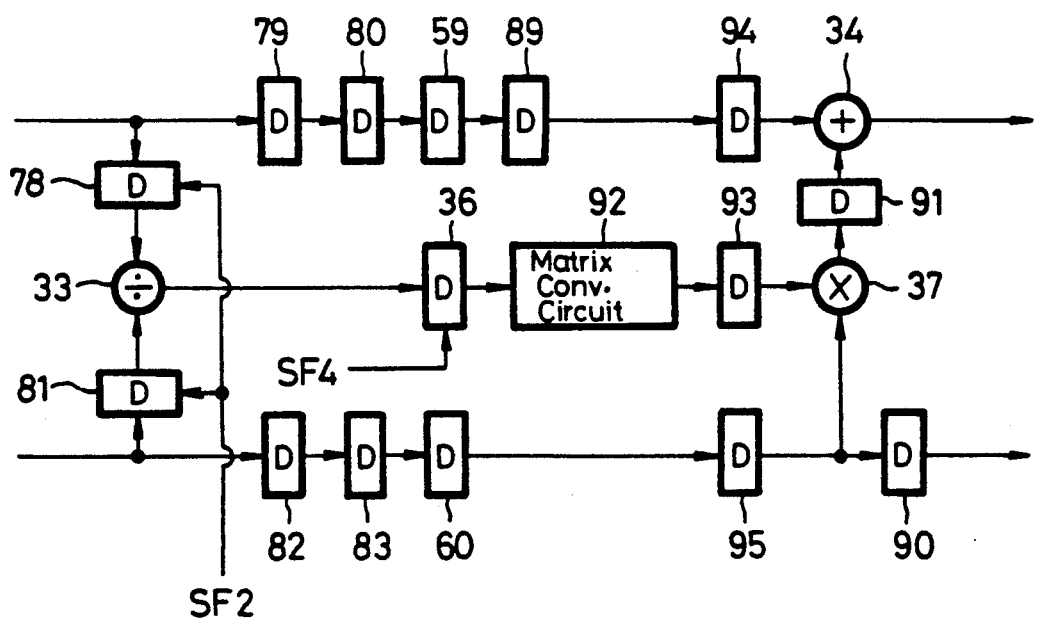
FIG. 18 is a block diagram of a portion of a modification of the mutual division unit shown in FIG. 17.

FIG. 18 shows a portion of a modification of the mutual division unit shown in FIG. 17. As illustrated in FIG. 18, a register 94 is connected between the register 89 and the adder 34, and a matrix conversion circuit 92 for converting the representation of the elements of a finite field from a vector representation into a matrix representation, and a register 93 are connected between the register 36 and the multiplier 37. Furthermore, a register 95 is connected between the registers 60, 90. The modified mutual division unit shown in FIG. 18 is designed to increase the speed of multiplication by incorporating the multiplication system using the matrix representation of a finite field and the pipeline system, as disclosed in Japanese Patent Laid-Open Gazette No. 60-144834.

While the divider 33 is employed in the above embodiment, the divider may be dispensed with, and the mutual division unit may be composed of an increased number of multipliers.

With the present invention, since the mutual division units are repeatedly used, the number of mutual division units employed is reduced, and hence the size of the mutual division circuit is also reduced.

The present invention is particularly useful when the code length n and the number t of error-correctable symbols meet the relationship n>>t, the number t being of a relatively large value.

A mutual division circuit according to another embodiment of the present invention will now be described with reference to FIGS. 19 and 20.

According to this embodiment, the principles of the invention are applied to an error locator polynomial deriving circuit (corresponding to the circuit 2 in FIG. 1) in a decoder for decoding the Reed-Solomon code. The error locator polynomial deriving circuit shown in FIG. 19 comprises 2t mutual division units each of the construction shown in FIG. 6, each mutual division unit having a data delay time corresponding to 4 clock pulses (4Tc). The algorith in each of the mutual division units shown in FIG. 19 is the same as the improved Euclidean division algorithm shown in FIG. 8.

Figure 19:
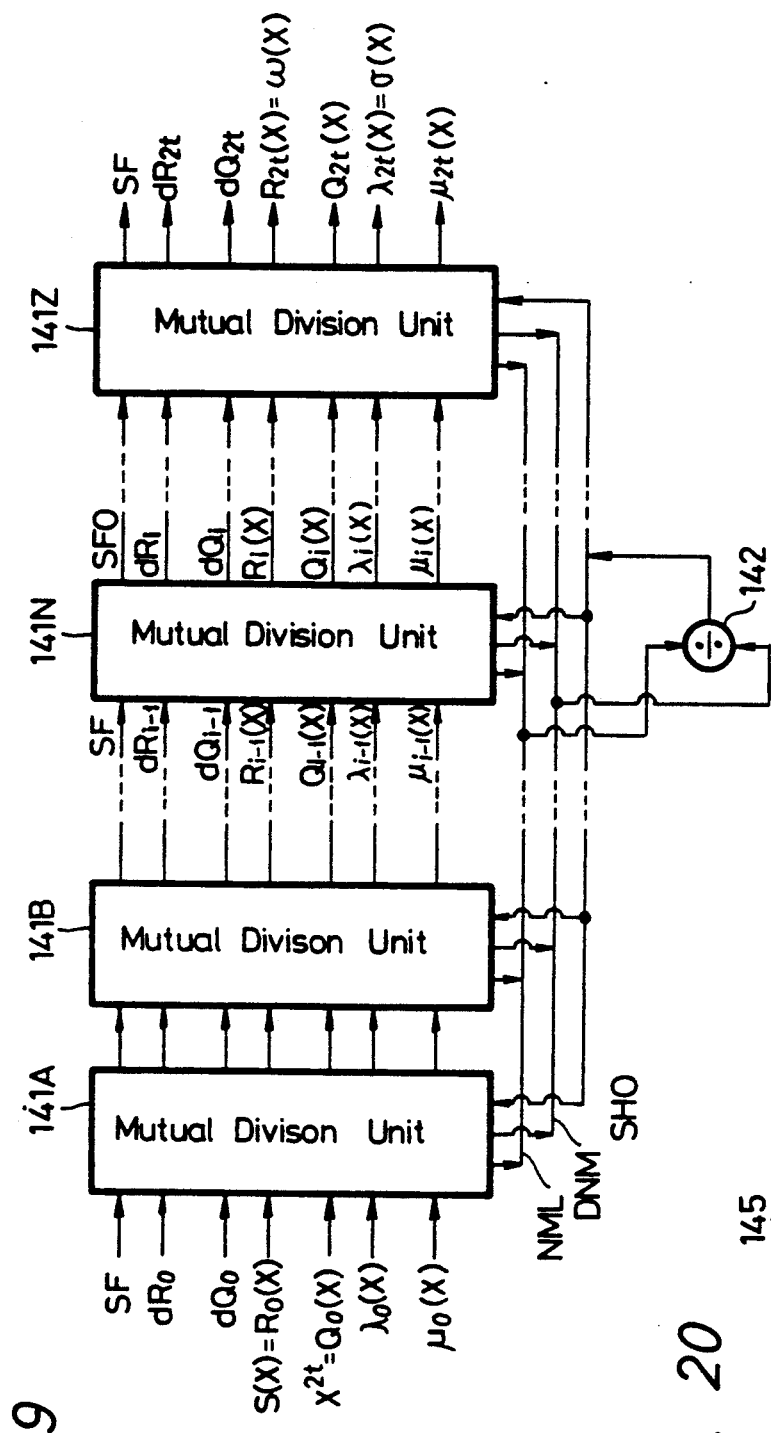
FIG. 19 is a block diagram of a mutual division circuit according to another embodiment of the present invention.

The error locator polynomial deriving circuit shown in FIG. 19 includes 2t mutual division units 141A through 141Z which are connected in cascade, each of the mutual division units 141A through 141Z being of a structure similar to the structure shown in FIG. 6, except that the divider 33 is dispensed with, and a divider 142 for carrying out divisions between the elements of a finite field $GF(2^m)$. From each of the mutual division units 141A through 141Z, there extend bus lines for outputting a dividend NML and a divisor DNM and a bus line for inputting a quotient SHO. The dividend NML and the divisor DNM are supplied respectively to dividend and divisor input ports of the divider 142, whose output port is connected to the bus lines which input the quotient to the mutual division units 141A through 141Z.

The first mutual division unit 141A is supplied with initial values $dR_0$, $dQ_0$, $R_0(X)$ ($=S(X)$), $Q_0(X)$ ($=X^{2t}$), $\lambda_0(X)$, $\mu_0(X)$ of variables $dR_{i-1}$, $dQ_{i-1}$, and polynomials $R_{i-1}(X)$, $Q_{i-1}(X)$, $\lambda_{i-1}(X)$, $\mu_{i-1}(X)$ The final mutual division unit 141Z produces an error locator polynomial $\sigma(X)$ ($=\lambda_{2t}(X)$) and an error evaluator polynomial $\omega(X)$ ($=R_{2t}(X)$).

Figure 20:
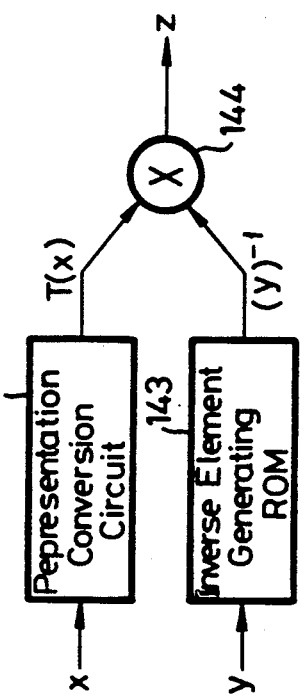
FIG. 20 is a block diagram of a divider for use in the mutual division circuit shown in FIG. 19.

FIG. 20 shows a specific circuit arrangement of the divider 142 shown in FIG. 19. The divider 142 includes an inverse element generating ROM 143, a multiplier 144 for multiplying a matrix by a vector, and a representation conversion circuit 145 for converting the representation of the elements of a finite field from a vector representation into a matrix representation. The elements of a dividend x in a vector expression are supplied to an input port of the representation conversion circuit 145, which outputs a matrix representation T(X) of the dividend x. The elements of the matrix representation are then supplied to a matrix element input port of the multiplier 144. The elements of a divisor y in a vector representation are supplied to an address bus of the inverse element generating ROM 143 which outputs the inverse element $y^{-1}$, in a vector representation, of the divisor y over its data bus. The elements of the inverse element $y^{-1}$ in the vector representation are supplied to a vector element input port of the multiplier 144. The matrix representation of the elements of a finite field is disclosed in Japanese Patent Laid-Open Gazette No. 60-144834.

According to the circuit arrangement shown in FIG. 20, in order to calculate the quotient x/y resulting from the division of the dividend x by the divisor y, the inverse element $y^{-1}$ of the divisor y is first determined, and the dividend x is multiplied by the inverse element $y^{-1}$. Since the inverse element generating ROM 143 and the representation conversion circuit 145 operate parallel to each other, the time required by the division is greatly reduced.

Since each of the elements of the finite field $GF(2^m)$, except for 0, is represented by a power of a root $\alpha$, if the dividend x and the divisor y are $\alpha^i$ and $\alpha^j$, respectively, the quotient z can easily be determined as $\alpha^{i-j}$. The divider 142 may comprise a ROM table for determining the exponents i and j of the powers of the dividend x and the divisor y, a subtractor for calculating the exponent $i-j$, and a ROM table for determining a vector representation $\alpha^{i-j}$ from the exponent $i-j$.

The mutual division circuit shown in FIG. 19 operates as follows: The first mutual division unit 141A is supplied with the initial data indicated in the step 115 shown in FIG. 8. The start flag signal SF is set to a high-level "1" in synchronism with the coefficients of the greatest-power terms of the polynomials in those initial data. The mutual division units 141A through 141Z recognize that they are supplied with the coefficients of the greatest-power terms of the polynomials when the start flag signal SF is set to a high-level "1". The data processed by the first mutual division unit 141A are supplied to the next mutual division unit 141B. When the start flag signal SF supplied to the mutual division unit 141B is set to a high-level "1", then the mutual division unit 141B starts to carry out the operation shown in FIG. 8. Similarly, as the star flag signal SF supplied successively to the following mutual division units is successively set to a high-level "1", these mutual division units successively start to effect the operation shown in FIG. 8. Finally, the last mutual division unit 141Z produces an error locator polynomial $\sigma(X)$ and an error evaluator polynomial $\omega(X)$.

The start flag signal of high level "1" serially reaches the mutual division units 141A through 141Z successively, and divisions are carried out in the mutual division units 141A through 141Z in periods corresponding to given clock pulses a predetermined period of time after the start flag signal SF is set to high-level "1". Therefore, the divisions in the mutual division units 141A through 141Z are not effected at the same time. Rather, the divisions are carried out by the single divider 142 successively serially for the 2t mutual division units 141A through 141Z. Since only one divider 142 is employed, the overall circuit arrangement of the mutual division circuit is small in size even if the number t is large.

The timing of divisions in the mutual division units 25A through 25D shown in FIG. 9 will be analyzed in detail below. In the divider 33A in the mutual division unit 25A, for example, the coefficient $b_0(=1)$ of the greatest-power term of $Q_0(X)$ is divided by the coefficient $a_0(=\alpha^8)$ of the greatest-power term of $R_0(X)$, and the produced quotient $\alpha^7$ is held by the register 36A. Therefore, since the divider 33A only carries out the division between the coefficients of the greatest-power terms of the polynomials $R_0(X)$ and $Q_0(X)$, the time required for the division may range from 1Tc (one clock pulse) to 2Tc. The quotient produced by the division in the divider 33A is held in the register 36A until the coefficients of all the other terms of $R_0(X)$, $Q_0(X)$ Thus, the divider 33A idles after the division in the period ranging from 1Tc to 2Tc is finished. The dividers 33B through 33D in the other mutual division units 25B through 25D also idle while the divisions for the respective mutual division units are not being executed. In view of the above considerations, the dividers 33A through 33D are put together into a single divider according to the arrangement shown in FIG. 19.

On the other hand, the multiplier 23A in the mutual division unit 11A, for example, shown in FIG. 5 is required to multiply the quotient $\alpha^7$ by a new coefficient at all times, and its idling time is short. Therefore, it would be difficult to combine the multipliers 23A through 23D in the mutual division units 11A through 11D into a single multiplier.

Figure 21:
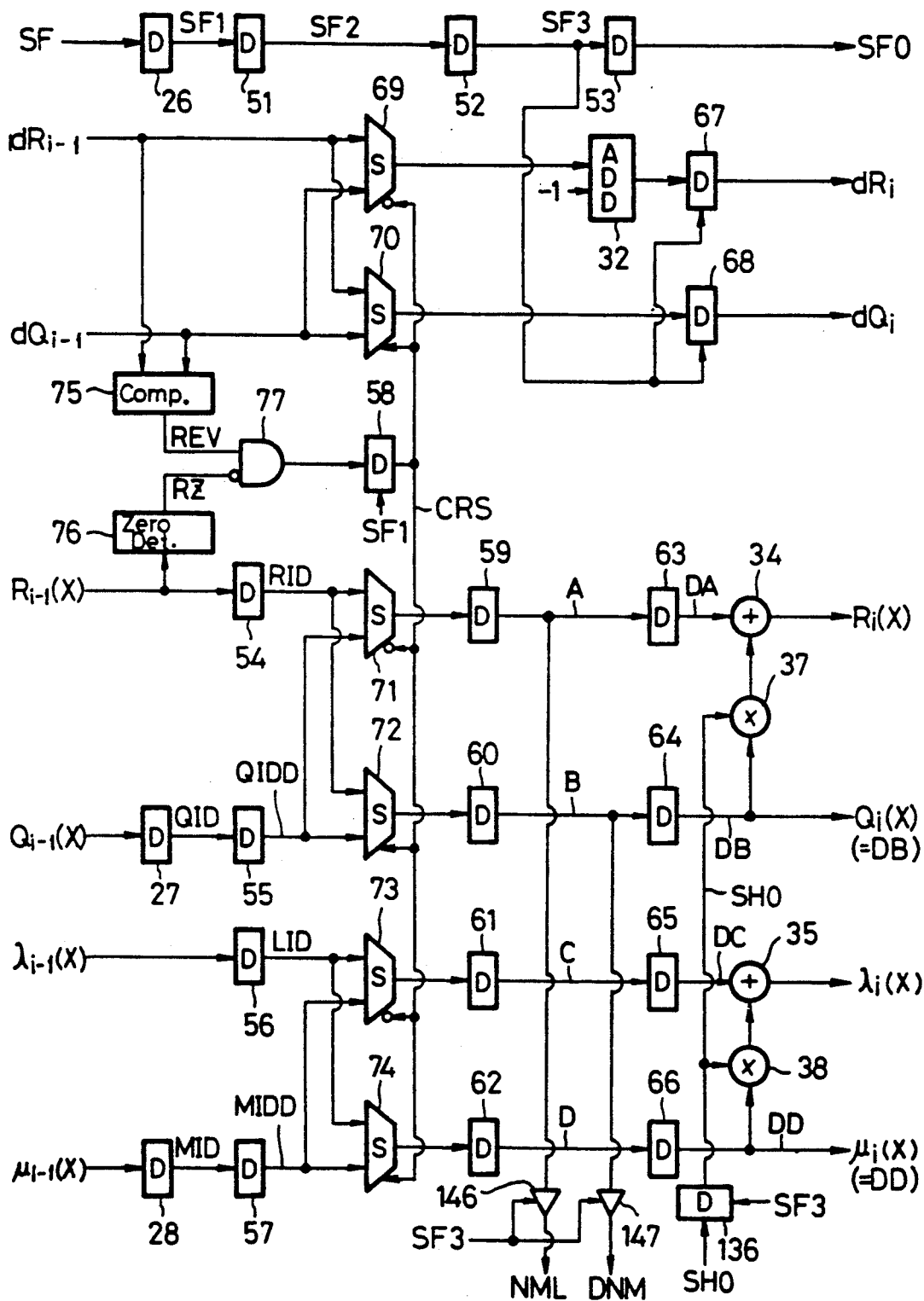
FIG. 21 is a block diagram of a mutual division unit according to an embodiment for use in the mutual division circuit shown in FIG. 19.
Figure 22A:
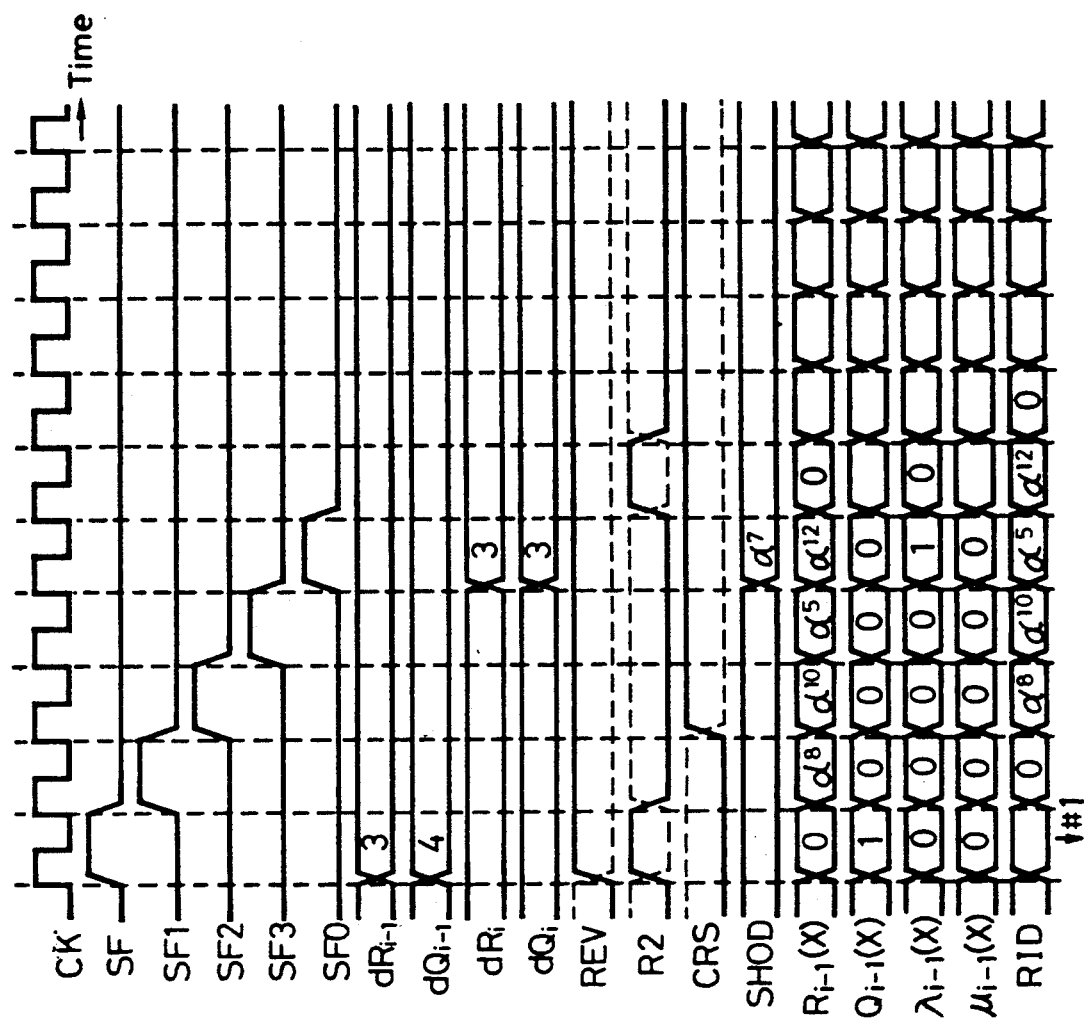
FIGS. 22A and 22B are timing charts illustrative of an operation sequence of the mutual division unit shown in FIG. 21.
Figure 22B:
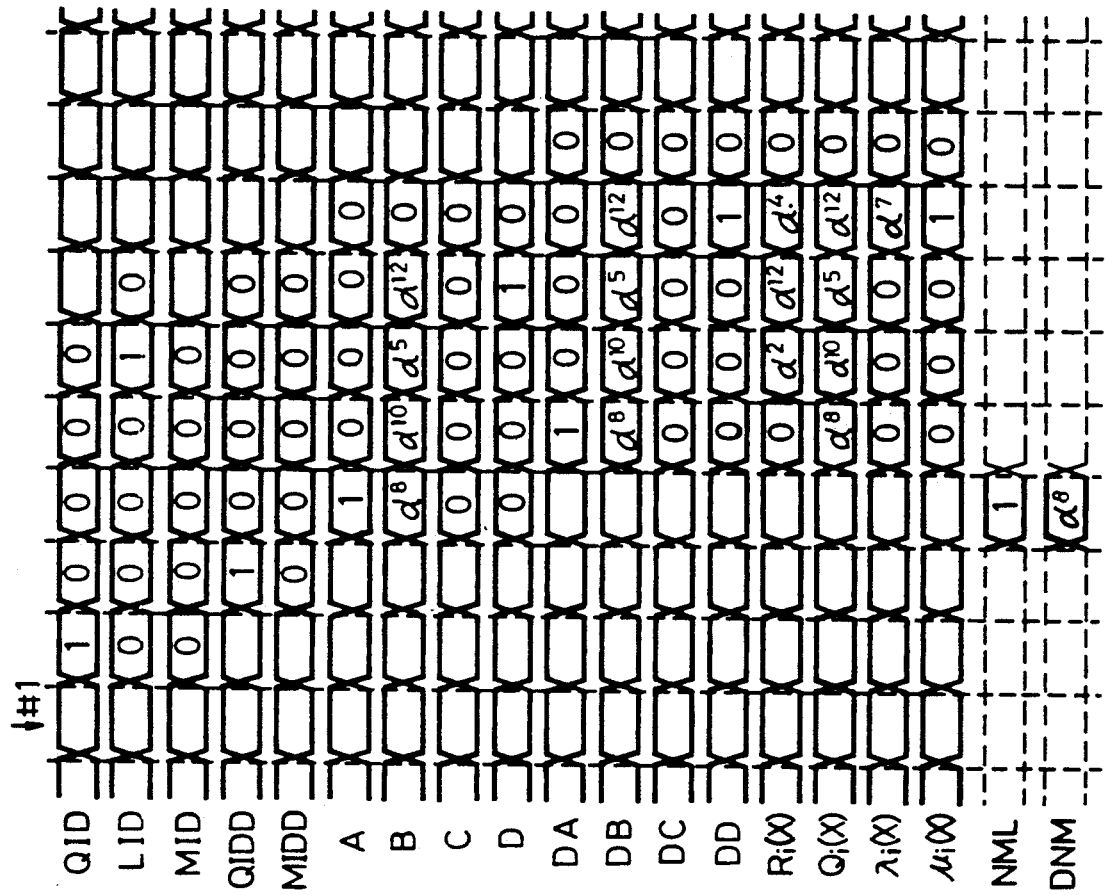

A specific circuit arrangement of a mutual division unit for use in the mutual division circuit shown in FIG. 19 is shown in FIG. 21. An operation sequence of the mutual division unit shown in FIG. 21 is illustrated in FIG. 22.

In FIG. 19, each of the mutual division units 141A through 141Z has a data delay time corresponding to 4 clock pulses (4Tc). FIG. 21 shows a specific synchronous arrangement of such a mutual division unit whose delay time is 4Tc. Those parts and signals in FIG. 21 which correspond to those shown in FIG. 6 are denoted by identical reference characters, and will not be described in detail.

As shown in FIG. 21, the mutual division unit includes delay registers 51 through 68 comprising D-type flip-flops, respectively, and data selectors 69 through 74 each having two input ports. The paired data selectors 69, 70, the paired data selectors 71, 72, and the paired data selectors 73, 74 correspond respectively to the switch circuits 29, 30, 31 shown in FIG. 6. The mutual division unit also includes a comparator 75 which produces a comparison signal REV that is of a low level "0" when $dR_{i-1}DQ_i \geq 0$ and of a high level "1" when $dR_i=dQ_i<0$. The comparison signal REV from the comparator 75 is supplied to one input terminal of an AND gate 77. A zero detector 76 produces a zero-detected signal RZ which is of high level "1" only when the coefficients of the polynomial $R_{i-1}(X)$ are 0. The zerodetected signal RZ is supplied to the other negative-logic input terminal of the AND gate 77. An output signal from the AND gate 77 is held by the register 58, whose output signal CRS is used to control switching of the data selectors 69 through 74.

The register 54 is connected to one input terminal of the data selector 71, whose output terminal is connected to the registers 59, 63. Likewise, the registers 55, 56, 57 are connected respectively to input terminals of the data selectors 72, 73, 74, whose output terminals are connected to the registers 60, 64, the registers 61, 65, and the registers 62, 66, respectively. Output data A from the register 59 are extracted as a dividend NML through a buffer 146, whereas output data from the register 60 connected to the output terminal of the data selector 72 are extracted as a divisor DNM through a buffer 147. The buffers 146, 147 provide a high impedance at their output terminals when they are not strobed. A start flag signal SF is converted into flag signals SF1, SF2, SF3, SF0 respectively by the registers 26, 51, 52, 53. The flag signal SF1 serves to control the register 58, and the flag signal SF3 serves to control the registers 136, 67, 68. The other registers are controlled by clock pulses CK. Signals generated in the mutual division unit are denoted by reference characters in FIG. 21. If it is assumed that the variables $dR_0$, $dQ_0$ and the polynomials $R_0(X) \sim \mu_0(X)$ supplied to the mutual division unit 25A shown in FIG. 9 are used as the variables $dR_{i-1}$, $dQ_{i-1}$ and the polynomials $R_{i-1}(X) \sim \mu_{i-1}(X)$ (i.e., $Q_{i-1}(X)=Q_0(X)=X^4$), the signals in FIG. 21 vary as shown in FIG. 22 in synchronism with the clock pulses, whose frequency is about 20 MHz.

In FIG. 22, the coefficients of the polynomials $R_i(X) \sim \mu_i(X)$ are generated 4Tc after the coefficients of the polynomials $R_{i-1}(X) \sim \mu_{i-1}(X)$. Therefore, the delay time of the mutual division unit shown in FIG. 21 is 4Tc. The timing chart shown in FIG. 22 is based on the assumption that the division between the elements of a finite field by the divider 142 is finished within 1Tc, and the multiplication and addition between the elements of a finite field by the multiplier 37 and the adder 34 is finished within 1Tc.

A mutual division unit according to another embodiment of the present invention will be described with reference to FIGS. 23 and 24.

Figure 23:
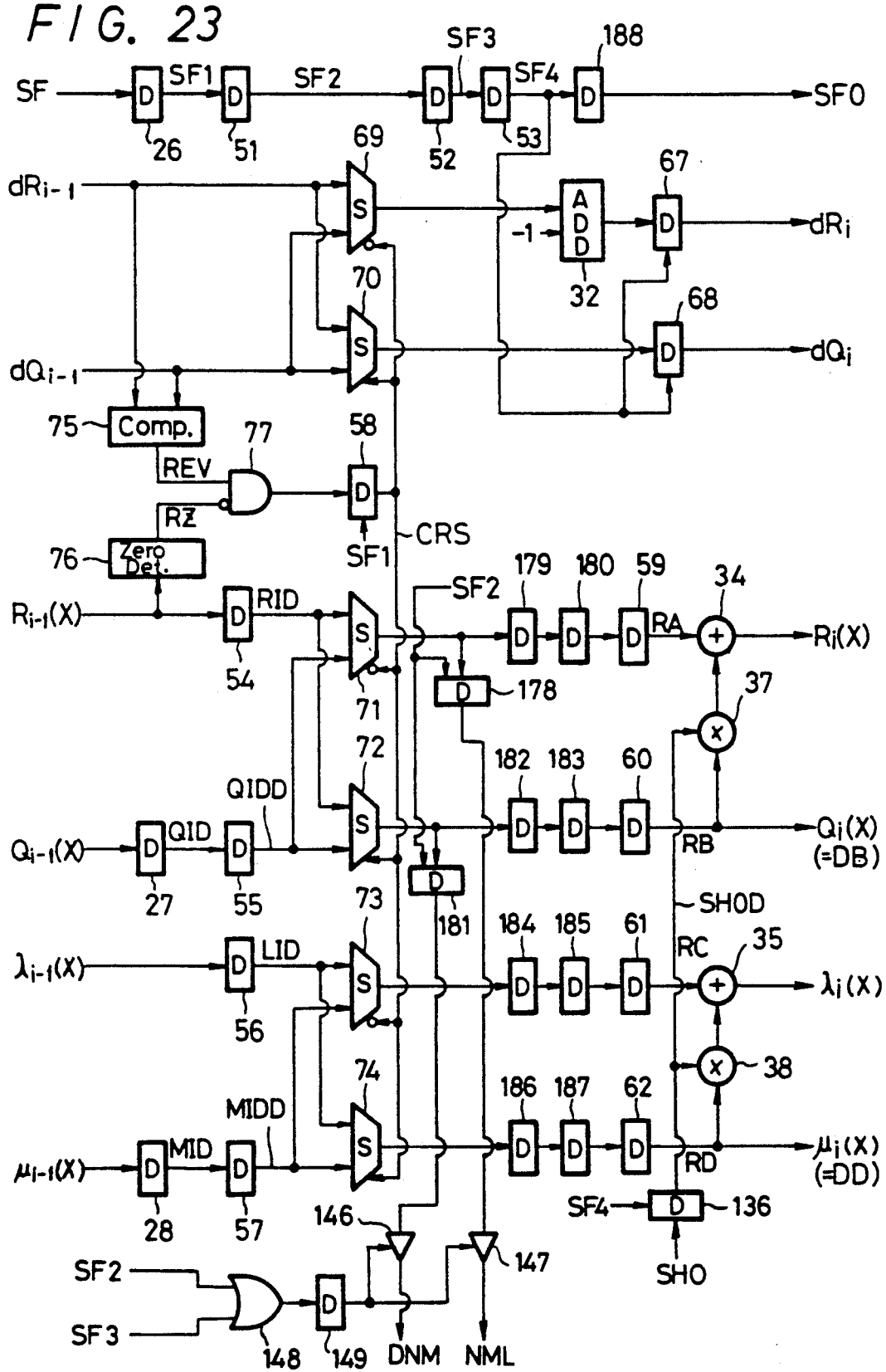
FIG. 23 is a block diagram of a mutual division unit according to another embodiment for use in the mutual division circuit shown in FIG. 19.
Figure 24A:
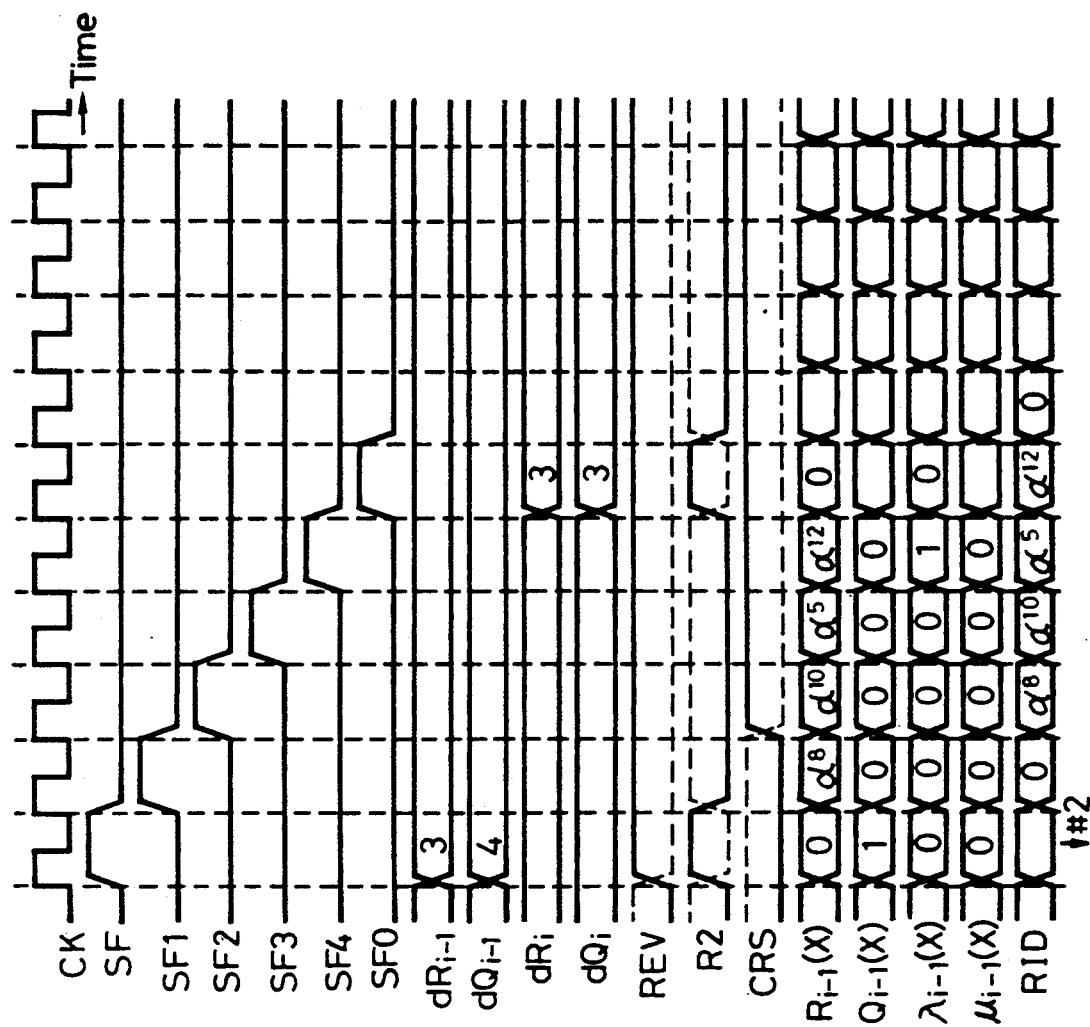

The mutual division unit shown in FIG. 23 is arranged to consume 2Tc in completing divisions between the elements of a finite field. Those parts and signals shown in FIG. 23 which correspond to those shown in FIG. 21 are denoted by identical reference characters, and will not be described in detail.

As shown in FIG. 23, a delay register 188 is connected to the output port of the register 53. The registers 136, 67, 68 are controlled by a flag signal SF4 produced from the register 53.

The output port of the data selector 71 is connected through a register 178 to the buffer 147, and also connected through registers 179, 180, 59 to the adder 34. The output port of the data selector 72 is connected through a register 181 to the buffer 146, and also connected through registers 182, 183, 60 to the multiplier 37. The registers 178, 181 are controlled by the flag signal SF2. The buffers 146, 147 are controlled by the flag signals SF2, SF3 through an OR gate 148 having two input terminals and a register 149. Similarly, registers 184, 185, 61 are connected between the data selector 73 and the adder 35, and registers 186, 187, 62 are connected between the data selector 74 and the multiplier 38. FIG. 24 is a timing chart of an operation sequence of the mutual division unit shown in FIG. 23 under the same conditions as those of the mutual division unit shown in FIG. 21. According to the operation sequence shown in FIG. 24, the divisions require an additional 1Tc, and thus the overall delay time is 5Tc.

A mutual division circuit according to still another embodiment of the present invention will now be described with reference to FIGS. 25 and 26.

According to this embodiment, the principles of the invention are applied to an error locator polynomial deriving circuit (corresponding to the circuit 2 in FIG. 1) in a decoder for decoding the Reed-Solomon code, with the code length n being 150 and the number t of error-correctable symbols being 16. The error locator polynomial deriving circuit shown in FIG. 25 comprises eight mutual division units each of the construction shown in FIG. 21, each mutual division unit having a data delay time corresponding to 4 clock pulses (4Tc). The algorithm used in each of the mutual division units shown in FIG. 25 is the same as the improved Euclidean division algorithm shown in FIG. 8.

Figure 25:
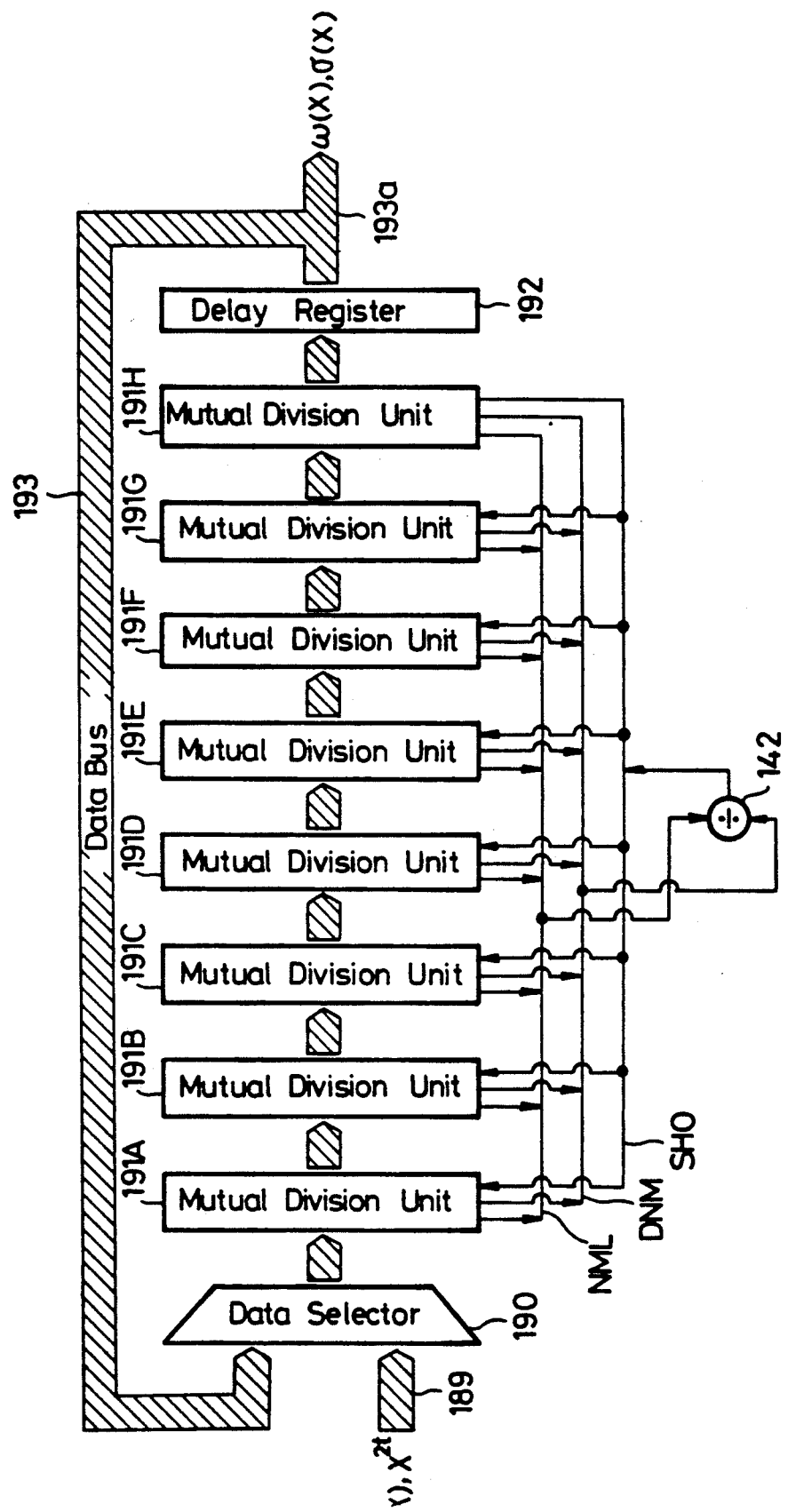
FIG. 25 is a block diagram of a mutual division circuit according to still another embodiment of the present invention.

The error locator polynomial deriving circuit shown in FIG. 25 includes a data bus 189, a data selector 190, eight mutual division units 191A through 191H, a delay register 192, and a data bus 193. The coefficients of the syndrome polynomial $S(X)$ and the polynomial $X^{2t}$ are supplied through the data bus 189 to one input port of the data selector 190. Each of the mutual division units 191A through 191H is structurally identical to the mutual division unit shown in FIG. 21, as described above. The delay register 192 delays data by a delay time corresponding to one clock pulse (1Tc). The mutual division units 191A through 191H are connected in cascade between the output port of the data selector 190 and the input port of the delay register 192. The data bus 193 connects the output port of the delay register 192 to the other input port of the data selector 190. The data bus 193 has a branch output bus 193a for delivering the coefficients of an error locator polynomial $\sigma(X)$ and an error evaluator polynomial $\omega(X)$, which are finally produced, to a subsequent circuit (not shown). The error locator polynomial deriving circuit shown in FIG. 25 also includes a single divider 142 which is shared by the mutual division units 191A through 191H, as with the arrangement shown in FIG. 19.

Operation of the mutual division circuit shown in FIG. 25 will be described below with reference to FIG. 26. In the mutual division circuit shown in FIG. 25, 150 received code words I, II, III, ... whose code length n is 50 are transmitted each in a period 150Tc, as shown in FIG. 26 at A. Since the number t of error-correctable symbols is 16, the degree of the syndrome polynomial $S(X)$ is 31 ($=2t-1$), and 33 ($=2t+1$) sets of coefficients of the syndrome polynomial $S(X)$ and the polynomial $X^{2t}$ are supplied as initial values. The polynomials $\lambda_0(X)$, $\mu_0(X)$ and the variables $dR_0$, $dQ_0$ in step 115 shown in FIG. 8 are also supplied together with the 33 sets of coefficients. Consequently, the period of 33Tc is required until all the coefficients of $S(X)$, $X^{2t}$, as initial values, and the variables are supplied. In this embodiment, the respective delay times in the mutual division units 191A through 191H are 4Tc, and the delay time in the delay register 192 is 1Tc. Therefore, the total delay time from the mutual division unit 191A to the delay register 192 is 33 ($=4\times8+1$) Tc, and is equalized to the time which is required until all the coefficients and variables are supplied.

Figure 26:
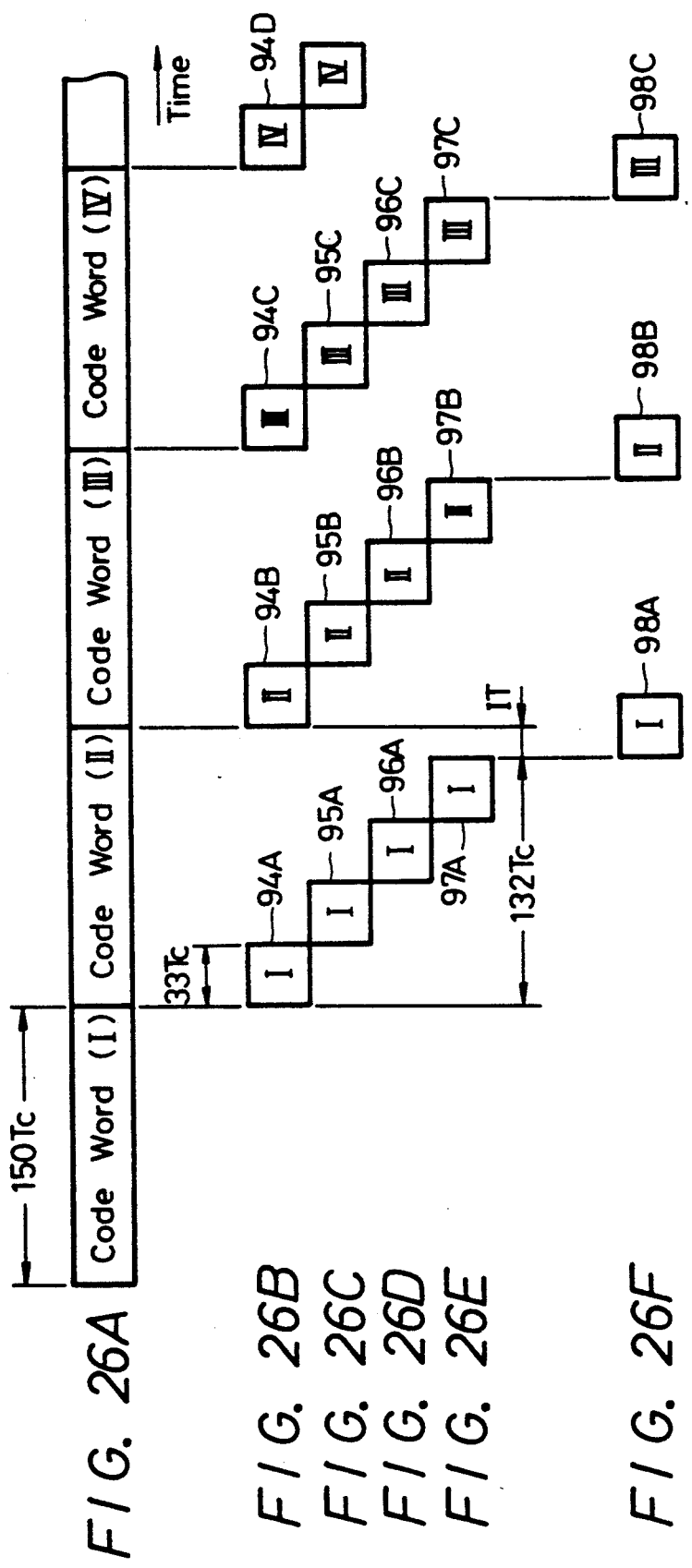
FIGS. 26A, 26B, 26C, 26D, 26E and 26F are timing charts illustrative of an operation sequence of the mutual division circuit shown in FIG. 25.

As shown in FIG. 26 at B, in periods 94A, 94B, 94C, ... each of 33Tc after the respective code words I, II, III, ... are received, the 33 sets of initial data which are composed of the coefficients of $S(X)$, $X^{2t}$ are supplied to the first mutual division unit 191A by the data selector 190. From the mutual division unit 191A, there are stored intermediate processed data of the 33 sets of data into the delay register 192.

Then, the data selector 190 is switched over to supply the data from the delay register 192 to the first mutual division unit 191A. Then, as shown in FIG. 26 at C, D, and E, in each of periods 96A, 96A, and 97A each of 33Tc following the period 94A, the 33 sets of intermediate processed data held between the mutual division unit 191A and the delay register 192 are processed while being shifted once through a loop which comprises the mutual division units 191A through 191H, the delay register 192, the data bus 193, and the data selector 190. Thereafter, as shown in FIG. 26 at F, in a period 98A of 33Tc following the period 97A, the coefficients of an error locator polynomial $\sigma(X)$ and an error evaluator polynomial $\omega(X)$ are delivered from the output port of the delay register 192 through the branch bus 193A of the data bus 193. Similarly, the intermediate processed data circulate through the loop in each of periods 94B, 94C, ....

With the embodiment shown in FIGS. 25 and 26, the initial 33 sets of data supplied through the data bus 189 circulate four times through the loop. Since the loop includes the eight mutual division units 191A through 191H, the initial 33 sets of data are passed through a total of 32 mutual division units, so that the coefficients of the error locator polynomial can be determined with accuracy. Although the 32 mutual division units were required in the conventional circuit, the mutual division circuit according to this embodiment only requires eight mutual division units 191A through 191H, the number of which is a quarter of the number of the mutual division units in the conventional circuit. The mutual division circuit according to this embodiment may therefore be much smaller in size.

Furthermore, as shown in FIG. 26, the coefficients of the error locator polynomial $\sigma(X)$ are produced with the delay time of 132 ($=33\times4$) Tc after the code words I, II, III, ... are received. This delay time is substantially equal to the delay time 128Tc of the conventional arrangement shown in FIG. 10. Thus, the delay time of the mutual division circuit according to this embodiment remains almost unchanged even with the size of the circuit being reduced to ¼ of that of the conventional circuit. As shown in FIG. 26, the idle time IT in this embodiment is a time which is left by subtracting 132Tc from 150Tc, and is much shorter than the idle time shown in FIG. 10.

Generalization of the mutual division circuit shown in FIG. 19, and hence the number of mutual division units required when the code length is n and the number of error-correctable symbols is t will be considered below. Since are (2t +1) sets of coefficients of the syndrome polynomial S(X) and the polynomial $X^{2t}$, the maximum number $R_M$ by which a series of mutual division units can repeatedly be used is given by:

$$RM = int(n/(2t+1)) \tag{32}$$

except when parallel processing is carried out, where int(A) represents an integer not exceeding A. If a series of mutual division units are repeatedly used R times, the number G of those mutual division units is given by:

$$G = int((2t-1)/R) + 1 \tag{33}$$

The upper limit $T_U$ of the time $T_{CK}$ of a clock pulse unit required to process data once in the series of mutual division units (upon one circulation therethrough) is given by:

$$T_U = int((n-1)/R) + 1 \tag{34}$$

As initial coefficients must be supplied in (2t+1) sets, the lower limit $T_D$ for the time $T_{CK}$ is given by:

$$T_D = 2t + 1 \tag{35}$$

Therefore, from the equation (33), if the number R of times by which the mutual division units are repeated used is increased, the number G of mutual division units used in series may be reduced to 1 at minimum. A delay register should be employed in this case in order to keep the delay time TCK in the range of $T_D \leq T_{CK} \leq T_u$.

If n=150 and t=16 as with the embodiment shown in FIG. 25, then R=int(150/33)=4, G=int(31/4)+1=8, $T_U$=int(149/4)+1=38, TD=33. Therefore, the above conditions are satisfied.

The divider 142 shown in FIG. 25 effects respective divisions for the mutual division units 191A through 191H successively in the periods 94A through 94D shown in FIG. 26, and then effects respective divisions for the mutual division units 191A through 191H successively in the following periods 95A through 95H. Therefore, even with the mutual division units 191A through 191H being repeatedly used as shown in FIG. 25, the timings at which the divider 142 is used by the mutual division units 191A through 191H for their divisions do not interfere with each other.

Even if the divider is used by the mutual division units at overlapping or interfering timings, the timings can easily be adjusted out of mutual interference by adjusting the delay time in the delay register 192. The timings at which the divider is used by the mutual division units may be brought into mutual interference when different syndrome polynomials S(X) are successively processed. To avoid such a timing interference, a delay register for adjusting the delay time may be connected between the mutual division units.

With the embodiment shown in FIGS. 25 and 26, since only the single divider is employed for carrying out divisions for the mutual division units, the overall circuit arrangement is relatively small in size even if the number of mutual division units used is increased.

Error-correcting codes such as the Reed-Solomon code, the concatenated code, etc. are used in practice when digital audio and video signals are recorded and reproduced. Encoders for encoding these error-correcting codes generate parity data (redundant data). Decoders for decoding the error-correcting codes generate a syndrome from a received signal which contains parity data, and correct errors using the syndrome. Each of a parity generator, a syndrome generator, and an error-correcting circuit comprises an arithmetic circuit for a finite field (Galois field) $GF(p^m)$ of order $p^m$. The finite field $GF(p^m)$ is a field having $p^m$ elements derived from an irreducible polynomial P(X) of degree m. In error-correcting codes, only a finite field with p=2 is of importance. The principles of the present invention are applied to a finite field with p=2, i.e., a finite field $GF(2^m)$.

Arithmetic circuits over the finite field $GF(2^m)$ include an addition circuit (which is of the same construction as a subtraction circuit over $GF(2^m)$, a multiplication circuit, and a division circuit. The addition circuit can simply be composed of exclusive-OR gates. However, the multiplication and division circuits are complex in construction.

One known multiplication circuit employs a ROM as a conversion table. If it is assumed that a root of the irreducible polynomial of the finite field $GF(2^m)$ is represented by $\alpha$ when the irreducible polynomial is 0, the elements of this finite field, except for 0, are expressed by powers of $\alpha$. To calculate the product $(\alpha^i \cdot \alpha^j)$ between $\alpha^i$ and $\alpha^j$, $\alpha^i$ is inputted to the ROM to obtain an exponent i, and $\alpha^j$ is inputted to the ROM to obtain an exponent j, and thereafter the exponent (i+j) is produced by an addition circuit, and the exponent (i +j) is inputted to the ROM, which then outputs $\alpha^{i+j}$. Another multiplication circuit, as proposed Japanese Patent Laid-Open Gazette No. 60-144834, employs a matrix expression of each of the elements of a finite field, thus omitting any ROM.

In actual error-correcting circuits, it may be necessary to execute a plurality of multiplications at the same time, with respective values, i.e., multiplicators or multiplicands, in the multiplications being the same. A multiplication circuit for effecting such multiplications includes a plurality of identical multipliers arranged parallel to each other.

Each of the multipliers is relatively large in size. Therefore, the multiplication circuit with the parallel-connected multipliers is considerably large in size, and cannot be incorporated in various products which are required to be reduced in size. The large-size multiplication circuit is also expensive to manufacture.

In view of the above drawbacks, the present invention provides a multiplication circuit of small size for multiplying different numbers (multiplicands) over the finite field $GF(2^m)$ by the same number (multiplicator) over the finite field $GF(2^m)$ at the same time and in parallel relationship.

One known division circuit employs a ROM as a conversion table. If it is assumed that a root of the irreducible polynomial of the finite field $GF(2^m)$ is represented by $\alpha$ when the irreducible polynomial is 0, the elements of this finite field, except for 0, are expressed by powers of $\alpha$. To calculate the quotient $(\alpha^i/\alpha^j)$ between $\alpha^i$ and $\alpha^j$, $\alpha^i$ is inputted to the ROM to obtain an exponent i, and $\alpha^j$ is inputted to the ROM to obtain an exponent j, and thereafter the exponent (i−j) is produced by a subtraction circuit, and the exponent (i−j) is inputted to the ROM, which then outputs $\alpha^{i-j}$. Another multiplication circuit, as proposed in Japanese Patent Laid-Open Gazette No. 60-144834, employs a matrix expression of each of the elements of a finite field, thus omitting any ROM.

No other effective proposals than the division circuit with the ROM as a conversion table have been made thus far. The conventional division circuit is large in size and slow in arithmetic operations.

In actual error-correcting circuits, it may be necessary to execute a plurality of divisions at the same time, with respective values, i.e., divisors or dividends, in the divisions being the same. A division circuit for effecting such divisions includes a plurality of identical dividers arranged parallel to each other. The division circuit with the parallel-connected dividers is considerably large in size.

In view of the above drawbacks, the present invention also provides a division circuit of small size for simultaneously effecting a plurality of divisions over the finite field $GF(2^m)$ with the same divisor or dividend employed in each of the divisions.

According to the present invention, there is employed a matrix expression of each of the elements of a finite field as disclosed in Japanese Patent Laid-Open Gazette No. 60-144834. For an easier understanding of embodiments of the present invention, such a vector expression of each of the elements of the finite field $GF(2^m)$ will first be described below.

As an example, an irreducible polynomial $P(X)$ is defined, using coefficients $g_1$, $g_2$, $g_3$ which are 0 to 1 ($=-1$), as follows:

$$P(X) = 1 + g_1 X + g_2 X^2 + g_3 X^3 + X^4 \tag{36},$$

and a finite field $GF(2^4)$ of order $2^4$ with the polynomial $P(X)$ being a modulus polynomial is considered. If a root of $P(X)$ is $\alpha$, then $\alpha$ is a primitive element of the finite field $GF(2^4)$, and each of the elements of $GF(2^4)$ can be expressed as a power $\alpha^i$ of $\alpha$ (i is an integer). This expression is referred to as a power representation.

Since subtractions over over $P(\alpha) = 0$ and $GF(2^4)$ are the same as additions, the following equations are satisfied:

$$\begin{aligned}\alpha^4 &= -1 - g_1\alpha - g_2\alpha^2 - g_3\alpha^3 \\ &= 1 + g_1\alpha + g_2\alpha^2 + g_3\alpha^3 \end{aligned} \tag{37}$$

$$\begin{aligned}\alpha^5 &= \alpha \cdot \alpha^4 = \alpha + g_1\alpha^2 + g_2\alpha^3 + g_3\alpha^4 \\ &= g_3 + (1+g_3g_1)\alpha + (g_1+g_3g_2)\alpha^2 + (g_2+g_3g_3)\alpha^3. \end{aligned} \tag{38}$$

Therefore, since $\alpha^i$ (i=4, 5, 6, ...) can certainly be represented by a linear combination of 1, $\alpha$, $\alpha^2$, $\alpha^3$, any desired element a over $GF(2^4)$ can be expressed, using coefficients $a_0$ through $a_3$ which are 0 to 1 ($=-1$), as follows:

$$a = a_0 + a_1\alpha + a_2\alpha^2 + a_3\alpha^3 \tag{39}.$$

A representation composed of a vertical column of the coefficients $a_0$ through $a_3$ in the equation (39) is referred to as a vector representation of the elements a. The vector representation $\bar{a}$ of the elements a is expressed, using a transposition symbol $(\ldots)^t$, as follows:

$$\bar{a} = \begin{pmatrix} a_0 \\ a_1 \\ a_2 \\ a_3 \end{pmatrix} = (a_0 a_1 a_2 a_3)^t. \tag{40}$$

The vector representations of the elements 0, $\alpha^i$ (i=0, 1, ..., 14) of $GF(2^4)$ are given below:

$$\alpha^0 = \begin{matrix} 0: (0000) \\ 1: (1000) \\ \alpha^1: (0100) \\ \alpha^2: (0010) \\ \alpha^3: (0001) \\ \alpha^4: (1100) \end{matrix}$$

$$\begin{matrix} \alpha^9: (0101) \\ \alpha^{10}: (1110) \\ \alpha^{11}: (0111) \\ \alpha^{12}: (1111) \\ \alpha^{13}: (1011) \\ \alpha^{14}: (1001). \end{matrix}$$

The elements a except 0 over $GF(2^4)$ can be represented by $\alpha^i$. The matrix representation $T(\alpha^i)$ of the elements $\alpha^i$ is defined, using the vector representation $\bar{\alpha}^i$ of $\alpha^i$, by the following equation:

$$T(\alpha^i) = [\bar{\alpha}^i \ \bar{\alpha}^{i+1} \ \bar{\alpha}^{i+2} \ \bar{\alpha}^{i+3}] \tag{41}$$

$$= \begin{bmatrix} T_{00} & T_{10} & T_{20} & T_{30} \\ T_{01} & T_{11} & T_{21} & T_{31} \\ T_{02} & T_{12} & T_{22} & T_{32} \\ T_{03} & T_{13} & T_{23} & T_{33} \end{bmatrix}.$$

Specifically, the matrix representation $T(\alpha^1)$ of $\alpha^1$ is as follows:

$$T(\alpha^1) = [\bar{\alpha}^1 \bar{\alpha}^2 \bar{\alpha}^3 \bar{\alpha}^4]$$

$$= \begin{bmatrix} 0 & 0 & 0 & 1 \\ 1 & 0 & 0 & 1 \\ 0 & 1 & 0 & 0 \\ 0 & 0 & 1 & 0 \end{bmatrix}.$$

Because any desired element over $GF(2^m)$, which is a general form of $GF(2^4)$, can be expressed by an m-bit binary notation in a vector representation, vector representations are used in actual logic circuits. However, when the product a.b ($\alpha^i \cdot \alpha^j$) of an element a ($=\alpha^i$) and an element b ($=\alpha^j$) (j is an integer) over $GF(2^m)$ is to be determined, there is no simple method of determining the vector representation of the product if the elements $\alpha^i$, $\alpha^j$ remain in their vector representation. Conversion of one of $\alpha^i$ and $\alpha^j$ into a matrix representation however allows the vector representation of the product $\alpha^i \cdot \alpha^j$ to be obtained.

More specifically, the vector representations of $\alpha^i$ and $\alpha^j$ over the finite field $GF(2^4)$ are expressed, using the coefficients $a_0 \sim a_3$ and $b_0 \sim b_3$, respectively, as follows:

$$\alpha^i = (a_0 \ a_1 \ a_2 \ a_3)^t \tag{42}$$

$$\alpha^j = (b_0 \ b_1 \ b_2 \ b_3)^t \tag{43}.$$

$\alpha^j$ can be expressed by a linear combination of 1, $\alpha$, $\alpha^2$, $\alpha^3$, as follows:

$$\alpha^j = b_0 + b_1\alpha + b_2\alpha^2 + b_3\alpha^3 \qquad (44)$$

$\alpha^i$, i.e., a, is expressed by the equation (39) above.

Therefore, the product of a and b, i.e., $\alpha^i$ and $\alpha^j$ is expressed by:

$$\begin{aligned} a \cdot b &= \alpha^i \cdot \alpha^j \qquad (45)\\ &= \alpha^i(b_0 + b_1\alpha + b_2\alpha^2 + b_3\alpha^3)\\ &= \alpha^i b_0 + \alpha^{i+1}b_1 + \alpha^{i+2}b_2 + \alpha^{i+3}b_3. \end{aligned}$$

From the equation (41), the vector representations of $\alpha^i$ through $\alpha^{i+3}$ in the equation (45) are given as follows:

$$\bar{\alpha}^i = (T_{00}\ T_{01}\ T_{02}\ T_{03})^t$$

$$\bar{\alpha}^{i+1} = (T_{10}\ T_{11}\ T_{12}\ T_{13})^t$$

$$\bar{\alpha}^{i+2} = (T_{20}\ T_{21}\ T_{22}\ T_{23})^t$$

$$\bar{\alpha}^{i+3} = (T_{30}\ T_{31}\ T_{32}\ T_{33})^t.$$

Thus, according to the equations (45) and (41), the product a·b is converted into its vector representation as follows:

$$a \cdot b = \begin{bmatrix} T_{00} & T_{10} & T_{20} & T_{30} & b_0 \\ T_{01} & T_{11} & T_{21} & T_{31} & b_1 \\ T_{02} & T_{12} & T_{22} & T_{32} & b_2 \\ T_{03} & T_{13} & T_{23} & T_{33} & b_3 \end{bmatrix} \qquad (46)$$

$$= [\bar{\alpha}^i\ \bar{\alpha}^{i+1}\ \bar{\alpha}^{i+2}\ \bar{\alpha}^{i+3}]\ \bar{\alpha}^j$$

$$= T(\alpha^i)\bar{\alpha}^j.$$

Consequently, when a or $\alpha^j$ is converted into its matrix representation $T(\alpha^i)$, the vector representation of the product a·b can easily be determined simply by effecting ordinary multiplication between a matrix and a vector.

A multiplication circuit for a finite field according to an embodiment of the present invention will now be described below. In this embodiment, the present invention is applied to a multiplication circuit for multiplying the elements b, c, d over a finite field $GF(2^4)$ by the common element a over the finite field $GF(2^4)$. The modulus polynomial P(X) of the finite field is defined according to the equation (36), using the coefficients $g_1$, $g_2$, $g_3$, and input and output data are given in vector representations using 4-bit binary notations.

Figure 27:
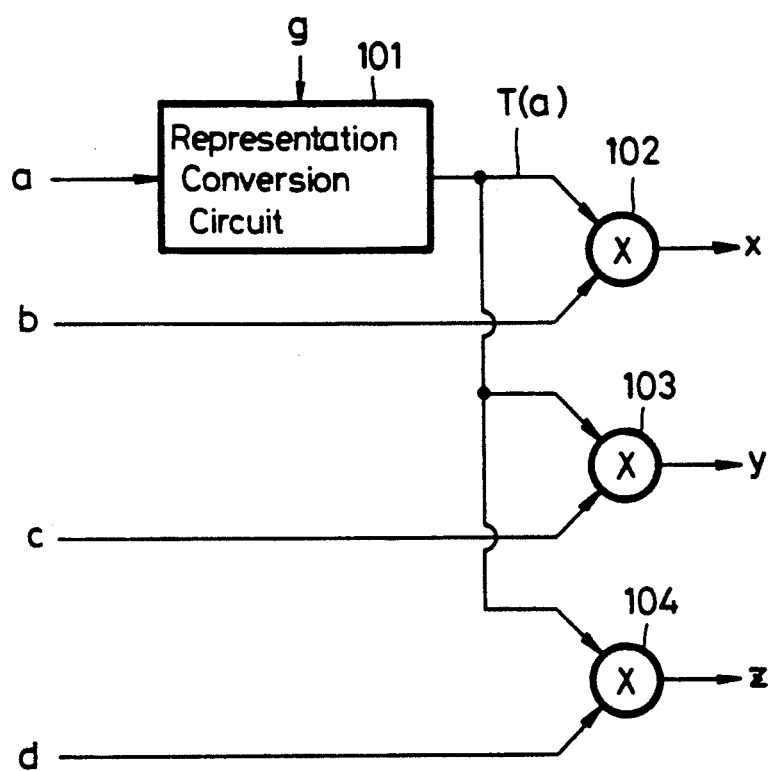
FIG. 27 is a block diagram of a multiplication circuit for a finite field according to the present invention.

FIG. 27 shows in block form a multiplication circuit according to the present invention. The multiplication circuit includes a representation conversion circuit 101 for converting a vector representation into a matrix representation. The representation conversion circuit 101 is supplied with a multiplicator in a 4-bit vector representation and coefficients $g_1$ through $g_3$ (collectively referred to as g) of the modulus polynomial P(X), and generates elements $T_{ij}$ ($0 \leq i$, $j \leq 3$) of the matrix representation T(a) of the multiplicator a.

The multiplication circuit also has three multiplication units 102, 103, 104 each for multiplying a matrix by a vector. Each of the multiplication units 102, 103, 104 are supplied with the elements of the matrix T(a) at one input port thereof, and multiplicands b, c, d in 4-bit vector representations at the other input port. The output ports of the multiplication units 102, 103, 104 output 4-bit vector representations of the products a·b (=x), a·c (=y), and a·d (=z), respectively.

Figure 28:
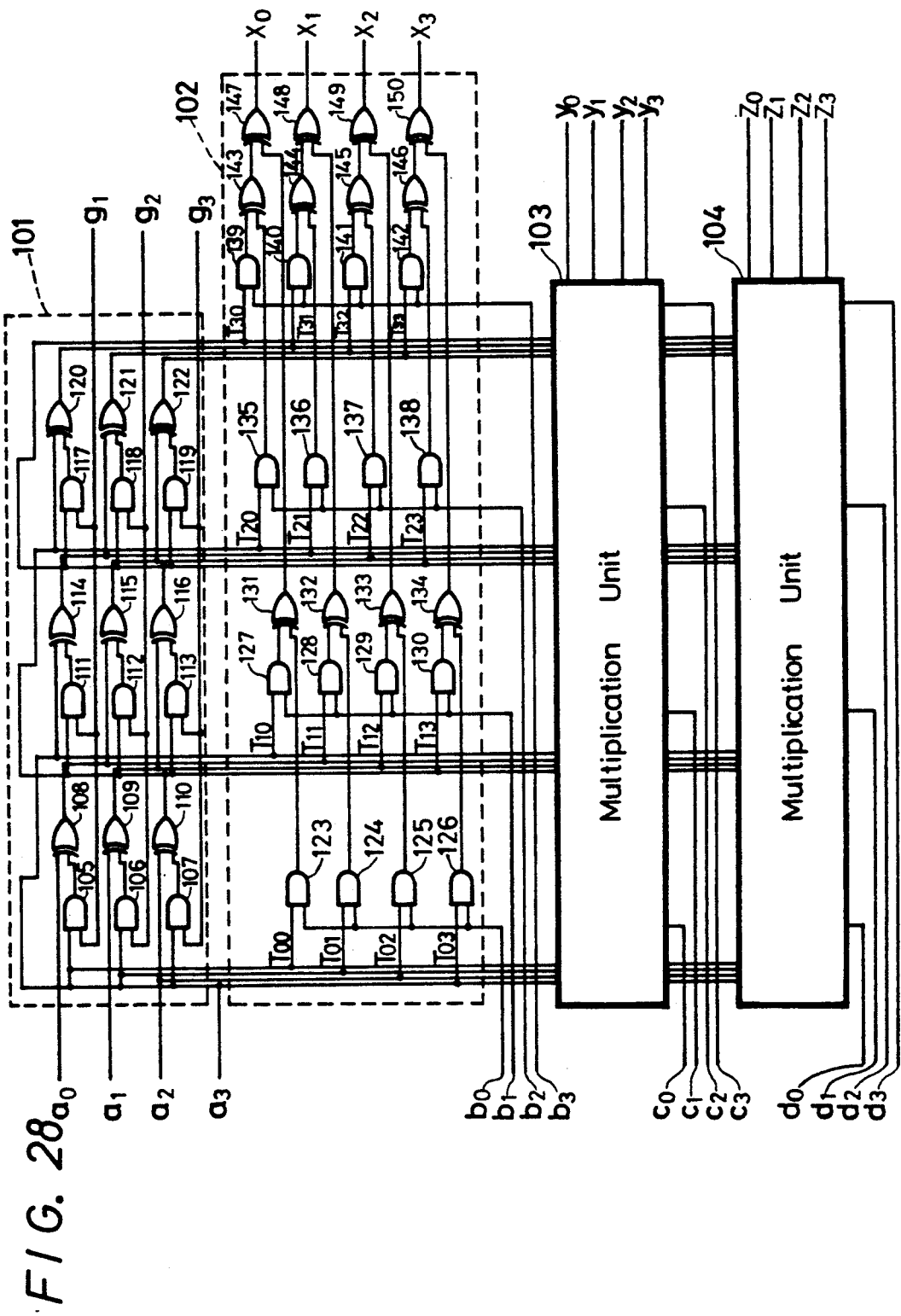
FIG. 28 is a block diagram of a specific circuit arrangement of the multiplication circuit shown in FIG. 27.

FIG. 28 shows a specific circuit arrangement of the multiplication circuit shown in FIG. 27. The representation conversion circuit 101 shown in FIG. 28 comprises AND gates 105 through 107, 111 through 113, 117 through 119, and exclusive-OR (EXOR) gates 108 through 110, 114 through 116, 120 through 122. Each of the AND gates is used as a multiplier for two coefficients, and each of the EXOR gates is used as a mod 2 adder for two coefficients. If the vector representation of the multiplicator a is ($a_0\ a_1\ a_2\ a_3$)$^t$, then the common coefficient $a_3$ is supplied to one input terminal of each of the AND gates 105, 106, 107, the coefficients $g_1$, $g_2$, $g_3$ are supplied respectively to the other input terminals of the AND gates 105, 106, 107, the coefficients $a_0$, $a_1$, $a_2$ are supplied respectively to one input terminal of each of the EXOR gates 108, 109, 110, and the output data from the AND gates 105, 106, 107 are supplied respectively to the other input terminals of the EXOR gates 108, 109, 110.

If it is assumed that a root of the modulus polynomial P(x)=0 is $\alpha$ and the power representation of the multiplicator a is $\alpha^i$, then the matrix representation T(a) of the multiplicator a is expressed by the equation (41). In this embodiment, the coefficients $a_0$ through $a_3$ correspond respectively to the elements $T_{00}$ through $T_{03}$ of the matrix T(a), and the coefficient $a_3$ and the output data from the EXOR gates 108, 109, 110 correspond respectively to the element $T_{10}$ and the elements $T_{11}$ through $T_{13}$ of the matrix T(a).

The output data (the element $T_{13}$) from the EXOR gate 110 are supplied to one input terminal of each of the AND gates 111 through 113, the coefficients $g_1$, $g_2$, $g_3$ are supplied respectively to the other input terminals of the AND gates 111 through 113, the coefficients $T_{10}$ through $T_{12}$ are supplied respectively to one of the input terminals of the EXOR gates 114 through 116, and the output data from the AND gates 111 through 113 are supplied respectively to the other input terminals of the EXOR gates 114 through 116. The element $T_{13}$ and the output data from the EXOR gates 114 through 116 correspond respectively to the elements $T_{20}$ and $T_{21}$ through $T_{23}$ of the matrix T(a), and the element $T_{23}$ and the output data from the EXOR gates 120 through 122 correspond respectively to the element $T_{30}$ and the elements $T_{31}$ through $T_{33}$ of the matrix T(a).

Figure 29:
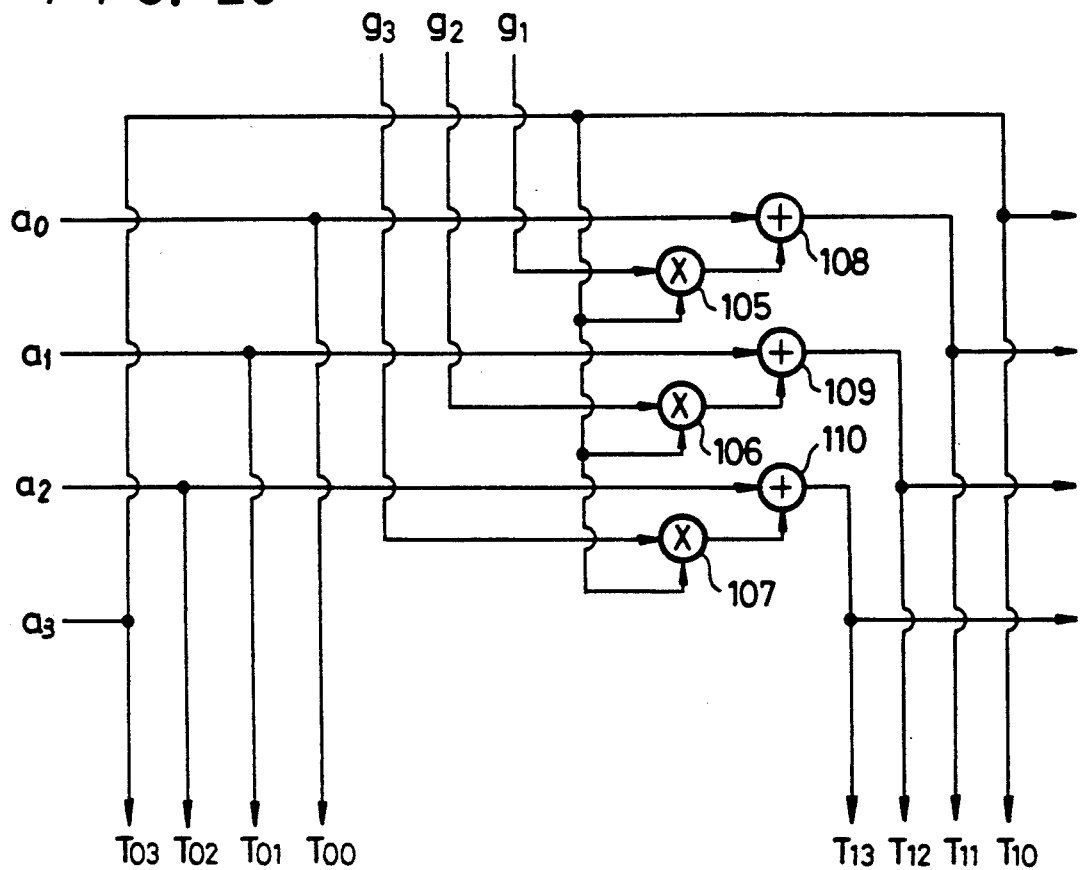
FIG. 29 is a diagram showing a portion of a representation conversion circuit in the multiplication circuit shown in FIG. 28.

The reason why the element $T_{ij}$ of the matrix representation T(a) of the multiplicator a is required by the representation conversion circuit 101 will be described with reference to FIG. 29. FIG. 29 shows the AND gates 105 through 107 (FIG. 28) as multipliers and the EXOR gates 108 through 110 (FIG. 28) as adders. The matrix representation T(a) of the multiplicator a (=$\alpha^i$) is in the form of vector representations of the elements $\alpha^i$, $\alpha^{i+1}$, $\alpha^{i+2}$, $\alpha^{i+3}$, arranged in four rows, and the coefficients of these vector representations serve as the elements of the matrix T(a).

The vector representation of the element $\alpha^i$ is ($a_0\ a_1\ a_2\ a_3$)$^t$, and the element ui is expressed as a linear combination of $$\alpha^i = a_0 + a_1\alpha + a_2\alpha^2 + a_3\alpha^3 \qquad (47).$$

When both sides of the equation (47) are multiplied by $\alpha$, the following equation is obtained:

$$\alpha^{i+1} = a_0\alpha + a_1\alpha^2 + a_2\alpha^3 + a_3\alpha^4 \quad (48).$$

Since $\alpha$ is a root of the modulus polynomial $P(X)=0$, the equation (37) is satisfied over $GF(2^4)$. By substituting the equation (37) in the equation (48), the equation (48) is modified into the equation:

$$\begin{aligned}\alpha^{i+1} &= a_0\alpha + a_1\alpha^2 + a_2\alpha^3 + a_3(1 + g_1\alpha + g_2\alpha^2 + g_3\alpha^3) \\ &= a_3 + (a_0 + a_3g_1)\alpha + (a_1 + a_3g_2)\alpha^2 + (a_2 + a_3g_3)\alpha^3.\end{aligned} \quad (49)$$

Figure 30:
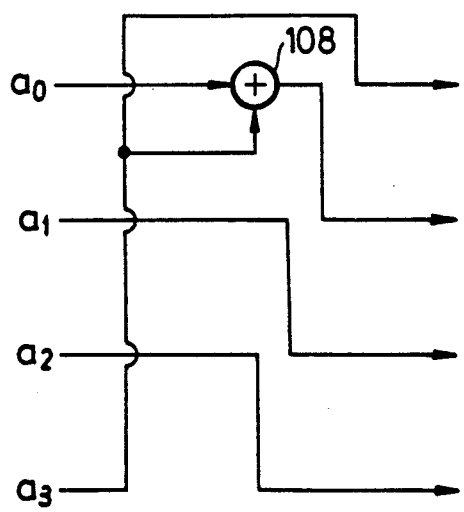
FIG. 30 is a diagram of a modification of the circuit shown in FIG. 29.

From the equation (49), the vector representation of the element $\alpha^{i+1}$ is $(a_3, a_0+a_3g_1, a_1+a_3g_2, a_2+a_3g_3)^t$, which corresponds to $(T_{10} T_{11} T_{12} T_{13})^t$. Since the coefficients of the respective output data from the adders 108, 109, 110 are $a_0+a_3g_1$, $a_1+a_3g_2$, $a_2+a_3g_3$, the elements $T_{10}$ through $T_{13}$ of the matrix $T(a)$ are determined by the arrangement shown in FIG. 29. Likewise, the vector representation (the matrix elements $T_{20}$ through $T_{23}$) of the element $\alpha^{i+2}$ is determined from the vector representation of the element $\alpha^{i+1}$, and the vector representation (the matrix elements $T_{30}$ through $T_{33}$) of the element $\alpha^{i+2}$. The from the vector representation of the element $\alpha^{i+2}$. The modulus polynomial $P(X)$ may be $x^4+x+1$, for example. In this case, since $g_1=1$ and $g_2=g_3=0$, the circuit arrangement shown in FIG. 29 is simplified into a circuit arrangement shown in FIG. 30.

Referring back to FIG. 28, the multiplication unit 102 is supplied with the elements $T_{00}$ through $T_{33}$ of the matrix $T(a)$ generated by the representation conversion circuit 101. The multiplication unit 102 includes AND gates 123 through 130, 135 through 142, and EXOR gates 131 through 134, 143 through 150. The elements $T_{00}$ through $T_{03}$ of the matrix $T(a)$ are supplied respectively to one input terminals of the AND gates 123 through 126, the other input terminals of which are supplied with the coefficient $b_0$ in the vector representation of the common multiplicand b. The AND gates 123 through 126 produce $b_0T_{00}$ through $b_0T_{03}$ as their output data. Similarly, when supplied with the remaining coefficients $b_1$ through $b_3$ in the vector representation of the multiplicand b, the AND gates 127 through 130 generate $b_1T_{10}$ through $b_1T_{13}$, the AND gates 135 through 138 generate $b_2T_{20}$ through $b_2T_{23}$, and the AND gates 139 through 142 generate $b_3T_{30}$ through $b_3T_{33}$.

The output data from the AND gates 123, 127, 135, 139 are added by way of mod 2 addition by the EXOR gates 131, 143, 147, thus generating a coefficient $x_0$. The output data from the AND gates 124, 128, 136, 140 are added by way of mod 2 addition by the EXOR gates 132, 144, 148, thus generating a coefficient $x_1$. The output data from the AND gates 125, 129, 137, 141 are added by way of mod 2 addition by the EXOR gates 133, 145, 149, thus generating a coefficient $x_2$. The output data from the AND gates 126, 130, 138, 142 are added by way of mod 2 addition by the EXOR gates 134, 146, 150, thus generating a coefficient $x_3$. The vector representation of the product x of the multiplicator a and the multiplicand a is $(x_0\ x_1\ x_2\ x_3)^t$.

The process of determining the product of the matrix $T(a)$ and the vector $\bar{b}$ (the vector representation of the multiplicand b) with the multiplication unit 102 shown in FIG. 28 will be described below. The coefficients or elements of the matrix $T(a)$, the vector $\bar{b}$, and the vector x (the vector representation of the product x) have the following relationship therebetween:

$$\begin{bmatrix}x_0 \\ x_1 \\ x_2 \\ x_3\end{bmatrix} = \begin{bmatrix}T_{00} & T_{10} & T_{20} & T_{30} \\ T_{01} & T_{11} & T_{21} & T_{31} \\ T_{02} & T_{12} & T_{22} & T_{32} \\ T_{03} & T_{13} & T_{23} & T_{33}\end{bmatrix}\begin{bmatrix}b_0 \\ b_1 \\ b_2 \\ b_3\end{bmatrix}. \quad (50)$$

From the equation (50), the element $x_i$ ($i=0\sim3$) of the vector $\bar{x}$ is expressed by:

$$x_i = \sum_{j=0}^{3} T_{ji}b_j. \quad (51)$$

According to the equation (51), the coefficient $x_0$, for example, is given by:

$$x_0 = T_{00}b_0 + T_{10}b_1 + T_{20}b_2 + T_{30}b_3 \quad (52).$$

The $x_0$ calculated by the multiplication unit 102 shown in FIG. 28 satisfies the equation (52). Likewise, the coefficients $x_1$ through $x_3$ also satisfy the equation (51).

The multiplication units 103, 104 shown in FIG. 28 are identical in construction to the multiplication unit 102. The multiplication unit 103 is supplied with the elements of the matrix $T(a)$ and the coefficients $c_0$ through $c_3$ of the vector representation of the multiplicand c, and the multiplication unit 104 is supplied with the elements of the matrix $T(a)$ and the coefficients $d_0$ through $d_3$ of the vector representation of the multiplicand d. If it is assumed that the products of the common multiplicator a and the multiplicands c, d are represented by y, z, respectively, then the multiplication unit 103 outputs the coefficients $y_0$ through $y_3$ of the vector representation of the product y, and the multiplication unit 104 outputs the coefficients $z_0$ through $z_3$ of the vector representation of the product z.

The multiplication circuit according to this embodiment can determine the vector representations of the products x, y, z of the common multiplicator a in the vector representation over the finite field $GF(2^4)$ and the different multiplicands b, c, d in the vector representations over finite field $GF(2^4)$. Inasmuch as the vector representation of the multiplicator a is converted into the matrix representation $T(a)$ by the representation conversion circuit 101, and the elements of the matrix representation $T(a)$ are supplied to the multiplication units 102, 103, 104, the representation conversion circuit 101 is shared by the multiplication units 102, 103, 104, and hence the overall multiplication circuit shown in FIGS. 27 and 28 is relatively small in size.

Furthermore, since a ROM as a conversion table for determining the power i from the element $\alpha^i$ over $GF(2^4)$, for example, is not required, and all the circuit components comprise AND gates and EXOR gates, the multiplication circuit is easy to control, can effect calculations at high speed, and is inexpensive to manufacture.

The principles of the present invention are not limited to the illustrated multiplication circuit, but are also applicable to a multiplication circuit for a general finite field $GF(2^m)$.

With the arrangement of the present invention, because of the representation conversion circuit for converting a vector representation into the elements of a matrix representation, the overall circuit size is reduced. Since ROM as a conversion table is not required, it is easy to control the multiplication circuit and the speed of calculations effected thereby is high.

A division circuit for a finite field according to an embodiment of the present invention will now be described below. In this embodiment, the present invention is applied to a division circuit for dividing an element x over a finite field $GF(2^4)$ by an element y over the finite field $GF(2^4)$, providing a quotient z ($=x/y$). The modulus polynomial $P(X)$ of the finite field is defined according to the equation (53), below using the coefficients $g_1$, $g_2$, $g_3$, and input and output data are given in vector representations using 4-bit binary notations.

Figure 31:
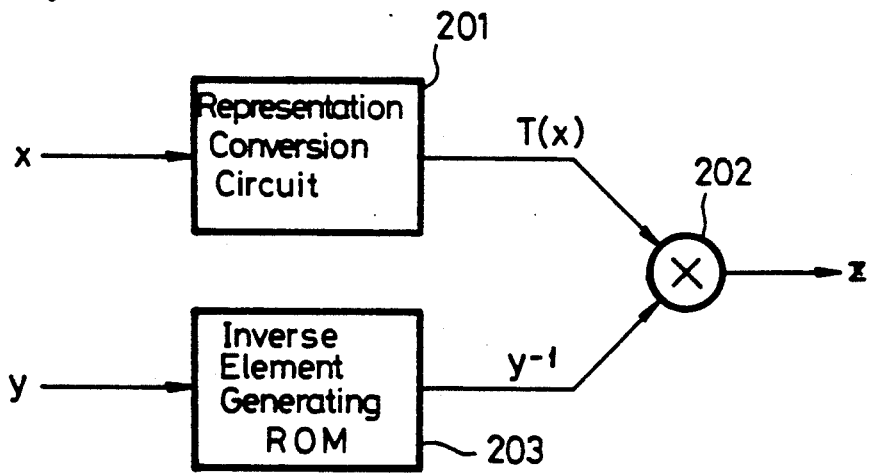
FIG. 31 is a block diagram of a division circuit for a finite field according to an embodiment of the present invention.

FIG. 31 shows in block form a division circuit according to the present invention. The division circuit includes a representation conversion circuit 201 for converting a vector representation into a matrix representation. The representation conversion circuit 201 is supplied with a dividend x in a 4-bit vector representation and coefficients $g_1$ through $g_3$ (collectively referred to as g) of the modulus polynomial $P(X)$, and generates elements $T_{ij}$ ($0 \leq i, j \leq 3$) of the matrix representation $T(x)$ of the dividend x.

The division circuit also has a multiplication unit 202 for multiplying a matrix by a vector thereby to generate a vector, and an inverse element generating ROM as a conversion table for converting the divisor y in a vector representation into an inverse element $y^{-1}$ in a vector representation. One input terminal of the multiplication unit 202 is supplied with the elements of the matrix $T(x)$, and the other input terminal thereof is supplied with the 4-bit coefficients $(y^{-1})_1$, $(y^{-1})_2$, $(y^{-1})_3$ of the inverse element $y^{-1}$ in the vector representation. The output port of the multiplication unit 202 outputs the 4-bit coefficients $z_0$ through $z_3$ in the vector representation of the quotient z ($=x/y$).

Figure 32:
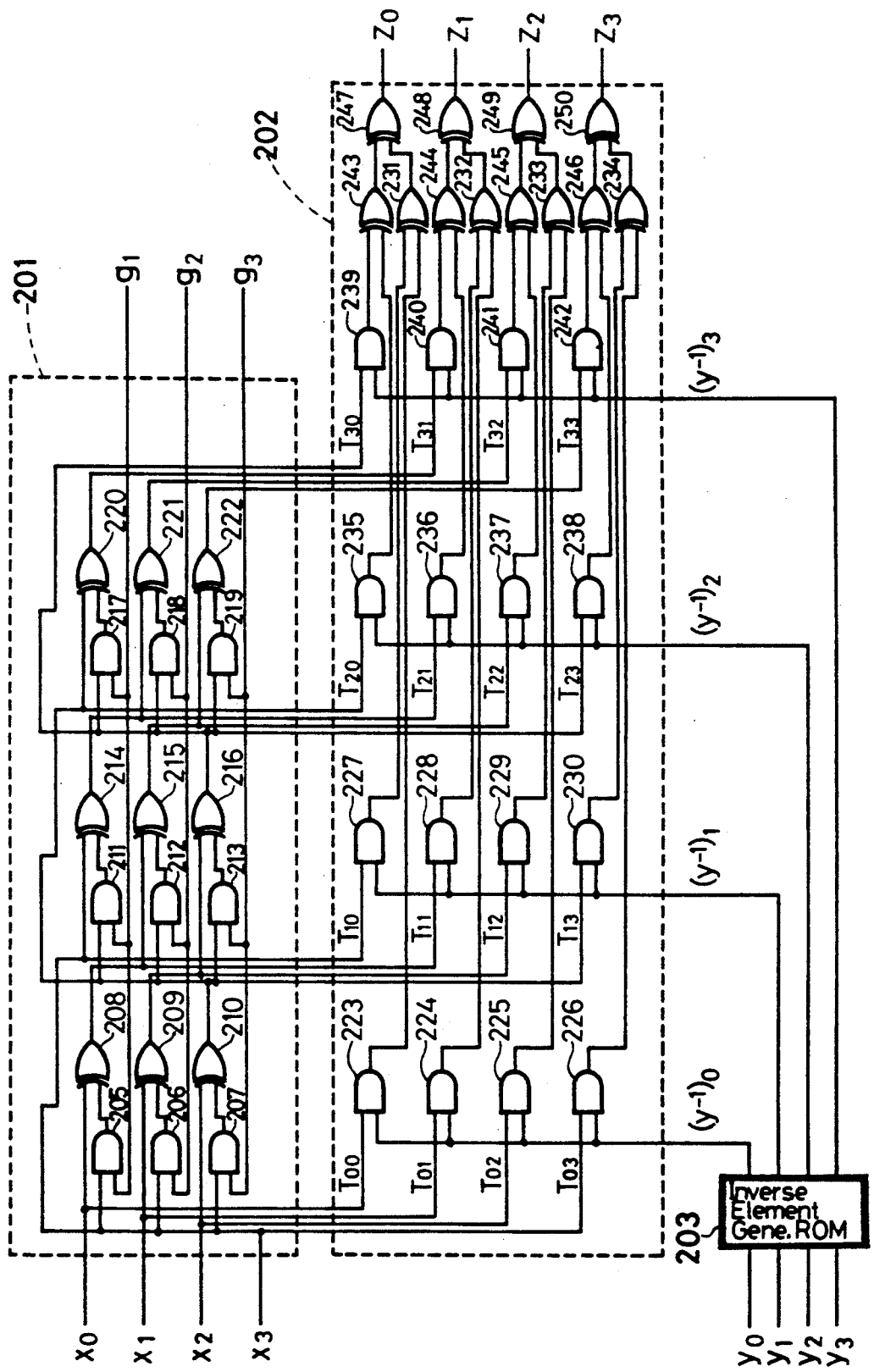
FIG. 32 is a block diagram of a specific circuit arrangement of the division circuit shown in FIG. 31.

FIG. 32 shows a specific circuit arrangement of the division circuit shown in FIG. 31. The representation conversion circuit 201 shown in FIG. 32 comprises AND gates 205 through 207, 211 through 213, 217 through 219, and exclusive-OR (EXOR) gates 208 through 210, 214 through 216, 220 through 222. Each of the AND gates is used as a multiplier for two coefficients, and each of the EXOR gates is used as a mod 2 adder for two coefficients. If the vector representation of the dividend x is $(x_0\ x_1\ x_2\ x_3)^t$, then the common coefficient $x_3$ is supplied to one input terminal of each of the AND gates 205, 206, 207, the coefficients $g_1$, $g_2$, $g_3$ are supplied respectively to the other input terminals of the AND gates 205, 206, 207, the coefficients $x_0$, $x_1$, $x_2$ are supplied respectively to one input terminals of the EXOR gates 208, 209, 210, and the output data from the AND gates 205, 206, 207 are supplied respectively to the other input terminals of the EXOR gates 208, 209, 210.

If it is assumed that a root of the modulus polynomial $P(X)=0$ is $\alpha$ and the power representation of the dividend x is $\alpha^i$, then the matrix representation $T(x)$ of the multiplicator a is expressed by the equation (41). In this embodiment, the coefficients $x_0$ through $x_3$ correspond respectively to the elements $T_{00}$ through $T_{03}$ of the matrix $T(x)$, and the coefficient $x_3$ and the output data from the EXOR gates 208, 209, 210 correspond respectively to the element $T_{10}$ and the elements $T_{11}$ through $T_{13}$ of the matrix $T(x)$.

The output data (the element $T_{13}$) from the EXOR gate 210 are supplied to one input terminal of each of the AND gates 211 through 213, the coefficients $g_1$, $g_2$, $g_3$ are supplied respectively to the other input terminals of the AND gates 211 through 213, the coefficients $T_{10}$ through $T_{12}$ are supplied respectively to one input terminals of the EXOR gates 214 through 216, and the output data from the AND gates 211 through 213 are supplied respectively to the other input terminals of the EXOR gates 214 through 216. The element $T_{13}$ and the output data from the EXOR gates 214 through 216 correspond respectively to the elements $T_{20}$ and $T_{21}$ through $T_{23}$ of the matrix $T(x)$, and the element $T_{23}$ and the output data from the EXOR gates 220 through 222 correspond respectively to the element $T_{30}$ and the elements $T_{31}$ through $T_{33}$ of the matrix $T(x)$.

Figure 33:
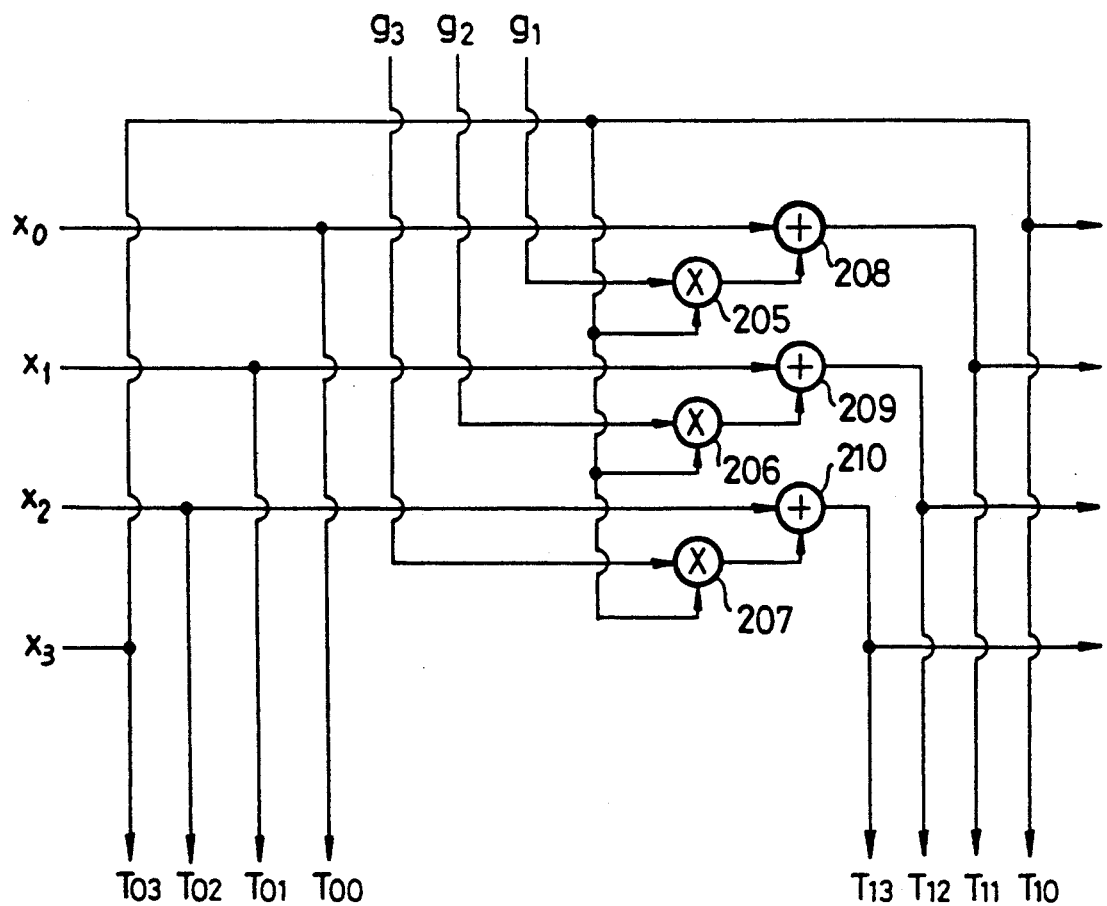
FIG. 33 is a diagram showing a portion of a representation conversion circuit in the division circuit shown in FIG. 32.

The reason why the element $T_{ij}$ of the matrix representation $T(x)$ of the dividend x is required by the representation conversion circuit 201 will be described with reference to FIG. 33. FIG. 33 shows the AND gates 205 through 207 (FIG. 32) as multipliers and the EXOR gates 208 through 210 (FIG. 32) as adders. The matrix representation $T(x)$ of the dividend x ($=\alpha^i$) is in the form of vector representations of the elements $\alpha^i$, $\alpha^{i+1}$, $\alpha^{i+2}$, $\alpha^{i+3}$, arranged in four rows, and the coefficients of these vector representations serve as the elements of the matrix $T(x)$.

The vector representation of the element $\alpha^i$ is $(x_0\ x_1\ x_2\ x_3)^t$, and the element $\alpha^i$ is expressed as a linear combination of $$\alpha^i = x_0 + x_1\alpha + x_2\alpha^2 + x_3\alpha^3 \tag{53}$$

When both sides of the equation (53) are multiplied by $\alpha$, the following equation is obtained:

$$\alpha^{i+1} = x_0\alpha + x_1\alpha^2 + x_2\alpha^3 + x_3\alpha^4 \tag{54}$$

Since $\alpha$ is a root of the modulus polynomial $P(x)=0$, the equation (37) is satisfied over $GF(2^4)$. By substituting the equation (37) in the equation (54), the equation (54) is modified into the equation:

$$\begin{aligned}\alpha^{i+1} &= x_0\alpha + x_1\alpha^2 + x_2\alpha^3 + x_3(1 + g_1\alpha + g_2\alpha^2 + g_3\alpha^3)\\ &= x_3 + (x_0 + x_3g_1)\alpha + (x_1 + x_3g_2)\alpha^2 + (x_2 + x_3g_3)\alpha^3.\end{aligned} \tag{55}$$

Figure 34:
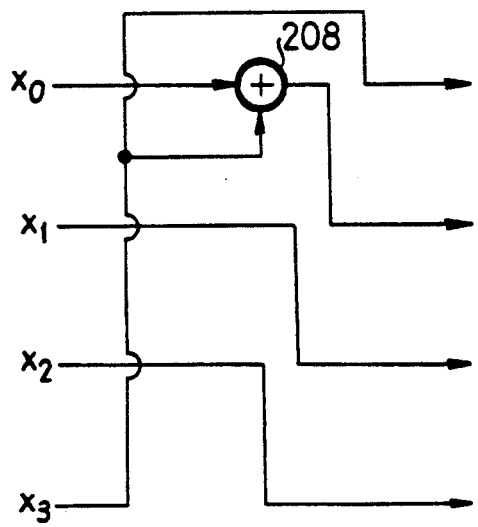
FIG. 34 is a diagram of a modification of the circuit shown in FIG. 33.

From the equation (55), the vector representation of the element $\alpha^{i+1}$ is $(x_3, x_0+x_3g_1, x_1+x_3g_2, x_2+x_3g_3)^t$, which corresponds to $(T_{10}\ T_{11}\ T_{12}\ T_{13})^t$. Since the coefficients of the respective output data from the adders 208, 209, 210 are $x_0 + x_3g_1$, $x_1 + x_3g_2$, $x_2 + x_3g_3$, the elements $T_{10}$ through $T_{13}$ of the matrix $T(x)$ are determined by the arrangement shown in FIG. 33. Likewise, the vector representation (the matrix elements $T_{20}$ through $T_{23}$) of the element $\alpha^{i+2}$ is determined from the vector representation of the element $\alpha^{i+1}$, and the vector representation (the matrix elements $T_{30}$ through $T_{33}$) of the element $\alpha^{i+3}$ is determined from the vector representation of the element $\alpha^{i+2}$. The modulus polynomial $P(x)$ may be $x_4+x+1$, for example. In this case, since $g_1=1$ and $g_2=g_3=0$, the circuit arrangement shown in FIG. 33 is simplified into a circuit arrangement shown in FIG. 34.

Referring back to FIG. 32, the multiplication unit 202 is supplied with the elements $T_{00}$ through $T_{33}$ of the matrix $T(x)$ generated by the representation conversion circuit 201. The multiplication unit 202 includes AND gates 223 through 230, 235 through 242, and EXOR gates 231 through 234, 243 through 250. The elements $T_{00}$ through $T_{03}$ of the matrix $T(x)$ are supplied respectively to one input terminals of the AND gates 223 through 226, the other input terminals of which are supplied with the coefficient $(y^{-1})_0$ in the vector representation of the inverse element $y^{-1}$ of the divisor y. The AND gates 223 through 226 produce $(y^{-1})_0 T_{00}$ through $(y^{-1})_0 T_{03}$ as their output data Similarly, when supplied with the remaining coefficients $(y^{-1})_1$ through $(y^{-1})_3$ in the vector representation of the inverse element $y^{-1}$, the AND gates 227 through 230 generate $(y^{-1})_1 T_{10}$ through $(y^{-1})_1 T_{13}$, the AND gates 235 through 238 generate $(y^{-1})_2 T_{20}$ through $(y^{-1})_2 T_{23}$, and the AND gates 239 through 242 generate $(y^{-1})_3 T_{30}$ through $(y^{-1})_3 T_{33}$.

The output data from the AND gates 223, 227, 235, 239 are added by way of mod 2 addition by the EXOR gates 231, 243, 247, thus generating a coefficient $z_0$. The output data from the AND gates 224, 228, 236, 240 are added by way mod 2 addition by the EXOR gates 232, 244, 248, thus creating a coefficient $z_1$. The output data from the AND gates 225, 229, 237, 241 are added by way of mod 2 addition by the EXOR gates 233, 245, 249, thus generating a coefficient $z_2$. The output data from the AND gates 226, 230, 238, 242 are added by way of mod 2 addition by the EXOR gates 234, 246, 250, thus generating a coefficient $z_3$. The vector representation of the quotient z of the dividend x and the divisor y is $(z_0\ z_1\ z_2\ z_3)^t$.

The process of determining the product of the matrix T(x) and the vector $y^{-1}$ (the vector representation of the inverse element $y^{-1}$) with the multiplication unit 202 shown in FIG. 32 will be described below. The coefficients or elements of the matrix T(x), the vector $y^{-1}$, and the vector z (the vector representation of the quotient z) have the following relationship therebetween:

$$\begin{bmatrix} z_0 \\ z_1 \\ z_2 \\ z_3 \end{bmatrix} = \begin{bmatrix} T_{00} & T_{10} & T_{20} & T_{30} \\ T_{01} & T_{11} & T_{21} & T_{31} \\ T_{02} & T_{12} & T_{22} & T_{32} \\ T_{03} & T_{13} & T_{23} & T_{33} \end{bmatrix} \begin{bmatrix} (y^{-1})_0 \\ (y^{-1})_1 \\ (y^{-1})_2 \\ (y^{-1})_3 \end{bmatrix} \quad (56)$$

From the equation (56), the element $z_i (i=0\sim 3)$ of the vector z is expressed by:

$$z_i = \sum_{j=0}^{3} T_j (y^{-1})_j \quad (57)$$

According to the equation (57), the coefficient $z_0$, for example, is given by:

$$z_0 T_{00}(y^{-1})_0 + T_{10}(y^{-1})_1 + T_{20}(y^{-1})_2 + T_{30}(y^{-1})_3 \quad (58).$$

The $z_0$ calculated by the multiplicaiton unit 202 shown in FIG. 32 satisfies the equation (58). Likewise, the coefficients $z_1$ through $z_3$ also satisfy the equation (57). The division circuit according to this embodiment determines the vector representation of the quotient z of the dividend x and the divisor y over the finite field $GF(2^4)$ by the multiplication of the matrix representation T(x) of the dividend x by the vector representation of the inverse element $y^{-1}$ of the divisor y. Since only one ROM (the inverse element generating ROM 203) as a conversion table is needed, the division circuit is smaller in size and the speed of calculations effected thereby is higher than the conventional circuit arrangement which employs three ROMs as conversion tables.

In the above embodiment, the representation of the divided x is converted from the vector representation into the matrix representation. However, the representation conversion circuit 201 may be connected between the inverse element generating ROM 203 and the multiplication unit 202 for converting the representation of the inverse element $y^{-1}$ of the divisor y from the vector representation into the matrix representation, and this matrix representation ay be multiplied by the vector representation of the dividend x. The present invention is also applicable to a division circuit for a general finite field $GF(2^m)$ (m is an integer or 1 or more).

A division circuit according to a further embodiment of the present invention will be described below with reference to FIG. 35. The division circuit in this embodiment divides a common element x, or a dividend, in a 4-bit vector representation over a finite field $GF(2^4)$ by three elements a, c, e, or divisors, each in a 4-bit vector representation, to produce three quotients b $(=x/a)$, d $(=x/c)$, and f $(=x/e)$ each in a vector representation.

Figure 35:
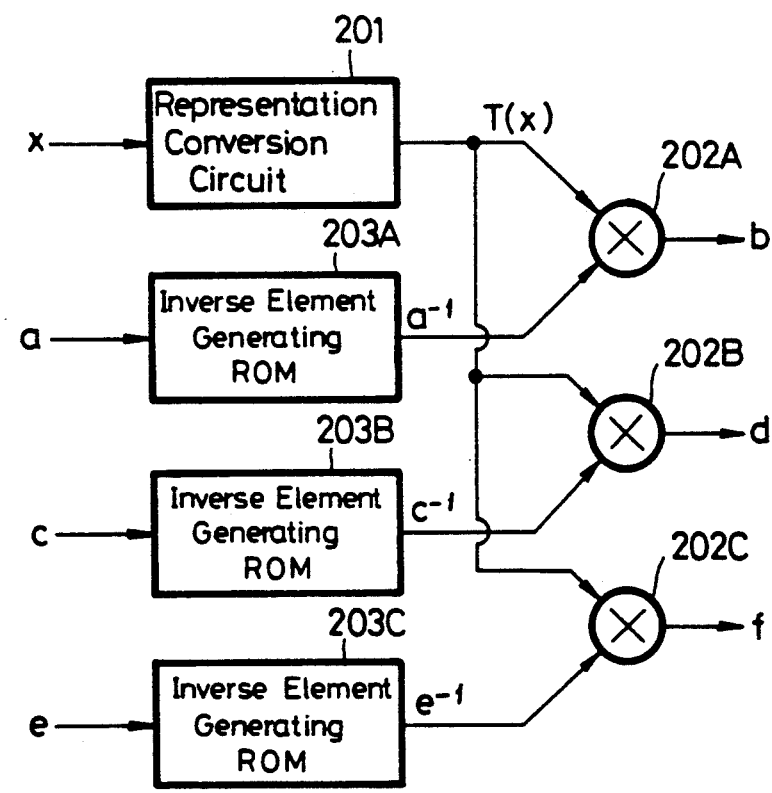
FIG. 35 is a block diagram of a division circuit for a finite field according to a further embodiment of the present invention.

As shown in FIG. 35, the division circuit includes a representation conversion circuit 201 which is identical in construction to the representation conversion circuit 201 shown in FIG. 31, multiplication units 202A through 202C each identical in construction to the multiplication unit 202 shown in FIG. 31, and inverse element generating ROMs 203A, 203B, 203C each identical in construction to the inverse element generating ROM 203 shown in FIG. 31. The representation of the dividend x is converted into a matrix representation T(x) by the representation conversion circuit 201, and the elements of the matrix representation T(x) are supplied to respective input ports of the multiplication units 202A through 202C. The divisors a, c, e are converted into inverse elements $a^{-1}$, $c^{-1}$, $e^{-1}$ each in a vector representation by the respective inverse element generating ROMs 203A, 203B, 203C, and the inverse elements $a^{-1}$, $c^{-1}$, $e^{-1}$ are supplied to the other input ports of the multiplication units 202A, 202B, 202C, respectively. Since each of the multiplication units 202A, 202B, 202C operates in the same manner as the multiplication unit 202 shown in FIG. 31, the multiplication units 202A, 202B, 202C output respective 4-bit vector representations of the quotients b, d, f.

In the circuit arrangement shown in FIG. 35, the single representation conversion circuit 201 is shared by the three multiplication units 202A through 202C. Therefore, the overall division circuit shown in FIG. 35 is smaller in size than would be if three dividers were simply arranged parallel to each other.

According to a modification of the division circuit shown in FIG. 35, representation conversion circuits for converting a vector representation into a matrix representation may be connected respectively between the inverse element generating ROMs 203A through 203C and the multiplication units 202A through 202C. While the common dividend x is supplied to the division circuit shown in FIG. 35, the principles of the present invention are also applicable to a division circuit in which a plurality of dividends are divided by a common divisor. If a common divisor is employed, then it is supplied through an inverse element generating ROM and a representation conversion circuit to a plurality of multiplication units.

The division circuit according to the present invention is relatively small in size and high in calculation speed.

If the multiplication circuit is arranged to convert the representation of a second element into a matrix representation, then the conversion of the representation of the second element and the generation of the inverse element of a first element are carried out at the same time. Accordingly, calculations can be effected at much higher speed.

If a common representation circuit is employed in a division circuit which determines quotients between a group of elements and a common element, then the division circuit is rendered much smaller.

Having described preferred embodiments of the invention with reference to the accompanying drawings, it is to be understood that the invention is not limited to the precise embodiments and that various changes and modifications could be effected by one skilled in the art without departing from the spirit or scope of the invention as defined in the appended claims.

What is claimed is:

1. A mutual division circuit comprising:
a calculation means: (a) for dividing a polynomial including a first input polynomial $R_{i-1}(x)$ as a factor by a second input polynomial $Q_{i-1}(X)$, thereby to determine a quotient and a remainder $R_i(X)$; (b) for determining an overall quotient $\lambda_i(X)$ from said quotient and a third input polynomial $\lambda_{i-1}(X)$; and (c) for producing said remainder as a first output polynomial $R_i(X)$, said first input polynomial $R_{i-1}(x)$ or said second input polynomial $Q_{i-1}(X)$ as a second output polynomial $Q_i(X)$, and said overall quotient $\lambda_i(X)$ as a third output polynomial;
data selecting means for receiving, at a first input port thereof, respective initial polynomials of said first, second, and third input polynomials and receiving at a second input port thereof said first, second, and third output polynomials from said calculation means, and selectively supplying data to inputs of said calculation means; and
feedback means for supplying said first, second, and third output polynomials from said calculation means to said second input port of said data selecting means, so that said calculation means is used a plurality of times for carrying out arithmetic operations therein.

2. A mutual division circuit according to claim 1, wherein said calculation means is a single calculation unit.

3. A mutual division circuit according to claim 1, wherein said calculation means is a plurality of cascaded calculation units.

4. A mutual division circuit comprising:
a plurality of cascaded calculation units: for dividing a polynomial including a first input polynomial $R_{i-1}(X)$ as a factor by a second input polynomial $Q_{i-1}(X)$, thereby to determine a quotient and a remainder $R_i(X)$; for determining an overall quotient $\lambda_i(X)$ from said quotient and a third input polynomial $\lambda_{i-1}(X)$; and for producing said remainder $R_i(X)$ as a first output polynomial, said first input polynomial $R_{i-1}(X)$ or said second input polynomial $Q_{i-1}(X)$ as a second output polynomial $Q_i(X)$, and said overall quotient $\lambda_i(X)$ as a third output polynomial;
single division means operable with said calculation units, for determining said quotient; and
said calculation units being operable at different timings to determine said quotient with said single division means.

5. A division circuit for a finite field, comprising:
an inverse element generating circuit for generating a vector representation of the inverse element of a first element in an m-bit vector representation over a finite field $GF(2^m)$;
a representation conversion circuit for converting a second element in an m-bit vector representation over the finite field $GF(2^m)$ into a matrix representation; and
a multiplication circuit for multiplying said inverse element by said second element, thereby dividing said second element by said first element to produce a quotient in an m-bit vector representation over the finite field $GF(2^m)$.

6. A division circuit according to claim 5, wherein said multiplication circuit multiples said inverse element by said second element where said second element has been converted into a matrix representation.

7. A division circuit for producing quotients between a group of elements and a common element in respective m-bit vector representations over a finite field $GF(2^m)$, said division circuit comprising:
a plurality of inverse element generating circuits for generating respective inverse elements of the group of elements;
a representation conversion circuit for converting the common element into a matrix representation; and
a plurality of multiplication circuits for multiplying the inverse elements in the group of elements in respective vector representations by the matrix representation from said representation conversion circuit.

8. A division circuit according to claim 7, wherein said inverse element generating means generates the inverse element of said common element and said plurality of multiplication circuits multiplies said group of elements by said matrix representation.

9. A division circuit according to claim 7, wherein said inverse element generating means generates respective inverse elements of said group of elements and said plurality of multiplication circuits multiplies said respective inverse elements of the group of elements by said matrix representation.

10. A division circuit according to claim 7, wherein said representation conversion circuit is combined with said inverse element generating circuit.

* * * * *